(12) United States Patent
Pagnanelli

(10) Patent No.: US 8,896,471 B1
(45) Date of Patent: Nov. 25, 2014

(54) CONVERSION OF A DISCRETE-TIME QUANTIZED SIGNAL INTO A CONTINUOUS-TIME, CONTINUOUSLY VARIABLE SIGNAL

(71) Applicant: Syntropy Systems, LLC, Costa Mesa, CA (US)

(72) Inventor: Christopher Pagnanelli, Huntington Beach, CA (US)

(73) Assignee: Syntropy Systems, LLC, Huntington Beach, CA (US)

( * ) Notice: Subject to any disclaimer, the term of this patent is extended or adjusted under 35 U.S.C. 154(b) by 228 days.

(21) Appl. No.: 13/647,301

(22) Filed: Oct. 8, 2012

Related U.S. Application Data

(63) Continuation of application No. 13/400,019, filed on Feb. 17, 2012, now Pat. No. 8,294,605, and a continuation-in-part of application No. 12/970,379, filed on Dec. 16, 2010, now Pat. No. 8,264,390.

(60) Provisional application No. 61/444,643, filed on Feb. 18, 2011, provisional application No. 61/450,617, filed on Mar. 8, 2011, provisional application No. 61/507,568, filed on Jul. 31, 2011, provisional application No. 61/287,079, filed on Dec. 16, 2009.

(51) Int. Cl.
*H03M 3/00* (2006.01)
*H03M 1/74* (2006.01)

(52) U.S. Cl.
CPC ............... *H03M 3/30* (2013.01); *H03M 1/747* (2013.01)
USPC .......................................... 341/143; 341/144

(58) Field of Classification Search
CPC ..... H03M 3/30; H03M 1/747; H03M 1/3247; H03M 27/04
USPC ........... 341/143, 144; 375/296, 297, 301, 310
See application file for complete search history.

(56) References Cited

U.S. PATENT DOCUMENTS

| | | | |
|---|---|---|---|
| 5,341,135 A | 8/1994 | Pearce | |
| 5,907,242 A | 5/1999 | Gard | |
| 7,633,417 B1 | 12/2009 | Yeh | |
| 8,155,238 B2 * | 4/2012 | Muller et al. | 375/297 |
| 2004/0208249 A1 | 10/2004 | Risbo et al. | |

OTHER PUBLICATIONS

J. Pham and A.C. Carusone, "A Time-Interleaved [Delta-Sigma]-DAC Architecture Clocked at the Nyquist Rate," IEEE Transactions on Circuits and Systems II: Express Briefs, 2008.

(Continued)

*Primary Examiner* — Joseph Lauture
(74) *Attorney, Agent, or Firm* — Joseph G. Swan, P.C.

(57) ABSTRACT

Provided are, among other things, systems, apparatuses, methods and techniques for converting a discrete-time quantized signal into a continuous-time, continuously variable signal. An exemplary converter preferably includes: (1) multiple oversampling converters, each processing a different frequency band, operated in parallel; (2) multirate (i.e., polyphase) delta-sigma modulators (preferably second-order or higher); (3) multi-bit quantizers; (4) multi-bit-to-variable-level signal converters, such as resistor ladder networks or current source networks; (5) adaptive nonlinear, bit-mapping to compensate for mismatches in the multi-bit-to-variable-level signal converters (e.g., by mimicking such mismatches and then shifting the resulting noise to a frequently range where it will be filtered out by a corresponding bandpass (reconstruction) filter); (6) multi-band (e.g., programmable noise-transfer-function response) bandpass delta-sigma modulators; and/or (7) a digital pre-distortion linearizer (DPL) for canceling noise and distortion introduced by an analog signal bandpass (reconstruction) filter bank.

16 Claims, 36 Drawing Sheets

(56) References Cited

OTHER PUBLICATIONS

International search report and written opinion from corresponding PCT application Serial No. PCT/US2010/060789.

Eshraghi A et al: "A Comparative Analysis of Parallel Delta—Sigma ADC Architectures", IEEE Transactions on Circuits and Systems Part I: Regular Papers, IEEE Service Center, New York, NY, US, vol. 51, No. 3, Mar. 1, 2004, pp. 450-458, XP011109280, ISSN: 1057-7122, DOI: D01:10.1109/TCSI.2004.823663.

Harris F J et al: "Implementation considerations and limitations for dynamic range enhanced analog to digital converters", IEEE International Conference on Acoustics, Speech, and Signal Processing, 1989. ICASSP-89., May 3, 1989, pp. 1286-1289, XP010083173.

D. Anastassiou "Error Diffusion Coding for A/D Conversion," IEEE Transactions on Circuits and Systems, vol. 36, 1989.

A. Petraglia and S. K. Mitra, "High Speed A/D Conversion Using QMF Banks," Proceedings: IEEE Symposium on Circuits and Systems, 1990.

Aziz, P., "Multi Band Sigma Delta Analog to Digital Conversion", IEEE International Conference on Acoustics, Speech, and Signal Processing, 1994.

S. R. Velazquez, T. Q. Nguyen, and S. R. Broadstone, "Design of Hybrid Filter Banks for Analog/Digital Conversion," IEEE Transactions on Signal Processing, 1998.

A. Fernandez-Vazquez and G. Jovanovic-Dolecek, "Design of Real and Complex Linear-Phase IIR Modified QMF Banks," IEEE Asia Pacific Conference on Circuits and Systems, 2006.

P. C. R. Brandao and A. Petraglia, "A Switched-Capacitor Hadamard Filter Bank in 0.35 m CMOS," Proceedings: 48th Midwest Symposium on Circuits and Systems, 2005.

P. M. Furth and A. G. Andreou, "A Design Framework for Low Power Analog Filter Banks", IEEE Transactions on Circuits and Systems I: Fundamental Theory and Applications, 1995.

R. Khoini-Poorfard, L. B. Lim, and D. A. Johns, "Time-Interleaved Oversampling A/D Converters: Theory and Practice," IEEE Transactions on Circuits and Systems II: Analog and Digital Signal Processing, 1997.

K. Chao, S. Nadeem, W. Lee, and C. Sodini, "A Higher Order Topology for Interpolative Modulators for Oversampling A/D Converters," IEEE Transactions on Circuits and Systems, 1990.

Prosecution history of parent U.S. Appl. No. 13/400,019.

\* cited by examiner

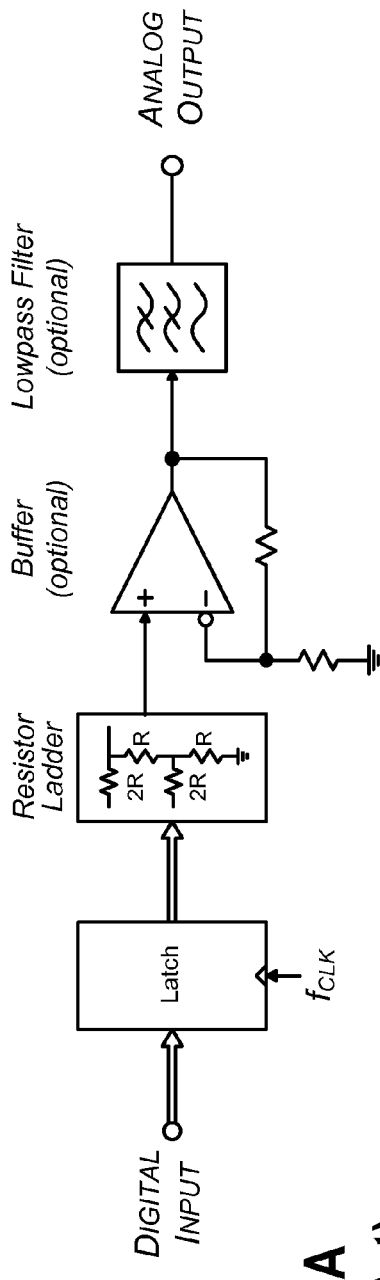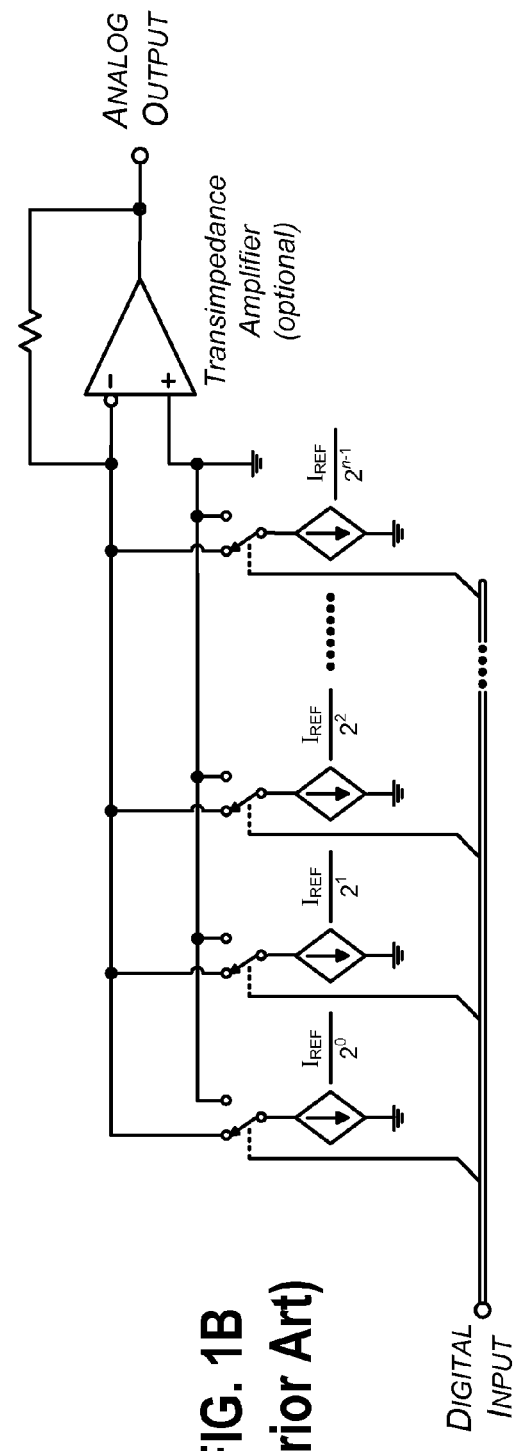
FIG. 1A (Prior Art)
FIG. 1B (Prior Art)

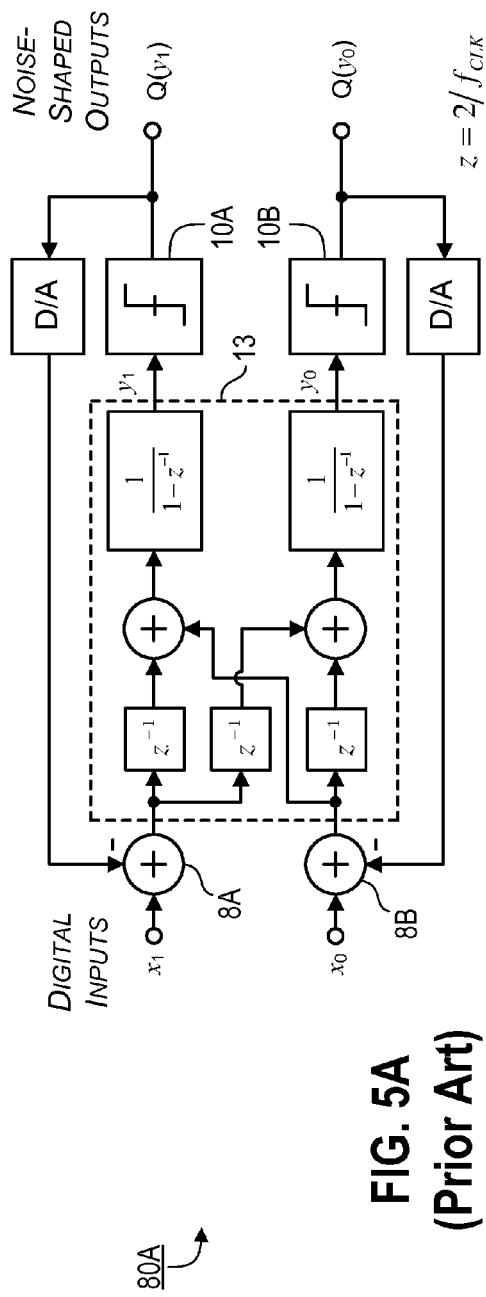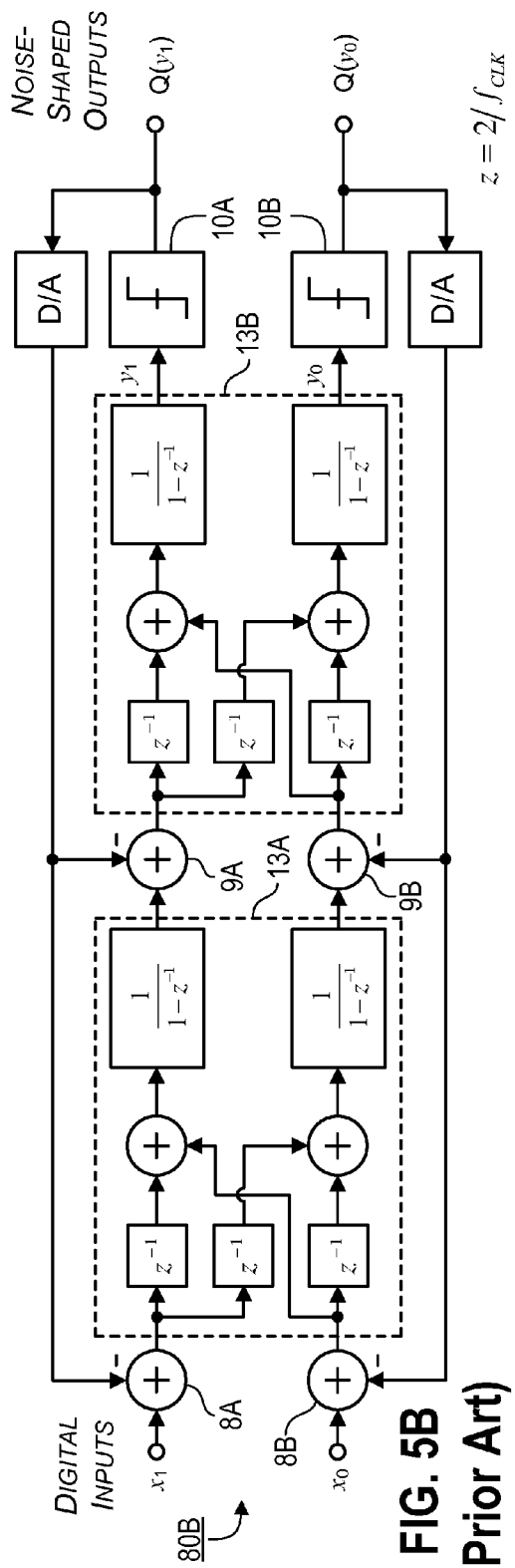
FIG. 5A (Prior Art)
FIG. 5B (Prior Art)

ated on Feb. 18, 2011, Mar. 8, 2011 and Jul. 13, 2011, respectively. The present application also is a continuation in part of U.S. patent application Ser. No. 12/970,379, filed on Dec. 16, 2010, which claimed the benefit of U.S. Provisional Patent Application Ser. No. 61/287,079, filed on Dec. 16, 2009, and titled "Method of Discrete to Linear Signal Transformation using Orthogonal Bandpass Oversampling (OBO)" (the '079 application). Each of the foregoing applications is incorporated by reference herein as though set forth herein in full.

CONVERSION OF A DISCRETE-TIME QUANTIZED SIGNAL INTO A CONTINUOUS-TIME, CONTINUOUSLY VARIABLE SIGNAL

This application claims the benefit of U.S. Provisional Patent Application Ser. Nos. 61/444,643, 61/450,617 and 61/507,568, filed on Feb. 18, 2011, Mar. 8, 2011 and Jul. 13, 2011, respectively. The present application also is a continuation in part of U.S. patent application Ser. No. 12/970,379, filed on Dec. 16, 2010, which claimed the benefit of U.S. Provisional Patent Application Ser. No. 61/287,079, filed on Dec. 16, 2009, and titled "Method of Discrete to Linear Signal Transformation using Orthogonal Bandpass Oversampling (OBO)" (the '079 application). Each of the foregoing applications is incorporated by reference herein as though set forth herein in full.

FIELD OF THE INVENTION

The present invention pertains to systems, methods and techniques for converting a sampled, quantized (discrete-time) signal into a continuous-time continuously variable (linear) signal. It is particularly applicable to very high sample-rate converters with high instantaneous bandwidth.

BACKGROUND

Many applications in modern electronics require that discrete-time signals, generated using computers and digital signal processors, be converted to linear (analog) signals, e.g., for transmission as electromagnetic signals. Typically, this transformation is made using a conventional digital-to-analog converter (DAC). However, the present inventor has discovered that each of the presently existing converters exhibits shortcomings that limit overall performance at very high sample rates.

Due to parallel processing and other innovations, the digital information processing bandwidth of computers and signal processors has advanced beyond the capabilities of state-of-the art DACs. Therefore, converters with higher instantaneous bandwidth are desired. Existing solutions are limited by instantaneous bandwidth (sample rate), effective conversion resolution (accuracy), or both.

The resolution of a DAC is a measure of the precision with which a quantized signal can be transformed into a continuous-time continuously variable signal, and typically is specified as a ratio of the total signal power to the total noise plus distortion power at the DAC output. This signal-to-noise-and-distortion ratio (SNDR) of a DAC is commonly expressed on a logarithmic scale in units of decibels (dB). When a discrete-time discretely variable (digital) signal is converted into a continuous-time continuously variable (analog) signal, the quality of the analog signal is corrupted by various limitations and errors introduced during the conversion process. Examples include: 1) the finite granularity of the DAC digital inputs (bit width) that produces quantization noise; 2) the imprecise (e.g., nonlinear) mapping of digital inputs to corresponding discrete output voltage or current levels that introduces distortion in the form of rounding inaccuracies (rounding errors); 3) the imperfect timing between transitions in output voltages or currents relative to transitions in digital inputs that causes noise in the form of sampling jitter; and 4) the thermal noise associated with active devices (e.g., switches and amplifiers) that couples onto the DAC output. High-resolution converters transform discrete signals into continuously variable signals using a rounding operation with finer granularity and more linear mapping of digital inputs to output voltage and current. Instantaneous conversion bandwidth is limited by the Nyquist criterion to a theoretical maximum of one-half the converter sample rate (the Nyquist limit). However, high-resolution conversion (of ≥10 bits) conventionally has been limited to instantaneous bandwidths of about a few gigahertz (GHz) or less.

Converters that quantize signals at a sample rate ($f_S$) that is at or slightly above a frequency equal to twice the signal bandwidth ($f_B$) with several or many bits of resolution are conventionally known as Nyquist-rate converters. Prior-art Nyquist-rate converter architectures include those implemented using resistor ladder networks (e.g., R-2R networks), or those employing switched current/voltage sources with unary (i.e., equal) weighting or binary weighting. A conventional resistor-ladder DAC, such as that shown in FIG. 1A, generates a variable output voltage equal to the binary-weighted sum of multiple, two-level (i.e., digital) inputs. The voltage summation operation is performed using a network of resistors, having appropriately weighted resistance (i.e., a binary-weighted resistor ladder). The voltage at the resistor network output sometimes is buffered and/or sometimes is smoothed, using an analog lowpass filter, to produce a continuously variable signal. An alternative DAC structure is illustrated in FIG. 1B, which instead of a resistor ladder network, uses a switched bank of current sources to generate a variable output current equal to the binary-weighted sum of digital inputs. As shown in FIG. 1B, the output current sometimes is converted to a proportional output voltage using a transimpedance amplifier (i.e., a current-to-voltage converter).

Conventional Nyquist converters potentially can achieve very high instantaneous bandwidths, but as discussed in greater detail below, the present inventor has discovered that component mismatches in the resistor ladder network, or in the switched current sources, can introduce rounding errors that significantly limit attainable resolution. In addition, the resolution of conventional Nyquist converters is limited by other practical implementation impairments such as sampling jitter and thermal noise. Although Nyquist converters potentially could realize high resolution at instantaneous bandwidths greater than 10 GHz in theory, due to the foregoing problems, this potential has been unrealized in conventional Nyquist converters.

A conventional approach that attempts to reduce quantization noise and errors uses an oversampling technique. A conventional Nyquist converter transforms each digital input into a single proportional output sample (i.e., voltage or current). Conventional oversampling converters first transform each digital input into a sequence of pseudorandom, two-valued samples (i.e., a positive value or a negative value), such that the average of this two-valued, pseudorandom sequence is proportional to the digital input. Therefore, oversampling converters generate coarse (e.g., two-level) analog voltage or current outputs at a rate (i.e., $f_S$) that is much higher than twice the input signal bandwidth (i.e., $f_S \gg f_B$), where $N = f_S/f_B/2$ is conventionally referred to as the oversampling ratio of the converter. A continuously variable output that is proportional to the digital inputs is produced from the two-valued, pseudorandom output sequence using a lowpass filtering operation that effectively averages the output samples. Although this averaging process reduces the bandwidth of the oversampling converter, it has the benefit of improving the converter resolution by mitigating quantization noise (i.e., the noise introduced by using only two values to represent a continuously variable signal) and errors resulting from component mismatches, sampling jitter, and thermal noise. The extent of this benefit is directly related to the output sample rate $f_S$ (i.e., benefit increases as sample rate increases) and is conventionally enhanced using oversampling in conjunction with an operation referred to as noise shaping, that ideally attenuates quantization noise and errors in the signal bandwidth without also attenuating the signal itself. Through this noise-shaped quantization operation and subsequent lowpass filtering (i.e., output averaging), oversampling converters transform a high-rate intermediate signal having low resolution into a relatively low bandwidth output signal having improved resolution.

FIGS. 2A&B illustrate block diagrams of conventional, lowpass oversampling converters 5A and 5B, respectively. A conventional oversampling converter will typically employ an upsampling operation 6, generally consisting of upsampling 6A by the converter oversampling ratio N followed by interpolation (lowpass) filtering 6B, and uses delta-sigma ($\Delta\Sigma$) modulation 7A&B to shape quantization noise. As the name implies, delta-sigma modulators 7A&B shape the noise that will be introduced by two-level quantizer 10 via difference operation 8 (i.e., delta) and integration operation 13 (i.e., sigma), e.g., $$I(z) = \frac{1}{1-z^{-1}}.$$

The converter 5A, shown in FIG. 2A, uses what is conventionally referred to as an interpolative $\Delta\Sigma$ modulator circuit (i.e., circuit 7A). Circuit 5B uses an alternative $\Delta\Sigma$ modulator 7B, which has the error-feedback structure shown in FIG. 2B. See D. Anastassiou, "Error Diffusion Coding in A/D Conversion," IEEE Transactions on Circuits and Systems, Vol. 36, 1989. Generally speaking, the delta-sigma modulator processes the signal with one transfer function (i.e., the signal transfer function or STF) and the quantization noise with a different transfer function (i.e., the noise transfer function or NTF). Conventional transfer functions (i.e., after accounting for the implicit delay of the clocking operation on two-level quantizer 10) are of the form $STF(z)=z^{-k}$ and $NTF(z)=(1-z^{-1})^P$, where k is an integer, $z^{-1}$ represents a unit delay equal to $T_{CLK}=1/f_{CLK}$, and P is called the order of the lowpass modulator or noise-shaped response. Converter circuits 5A&B employ first-order $\Delta\Sigma$ modulation (i.e., P=1) that produces STF frequency response 30 and NTF frequency response 32 that are shown in FIG. 2C. For both circuits 5A&B, the output sample rate $f_S$, and therefore the converter oversampling ratio N, is determined by the clock frequency $f_{CLK}$ of the delta-sigma modulator 7A&B (i.e., shown as the input clock to the two-level quantizer 10 in FIGS. 2A&B), such that $f_S=f_{CLK}$.

For a given converter resolution, the bandwidth of a conventional oversampling converter typically is increased by increasing the clock frequency $f_{CLK}$ of the $\Delta\Sigma$ modulator, thereby making the oversampling ratio N higher. Similarly, for a given bandwidth, higher oversampling ratios N result in improved converter resolution. Generally speaking, the present inventor has determined that the resolution B of a conventional oversampling converter is given by $$B = \Delta Q - \frac{1}{2} \cdot \log_2\left(\int_0^{f_S/2} |NTF(e^{2\pi jfT}, P) \cdot F(e^{2\pi jfT})|^2 df\right),$$

where $\Delta Q$ is the number of bits at the output of quantization circuit 10 (i.e., level of coarse quantization which typically is equal to one) and $F(e^{2\pi jfT})$ is the frequency response of output filter 12. Increasing the clock frequency $f_{CLK}$ of the $\Delta\Sigma$ modulator requires circuitry with higher speed capability, and generally, higher power dissipation. Alternatively, higher bandwidth and/or improved resolution are realized by increasing the order P of the $\Delta\Sigma$ modulator. Compared to converter circuits 5A&B, lowpass oversampling converter 5C, illustrated in FIG. 2D, realizes higher bandwidth (or improved resolution) using interpolative $\Delta\Sigma$ modulator circuit 7C, which incorporates two integration operations (i.e., circuits 13A&B) to produce a noise-shaped response that is second-order (i.e., P=2). Increasing modulator order P, however, causes undesirable reductions in the stability of the modulator. The present inventor has discovered, for example, that a $\Delta\Sigma$ modulator of order four or higher is unstable with two-level (i.e., $\Delta Q=1$) quantization. The present inventor also has discovered that the multi-level quantization circuits needed to stabilize high-order modulators introduce rounding errors that are not subjected to the noise-shaped response of the $\Delta\Sigma$ modulator. As a result of constraints on the operating speed of conventional $\Delta\Sigma$ modulator circuits and on the rounding accuracy of multi-level quantization circuits, increasing the clock frequency and/or the order of the $\Delta\Sigma$ modulator has limited utility in improving the bandwidth and/or resolution of conventional oversampling converters.

The delta-sigma converters 5A-C illustrated in FIGS. 2A,B&D are conventionally known as lowpass, delta-sigma converters. A variation on the conventional lowpass converter employs bandpass delta-sigma modulation to allow conversion of narrowband signals that are centered at frequencies other than zero. An exemplary bandpass oversampling converter 40A, illustrated in FIG. 3A, includes a bandpass delta-sigma modulator 42 that shapes noise from two-level quantizer 10 by performing a difference operation 8 (i.e., delta) and an integration operation 14 (i.e., sigma), respectively, where $$H(z) = \frac{z-1}{1+z^{-2}}$$

and $z^{-1}$ represents a unit delay equal to $T_{CLK}$. After accounting for the implicit delay of the clocking operation on two-level quantizer 10, conventional bandpass $\Delta\Sigma$ modulator 42 has a $STF(z)=z^{-1}$ and a second-order $NTF(z)=1-z^{-2}$. Like converter circuits 5A&C, bandpass oversampling converter circuit 40A is an interpolative structure that produces a signal response 70, shown in FIG. 3B, that is different from its quantization noise response 71. As shown in FIG. 3B, the bandpass modulator of FIG. 3A has a NTF with a minimum 72 at the center of the converter Nyquist bandwidth (i.e., $\frac{1}{4} \cdot f_S$). Producing an NTF with a spectral null at a frequency other than zero hertz requires a real $\Delta\Sigma$ modulator with, at minimum, a second-order response (i.e., the delay operator z is raised to a power of $-2$), and in general, the NTF of a bandpass $\Delta\Sigma$ modulator is of the form $(1+\rho \cdot z^{-1}+z^{-2})^P$, where $-2 \leq \rho \leq +2$. Although the signal response 70 of circuit 40A is all-pass, the present inventor has discovered that, in general, the STF of bandpass oversampling converters is not all-pass when interpolative modulator structures are employed. Conversely, the present inventor has discovered that bandpass oversampling converters that utilize the alternative error-feedback structure of FIG. 2B, have an STF which is uniformly all-pass. After two-level quantization 10, bandpass filtering 43 of quantization noise, similar to that performed in the standard conventional lowpass oversampling converter (e.g., either of converters 5A&B) is performed. In FIG. 3A, it is assumed that the input data (i.e., digital input) rate is equal to the converter output sample rate $f_{CLK}$, and therefore, an upsampling operation is not included. However, in cases where the input data rate is lower than the converter output sample rate $f_{CLK}$, an upsampling operation would be included.

Although oversampling with noise-shaped quantization can reduce quantization noise and other conversion errors, the output filtering (i.e., smoothing) operations generally limit the utility of oversampling converters to applications requiring only low instantaneous bandwidth. Conventional schemes for overcoming the bandwidth and resolution performance limitations of data converters generally have been devised with a focus on the conversion of analog signals to digital signals (i.e., analog-to-digital conversion), rather than on the conversion of digital (discrete) signals to analog (linear) signals (i.e., digital-to-analog conversion), which is the subject of the present invention. The present inventor has discovered that these conventional schemes for improving bandwidth and/or resolution in analog-to-digital conversion suffer from significant disadvantages, particularly in attempts to directly adapt these schemes for use in digital-to-analog conversion applications.

For example, one attempt to overcome the instantaneous bandwidth limitations of high-resolution, analog-to-digital (A/D) converters is conventional hybrid filter bank (HFB) converter 50, illustrated in FIG. 4A. See A. Petraglia and S. K. Mitra, "High Speed A/D Conversion Using QMF Banks," Proceedings: IEEE Symposium on Circuits and Systems, 1990. A conventional HFB converter consists of multiple narrowband converters that are operated in parallel, such that: 1) a wideband, analog signal is spectrally decomposed into multiple narrowband segments (i.e., sub-bands), using an array of analog bandpass filters (i.e., analysis filters 52A-C) with minimally overlapped frequency responses; 2) each sub-band is downconverted (i.e., downsampler 53) and digitized using low-speed converter 54; and 3) the digitized outputs of each converter 54 are upconverted (i.e., upsampler 56) and then combined, using an array of digital bandpass filters (i.e., synthesis filters 58A-C) with frequency responses that overlap to create an overall response that is all-pass (i.e., digital filters with near-perfect signal reconstruction properties). For the conversion of digital signals into analog signals, the present inventor has contemplated a complementary scheme, where by direct adaptation: 1) analog analysis filters 52A-C at the converter input are moved to the converter output and become signal synthesis filters; 2) analog-to-digital converters 54 are replaced with digital-to-analog converters; and 3) digital synthesis filters 58A-C are moved to the converter input and become signal analysis filters. However, the present inventor has discovered that the performance of this complementary scheme is limited by the intermodulation distortion (i.e., intermodulation or non-ideal cross-products) of the analog mixers needed for the analog upconversion operation. The present inventor has also discovered that at high sample rates (e.g., greater than several gigahertz), the complexity of multiple digital analysis filters (i.e., one per processing branch) can be prohibitive in many applications, such as those where more than just a few parallel processing branches are needed to realize desired conversion bandwidth and resolution performance.

A second attempt to overcome the instantaneous bandwidth limitations of high-resolution, analog-to-digital (A/D) converters is conventional Multi-Band Delta-Sigma (MBΔΣ) converter 70, shown in FIG. 4B. See Aziz, P., "Multi Band Sigma Delta Analog to Digital Conversion", IEEE International Conference on Acoustics, Speech, and Signal Processing, 1994. The conventional MBΔΣ approach is similar to the conventional HFB approach except that use of bandpass ΔΣ converters, instead of lowpass A/D converters, eliminates the need for analog analysis filters (e.g., filters 52A-C of circuit 50 in FIG. 4A), downconversion operations (e.g., downsampler 53 of circuit 50 in FIG. 4A), and upconversion operations (e.g., upsampler 56 of circuit 50 in FIG. 4A). For converting digital signals to analog signals, the present inventor has contemplated a complementary scheme in which by direct adaptation: 1) analog ΔΣ modulators 72 are replaced with equivalent digital ΔΣ modulators; and 2) digital synthesis filters 73A-C are replaced with equivalent analog synthesis filters. The present inventor, however, has discovered that the sampling rate (i.e., oversampling ratio) of this complementary scheme is limited by the switching times (speed) of the digital logic needed to implement the digital ΔΣ modulators (i.e., a less significant limitation in analog implementations). Furthermore, the present inventor also has discovered that this complementary scheme is impractical because it requires a bank of continuous-time analog filters whose individual responses replicate those of high-order, digital filters with perfect reconstruction properties (i.e., a bank of filters with an overall response that is all-pass). Unlike the HFB approach of FIG. 4A, where imperfections in the analog filter bank are mitigated by increasing the complexity of the associated digital filter bank (see S. R. Velazquez, T. Q. Nguyen, and S. R. Broadstone, "Design of Hybrid Filter Banks for Analog/Digital Conversion," IEEE Transactions on Signal Processing, 1998), the conventional MBΔΣ approach provides no means of compensating for the amplitude and group delay distortion introduced by analog filter banks with imperfect signal reconstruction properties. Use of direct digital-to-analog filter transformations (i.e., those based on conventional bilinear or impulse-invariant transforms) to design analog filter banks with an all-pass response, generally results in analog filters of unmanageable complexity (i.e., filter orders of 30 or more). Approximations to these direct transformations conventionally support only a small number of parallel processing paths (e.g., see A. Fernandez-Vazquez and G. Jovanovic-Dolecek, "Design of Real and Complex Linear-Phase IIR Modified QMF Banks," IEEE Asia Pacific Conference on Circuits and Systems, 2006), and/or require circuits that are not practical for operation at multi-gigahertz sample rates, such as switched-capacitor or other impractical circuits (e.g., see P. C. R. Brandao and A. Petraglia, "A Switched-Capacitor Hadamard Filter Bank in 0.35 μm CMOS," Proceedings: 48th Midwest Symposium on Circuits and Systems, 2005; P. M. Furth and A. G. Andreou, "A Design Framework for Low Power Analog Filter Banks", IEEE Transactions on Circuits and Systems I: Fundamental Theory and Applications, 1995). As discussed in greater detail below, however, the present inventor has discovered that with relatively minor modifications to standard filter responses (e.g., only center frequency, bandwidth, and/or order), the residual amplitude and group delay distortion introduced by the analog filter bank can be reduced to levels that are acceptable in many applications.

In addition to the conventional frequency-interleaved schemes employed by converters 50 and 70 (i.e., schemes involving spectral decomposition of the converter input signal), another attempt at overcoming the instantaneous bandwidth limitations of high-resolution, analog-to-digital converters involves the use of conventional time-interleaving to increase the bandwidth, or equivalently, the sample rate of a ΔΣ modulator. Circuits 80A&B, which are illustrated in FIGS. 5A&B, respectively, are conventional time-interleaved ΔΣ modulators that employ a time-interleaving factor of m=2 (i.e., two parallel processing paths). Conventional time-interleaved ΔΣ modulators, such as circuits 80A&B, are interpolative structures wherein the integrator function (i.e., integrator 13 of circuit 80A and integrators 13A&B of circuit 80B) is performed by circuits that operate in parallel. This process of implementing a particular processing function using parallel circuits is sometimes referred to in the prior art as polyphase decomposition, or multirate processing. In circuits 80A&B of FIGS. 5A&B, the integrator function has been decomposed into two parallel circuits (i.e., resulting a poyphase decomposition factor of m=2), and the delay operator z represents a half-rate $$\left(\text{i.e., } \frac{1}{m} \cdot f_s\right)$$

delay equal to $2/f_S$, where $f_S$ is the effective sample rate of the converter. Circuit 80A is a lowpass modulator with an NTF response that is first-order (i.e., P=1), and circuit 80B is a lowpass modulator with an NTF response that is approximately second-order (i.e., P=2). But rather than decomposing the entire modulator into parallel (polyphase) circuits, in conventional converters the difference function of the modulator (i.e., subtractors 8A&B of circuit 80A&B) and quantization function of the modulator (i.e., quantizers 10A&B in circuits 80A&B) are simply replicated m times and distributed across the m parallel processing paths. See R. Khoini-Poorfard, L. B. Lim, and D. A. Johns, "Time-Interleaved Oversampling A/D Converters: Theory and Practice," IEEE Transactions on Circuits and Systems II: Analog and Digital Signal Processing, 1997. As discussed in greater detail below, simple replication and distribution of the difference and quantization functions (i.e., rather than polyphase decomposition) causes conventional time-interleaved ΔΣ modulators to exhibit undesirable properties that prevent their use in very high-speed converter applications.

Referring to conventional circuit 80A of FIG. 5A, which utilizes transparent (i.e., unclocked) quantizers with no implicit delay, it can be shown that the quantized output $Q(y_n)$ of the modulator is described by the difference equation $$Q[y_n]=Q[x_{n-1}+x_{n-2}-Q(y_{n-1})-Q(y_{n-2})+y_{n-2}],$$

where the Q(•) operator represents quantization (rounding). The above difference equation results in a $STF(z)=z^{-1}$ (i.e., all-pass) and a $NTF(z)=1-z^{-1}$, where $z^{-1}$ represents a full-rate delay, equal to one period of the effective sample rate $f_S$. Although the STF and NTF of the time-interleaved ΔΣ modulator are equal to those of the standard (i.e., non-time-interleaved ΔΣ modulator), the output of the circuit is a function of an output $Q(y_{n-1})$ that has been delayed by only a single full-rate delay (i.e., one sample frequency clock period). Processing of outputs that are delayed by only one period of the effective sample rate $f_S$ creates a race condition requiring circuit 80A to operate at a speed of $f_S=2\cdot f_{CLK}$, rather than the intended speed of $f_{CLK}$. This race condition occurs because the difference and quantization functions of the time-interleaved modulator are not implemented as true polyphase (multirate) operations. A similar race condition occurs in the implementation of circuit 80B, which has an output $Q(y_n)$ that is described by the difference equation $$Q(y_n)=Q[x_{n-2}+2\cdot x_{n-3}+x_{n-4}-Q(y_{n-1})-2\cdot Q(y_{n-2})-Q(y_{n-3})+2\cdot y_{n-2}-y_{n-4}]$$

(i.e., assuming no implicit quantizer delay). Since the output of circuit 80B also depends on an output $Q(y_{n-1})$ that has been delayed by only one full-rate period, the circuit also must operate at a speed of $f_S=2\cdot f_{CLK}$, rather than the intended speed of $f_{CLK}$. In addition to the output race condition, circuit 80B exhibits three other undesirable properties: 1) the modulator has a signal transfer function $STF(z)=(1+z^{-1})/(1+z^{-3})$ which deviates from a true all-pass response of $STF(z)=z^{-k}$; 2) the modulator has a noise transfer function $NTF(z)=(1-z^{-1})^2 (1+z^{-1})/(1+z^{-3})$ which deviates from the desired form of $(1-z^{-1})^P$ for lowpass modulators; and 3) the cascaded integrator structure of the modulator is impractical for use in bandpass converter applications because second-order (bandpass) NTFs of the form $(1+\rho\cdot z^{-1}+z^{-2})^P$, where $-2\leq\rho\leq+2$, cannot be factored as into cascaded first-order functions of the form $(1+\alpha\cdot z^{-1})\cdot(1+\beta\cdot z^{-1})$.

The present inventor has discovered that conventional lowpass ΔΣ converters, as illustrated in FIGS. 2A-C, and conventional bandpass ΔΣ converters, as illustrated in FIG. 3A, have several disadvantages that limit their utility in discrete-to-linear (digital-to-analog) converter applications requiring very high instantaneous bandwidth and high resolution. The present inventor also has discovered that these disadvantages cannot be overcome by: 1) direct adaptations of the conventional parallel processing approaches devised for A/D conversion, as illustrated in FIGS. 4A&B; or 2) by adopting conventional time-interleaved approaches for ΔΣ modulation, as illustrated in FIGS. 5A&B. These disadvantages, which are discussed in greater detail in the Description of the Preferred Embodiment(s) section, include: 1) conversion bandwidth that is limited by the narrow lowpass or narrow bandpass filtering operations used to attenuate shaped quantization noise and errors; 2) conversion resolution (SNDR) that is limited by the clock frequency $f_{CLK}$ of the delta-sigma modulator (i.e., the clock frequency of a two-level quantizer); and 3) conversion resolution that is limited by the low-order noise-shaped response (i.e., generally second-order for bandpass modulators) needed for stable operation with two-level quantizers. In addition, conventional oversampling digital-to-analog converters cannot be operated in parallel as hybrid filter banks (i.e., HFB scheme) or multi-band arrays (i.e., MBΔΣ scheme), without suffering from the amplitude and group delay distortion introduced by imperfect analog filter banks, and/or the nonlinear (intermodulation) distortion introduced by upconverting analog mixers. Because of these disadvantages, the resolution of conventional oversampling converters cannot be increased without: 1) reducing bandwidth to improve the quantization noise attenuation of the output (smoothing) filters; or 2) increasing the converter sample rate by using digital circuits with higher switching speeds, since high-order modulators are unstable with two-level quantization. In addition, conventional oversampling converters employ delta-sigma modulator structures that do not provide a means of dynamically varying, or re-programming, the frequency ($f_{notch}$) at which the quantization noise frequency response is a minimum. However, the present inventor has discovered that such a feature can be advantageous in multi-mode applications (e.g., frequency synthesizers and tunable radios) where, depending on its programming, a single converter preferably can operate on different (multiple) frequency bands.

SUMMARY OF THE INVENTION

The present invention provides an improved DAC, particularly for use at very high sample rates and instantaneous bandwidths approaching the Nyquist limit. The improved DAC overcomes the resolution limitations of conventional Nyquist converters and the bandwidth limitations of conventional oversampling converters.

Thus, one specific embodiment of the invention is directed to an apparatus for converting a discrete-time quantized signal into a continuous-time, continuously variable signal and includes: 1) an input line for accepting, in serial (multi-bit) format, a high-rate input signal that is discrete in time and in value; 2) a demultiplexer coupled to the input line for converting the high-rate serial input signal into multiple, parallel output signals at a lower rate; 3) multiple, discrete-time noise-shaping/quantization circuits that operate as parallel paths and have multiple inputs and an output, such that the multiple inputs are either coupled to the multiple outputs of the demultiplexer or coupled to the outputs of the discrete-time noise-shaping/quantization circuits, with each such parallel path generating a different sub-sampling phase of a complete signal that is output by the discrete-time noise-shaping/quantization circuit; 4) a multiplexer coupled to the outputs of the multiple, discrete-time noise-shaping/quantization circuits that converts low-rate parallel inputs to a serial (multi-bit) output signal at a higher rate; 5) a multi-bit-to-variable-level signal converter coupled to the serial, high-rate output of the multiplexer; and 6) an analog bandpass filter coupled to an output of the multi-bit-to-continuously-variable signal converter. Together, the discrete-time noise-shaping/quantization circuits produce a conversion-noise frequency response with a minimum that corresponds to a frequency band selected by the analog bandpass filter. Each discrete-time noise-shaping/quantization circuit operates at a rate ($f_{CLK}$) that is m times less than the effective sample rate $f_S$ of the converter, where m is the number of parallel paths (i.e., the number of discrete-time noise-shaping/quantization circuits that are operated in parallel).

An alternate specific embodiment of the invention is directed to an apparatus for converting a discrete-time quantized signal into a continuous-time, continuously variable signal and includes: 1) an input line for accepting an input signal that is discrete in time and in value; 2) an adder having a first input coupled to the input line, a second input and an output; 3) a multi-bit, discrete-time noise-shaping/quantization circuit coupled to the output of the adder; 4) a multi-bit-to-variable-level signal converter coupled to the output of the discrete-time noise-shaping/quantization circuit; 5) an analog bandpass filter coupled to an output of the multi-bit-to-continuously-variable signal converter; 4) a nonlinear bit-mapping component, having an input coupled to the output of the discrete-time noise-shaping/quantization circuit and also having an output; and 5) a feedback-loop filter having a first input coupled to the output of the nonlinear bit-mapping component, a second input coupled to the output of the adder, and an output coupled to the second input of the adder. The discrete-time noise-shaping/quantization circuit has a conversion-noise frequency response with a minimum that corresponds to a frequency band selected by the analog bandpass filter. The nonlinear bit-mapping component scales different bits of a multi-bit signal at its input, using different multi-bit factors to produce an output with an intentionally imperfect binary weighting, such as an imperfect binary weighting that is matched to the unintentionally imperfect binary weighting of a conventional resistor ladder network.

A third specific embodiment of the invention is directed to an apparatus for converting a discrete-time quantized signal into a continuous-time, continuously variable signal and includes: 1) an input line for accepting an input signal that is discrete in time and in value; 2) multiple processing branches coupled to the input line; and 3) an adder. Each of the processing branches includes: (a) a discrete-time noise-shaping/quantization circuit, (b) a multi-bit-to-variable-level signal converter coupled to an output of the discrete-time noise-shaping/quantization circuit, and (c) an analog bandpass filter coupled to an output of the multi-bit-to-continuously-variable signal converter. The adder is coupled to an output of the analog bandpass filter in each of the processing branches. The discrete-time noise-shaping/quantization circuits in different ones of the processing branches have conversion-noise frequency responses with minima at different frequencies, and each of the discrete-time noise-shaping/quantization circuits produce a conversion-noise frequency response with a minimum that corresponds to a frequency band selected by the analog bandpass filter in the same processing branch. The analog filters in the various processing branches have frequency response orders that are not greater than 10 and preferably have standard analog filter responses (e.g., Butterworth, Chebychev, coupled-resonator), where the center frequencies, bandwidths, and/or orders of one or more filters has been made intentionally unequal to the others to minimize the amplitude and group delay distortion introduced by the composite filter bank response (i.e., the summed frequency responses of the filters in the various processing branches). It is noted that in applications where conversion at zero frequency (i.e., DC) is desired, one of the processing branches preferably includes an analog bandpass filter that is centered at zero frequency to produce a lowpass response.

A fourth specific embodiment of the invention is directed to an apparatus for converting a discrete-time quantized signal into a continuous-time, continuously variable signal that includes: 1) an input line for accepting an input signal that is discrete in time and in value; 2) a digital pre-distortion linearizer (DPL) circuit coupled to the input line; 3) multiple processing branches coupled to the DPL; and 4) an adder. Each of the processing branches includes: (a) a discrete-time noise-shaping/quantization circuit, (b) a multi-bit-to-variable-level signal converter coupled to an output of the discrete-time noise-shaping/quantization circuit, and (c) an analog bandpass filter coupled to an output of the multi-bit-to-continuously-variable signal converter. The adder is coupled to an output of the analog bandpass filter in each of the processing branches. The discrete-time noise-shaping/quantization circuits in different ones of the processing branches have conversion-noise frequency responses with minima at different frequencies, and each of the discrete-time noise-shaping/quantization circuits produce a conversion-noise frequency response with a minimum that corresponds to a frequency band selected by the analog bandpass filter in the same processing branch. Unlike conventional HFB schemes that use analog filters to divide an input signal into narrowband segments, the DPL is a digital filter that does not perform such a frequency decomposition function in the representative embodiment of the invention. Instead, the frequency response of the DPL preferably has intentional amplitude and group delay (i.e., phase) variation, such as intentional amplitude and group delay variation that is equal and opposite to the unintentional amplitude and group delay variation that occurs within an analog filter bank that is constructed from analog filters with standard frequency responses (e.g., Butterworth, Chebychev, coupled-resonator, etc.). It is noted that the cascaded response of the DPL and the imperfect analog filter bank preferably is approximately all-pass, and therefore, forms a filter bank with near-perfect signal reconstruction properties.

A fifth specific embodiment of the invention is directed to an apparatus for converting a discrete-time quantized signal into a continuous-time, continuously variable signal and includes: 1) an input line for accepting an input signal that is discrete in time and in value; 2) a discrete-time noise-shaping/quantization circuit having an input coupled to the input line and having a plurality of parallel paths, with each parallel path generating a different subsampling phase of a complete signal that is output by the discrete-time noise-shaping/quantization circuit; 3) a multi-bit-to-variable-level signal converter coupled to an output of the discrete-time noise-shaping/quantization circuit; and 4) an analog bandpass filter coupled to an output of the multi-bit-to-continuously-variable signal converter. The discrete-time noise-shaping/quantization circuit has a conversion-noise frequency response with a minimum that corresponds to a frequency band selected by the analog bandpass filter, and the outputs of at least some of the parallel paths are a function only of inputs to the parallel paths and previous outputs from the parallel paths that have been delayed by more than a sample period of the input signal times a total number of the parallel paths.

A digital-to-analog (D/A) converter apparatus created by incorporating one or more of the specific embodiments of the invention described above, typically can provide a better combination of high resolution and wide bandwidth than is possible with conventional D/A converters and can be used for various commercial, industrial and military applications, e.g., in various direct conversion transmitters, software-defined or cognitive radios, multi-channel communication transmitters, all-digital RADAR systems, and high-speed arbitrary waveform generators.

The foregoing summary is intended merely to provide a brief description of certain aspects of the invention. A more complete understanding of the invention can be obtained by referring to the claims and the following detailed description of the preferred embodiments in connection with the accompanying figures.

BRIEF DESCRIPTION OF THE DRAWINGS

In the following disclosure, the invention is described with reference to the attached drawings. However, it should be understood that the drawings merely depict certain representative and/or exemplary embodiments and features of the present invention and are not intended to limit the scope of the invention in any manner. The following is a brief description of each of the attached drawings.

FIG. 1A is a block diagram of a conventional DAC that converts binary-weighted digital inputs to binary-weighted voltage outputs using a resistor ladder network, a buffer amplifier and an analog smoothing (lowpass) filter; and FIG. 1B is a block diagram of a conventional DAC that converts binary-weighted digital inputs to binary-weighted voltage outputs using switched current sources and a transimpedance amplifier.

FIG. 5A is a block diagram of a conventional time-interleaved oversampling converter having an interpolative delta-sigma modulator with a first-order lowpass response and two-level quantization; and FIG. 5B is a block diagram of a conventional time-interleaved oversampling converter having an interpolative delta-sigma modulator with a second-order lowpass response and two-level quantization.

DESCRIPTION OF THE PREFERRED EMBODIMENT(S)

Figure 2A:
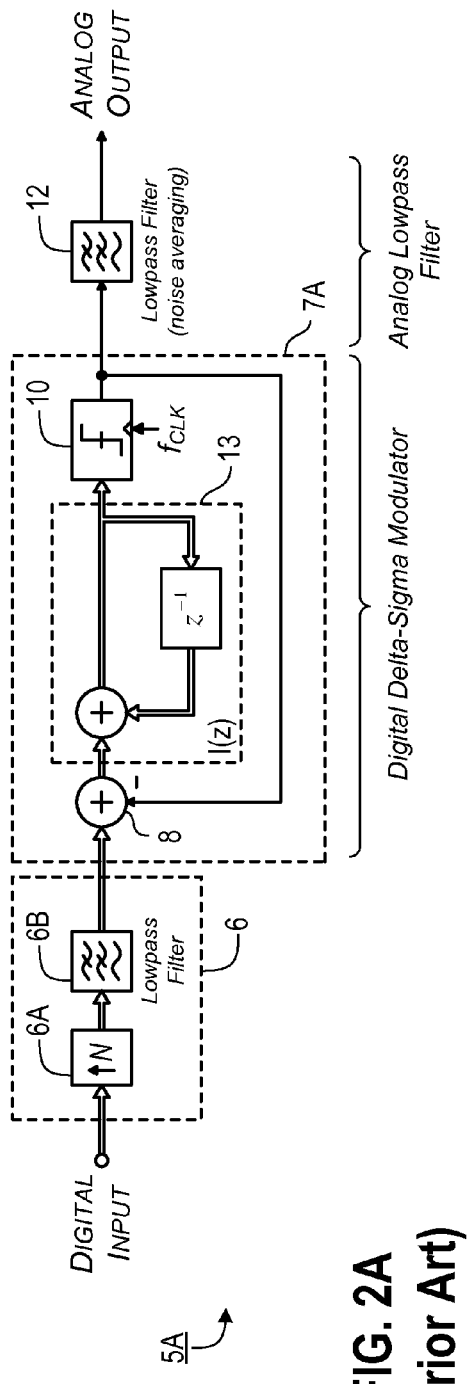
FIG. 2A is a block diagram of a conventional lowpass oversampling converter having an interpolative delta-sigma modulator with first-order response and two-level quantization.
Figure 2B:
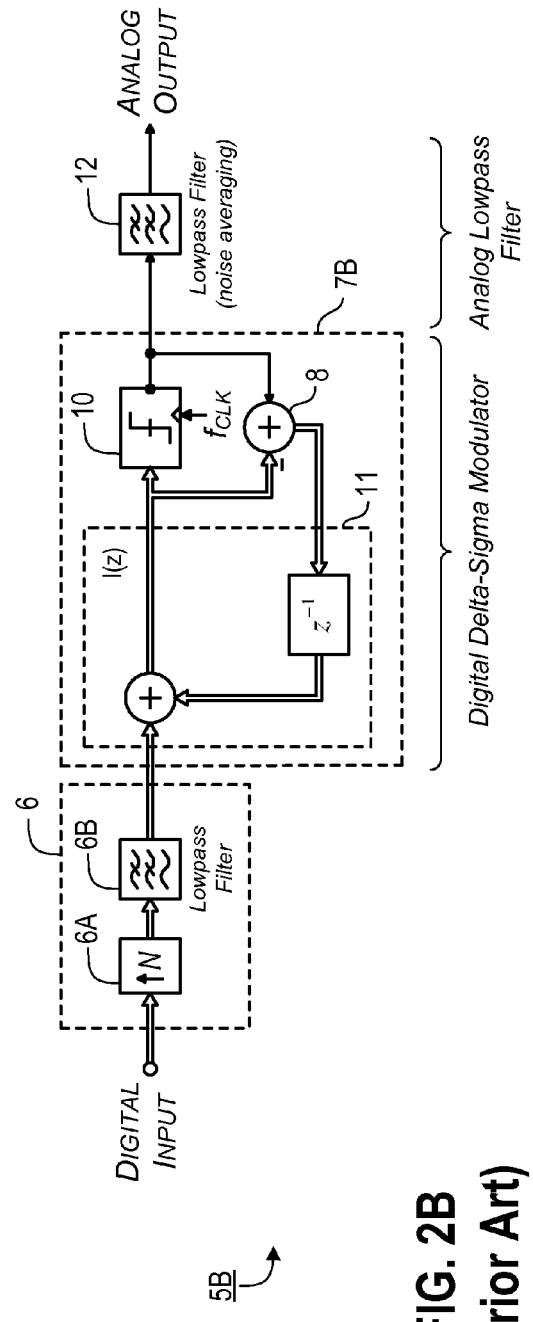
FIG. 2B is a block diagram of a conventional lowpass oversampling converter having an error-feedback delta-sigma modulator with first-order response and two-level quantization.
Figure 2C:
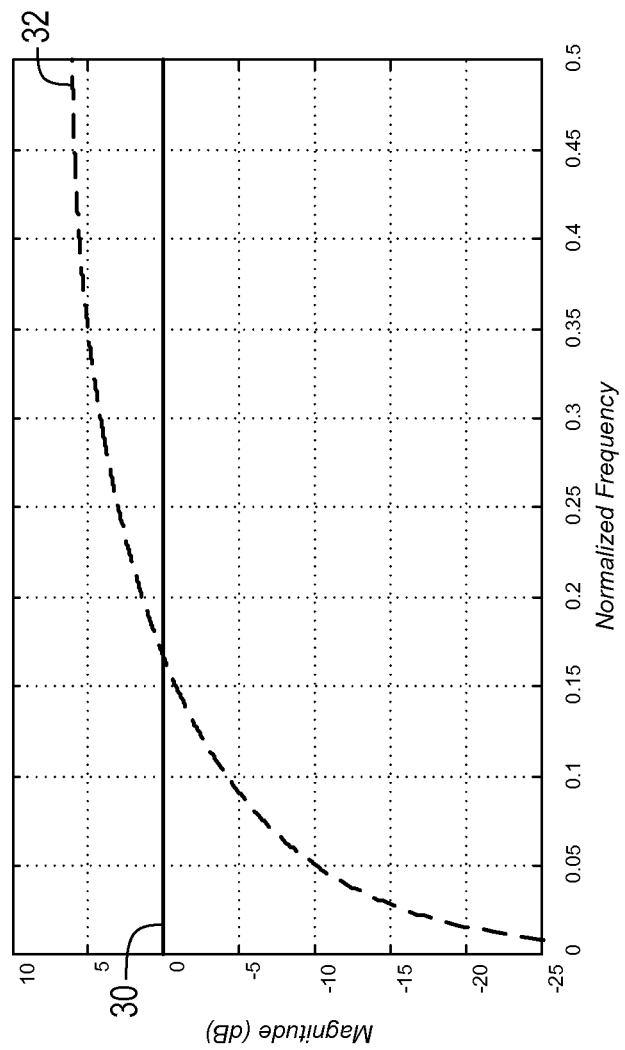
FIG. 2C illustrates the signal transfer function (STF) and quantization-noise transfer function (NTF) for a conventional, first-order, lowpass delta-sigma modulator.
Figure 2D:
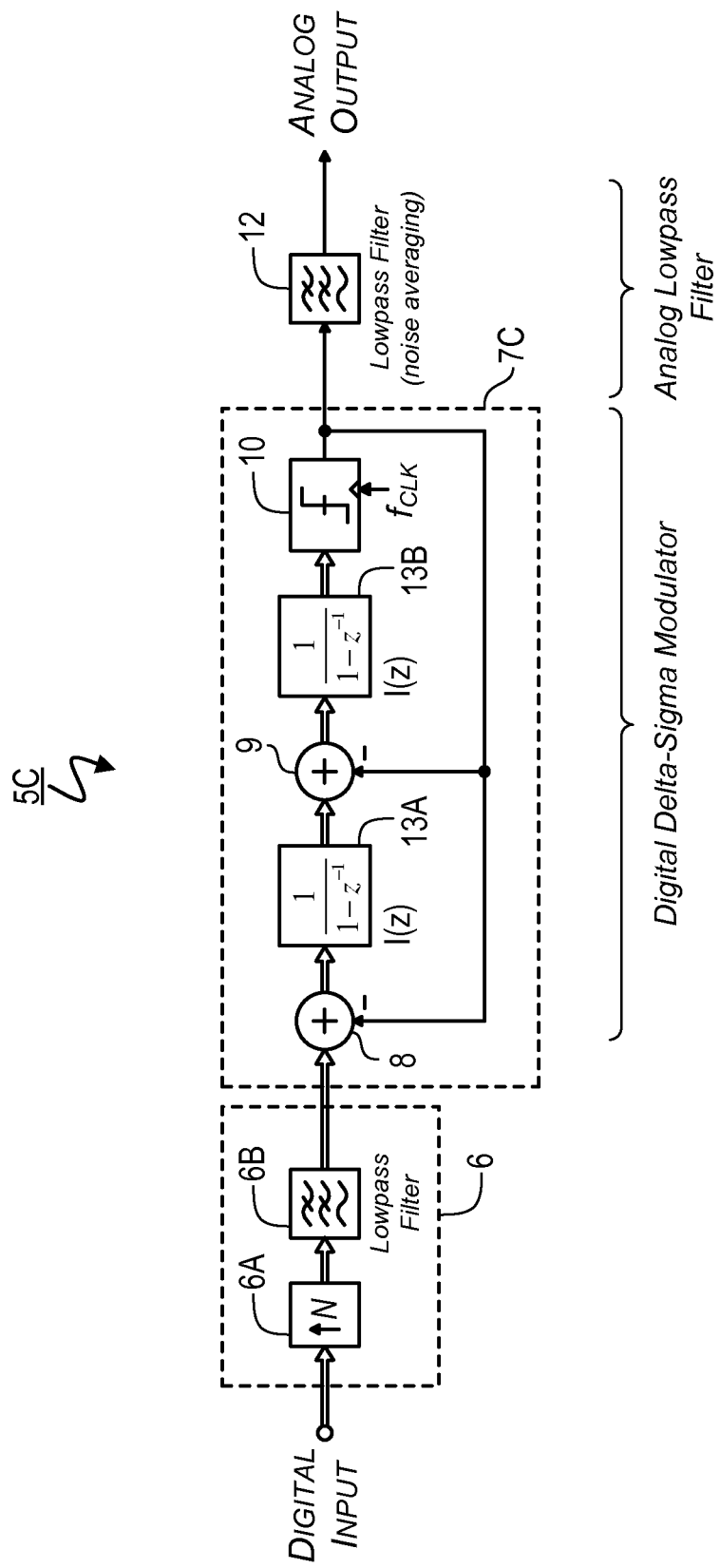
FIG. 2D is a block diagram of a conventional lowpass oversampling converter having an interpolative delta-sigma modulator with second-order response and two-level quantization.

In a manner somewhat comparable to conventional, oversampling digital-to-analog (D/A) converters, a preferred discrete-to-linear converter according to the present invention employs a form of "oversampling" (as that term is broadly used herein) in conjunction with noise shaping to mitigate the resolution-degrading effects of coarse quantization, rounding errors (i.e., distortion), and thermal noise. However, a converter according to the preferred embodiments of the present invention incorporates one or more of the following technological innovations to improve instantaneous bandwidth and resolution: 1) multiple oversampling converters (e.g., each processing a different frequency band) are operated in parallel to overcome the bandwidth limitations of conventional oversampling converters; 2) multirate (i.e., polyphase) delta-sigma modulators (preferably second-order or higher) are used in place of conventional delta-sigma modulators, or conventional time-interleaved $\Delta\Sigma$ modulators, so that the effective oversampling ratio of the modulator is not strictly dependent on the quantizer clock frequency $f_{CLK}$ or the switching speed of digital modulator circuits; 3) multi-bit quantizers are used in conjunction with multi-bit-to-variable-level signal converters, such as resistor ladder networks, or current source networks, to allow stable operation with noise-shaped responses that are higher than second-order; 4) non-linear bit-mapping is used to compensate for mismatches (rounding errors) in the multi-bit-to-variable-level signal converters (e.g., by replicating such mismatches so that resulting distortion is shaped into a frequently range where it will be filtered out by a corresponding bandpass filter); 5) multi-band (e.g., programmable NTF response) delta-sigma modulators are used in place of single-band (i.e., fixed NTF response) delta-sigma modulators to enable a single modulator circuit to be configured for operation on arbitrary frequency bands; and 6) a digital pre-distortion linearizer (DPL) is used so that an analog signal reconstruction filter bank, based on standard analog filter structures of low order, can effectively attenuate conversion noise and errors without introducing appreciable amplitude and phase distortion. Certain combinations of such techniques are sometimes is referred to herein as Multi-Channel Bandpass Oversampling (MBO). An MBO converter can in some respects be thought of as unique and novel methods of combining two distinct conventional techniques: 1) continuous-time, bandpass oversampling; and 2) multi-channel, frequency-decomposition. As discussed in more detail below, the use of such techniques often can overcome the problems of limited conversion resolution and precision at very high instantaneous bandwidths.

Simplified block diagrams of converters 110A&B and 200A-C according to certain preferred embodiments of the present invention are illustrated in FIGS. 6A-E, respectively. Converter circuits 110A&B preferably operate on the principle of oversampling with noise shaping, using feedback and coarse quantization to convert each sample of digital input signal 102 into a low-resolution, pseudorandom output sequence 135 (i.e., analog signal) with a mean analog value that is proportional to the binary value represented by digital input 102. According to the representative embodiment of converter 110A, and as discussed in greater detail below, input signal 102 is provided to noise-shaped quantizer 112A, in which it initially is converted from a serial data format at high speed to a parallel data format at lower speed using demultiplexer 111A. The parallel outputs 107 of demultiplexer 111A (i.e., signals $x_{m-1} \ldots x_0$) are coupled to the inputs of multiple $\Delta\Sigma$ modulators (e.g., modulators 105A-C) that operate in parallel to produce outputs 108 (i.e., signals $y_{m-1} \ldots y_0$). The outputs 108 of $\Delta\Sigma$ modulators 105A-C are fed back into the $\Delta\Sigma$ modulators and are also coupled to the inputs of multiplexer 111B. Multiplexer 111B converts the low-speed parallel outputs 108 of $\Delta\Sigma$ modulators 105A-C into a serial format at higher speed (i.e., output signal 109A). High-speed output 109A, of multiplexer 111B, is then transformed into analog signal 135 using multi-bit-to-variable-level converter 113A (e.g., a resistor ladder or current source network) and bandpass filter 115. In addition to smoothing the output of multi-bit-to-variable-level converter 113A, bandpass filter 115 attenuates the shaped quantization noise produced by $\Delta\Sigma$ modulation in modulators 105A-C. The parallel operation of $\Delta\Sigma$ modulators 105A-C is based on polyphase decomposition, except that unlike conventional approaches where only a portion of the modulator is decomposed (e.g., the integrator or loop filter portion), preferably the entire modulator circuit is decomposed into a polyphase circuit using the means described in greater detail in the Noise-Shaping and Quantizing Considerations section below. Generally speaking, the $\Delta\Sigma$ modulator outputs are fed back into the $\Delta\Sigma$ modulator inputs, with subsequent preprocessing that ensures the mean analog value of the high-rate, coarsely quantized outputs is proportional to the digital value of the input signal. Through such preprocessing, the residual quantization noise at the output of the modulator is shifted away (i.e., noise-shaped) from the frequency band occupied by digital input signal. As used herein, the term "coupled", or any other form of the word, is intended to mean either directly connected or connected through one or more other processing blocks, e.g., for the purpose of preprocessing.

In the preferred embodiments of the invention, the $\Delta\Sigma$ modulators (or other noise-shaped quantization circuits), produce NTFs with noise-shaped responses that are third-order or greater, and employ multi-bit quantizers (e.g., quantizer 114 shown in FIG. 6B) with a resolution of 3 bits or greater to ensure modulator stability. According to the representative embodiment of converter 110B, illustrated in FIG. 6B, the distortion (differential nonlinearity) resulting from the imperfect binary scaling (i.e., rounding errors as opposed to quantization noise) within multi-bit-to-variable-level converter 113A, preferably is mitigated using a nonlinear bit-mapping operation. More specifically, rather than being fed back directly into loop filter 150, the multi-bit output 109A of quantizer 114 is first processed by nonlinear bit-mapping component 161. Nonlinear bit-mapping component 161 preferably replicates the imperfect binary scaling (i.e., nonlinearities) at the output 109B of multi-bit-to-variable-level converter 113A (e.g., a resistor ladder or current source network), such that the input 109B to bandpass filter 115 is a more precise digital representation of the actual signal 109C that is fed back into the modulator loop filter 150. Feeding back a more precise digital representation (i.e., signal 109C) of the actual analog output signal (i.e., signal 109B) ensures that quantization errors in earlier samples are accurately taken into account in generating later quantized samples, and effectively subjects the nonlinearities of multi-bit-to-variable-level converter 113A to the noise-shaped response of $\Delta\Sigma$ modulator 112B.

To maximize discrete-to-linear (i.e., digital-to-analog) conversion bandwidth and resolution, multiple converters can be operated in parallel using a structure that is somewhat similar to conventional MB$\Delta\Sigma$ approaches for analog-to-digital conversion, but with key differences that will become clear below. Such a technique of operating multiple converters in parallel, with each converter processing a different portion of the input signal band, sometimes is referred to herein as Multi-Channel Bandpass Oversampling (MBO). Simplified block diagrams of MBO converters 200A-C according to the preferred embodiments of the present invention are illustrated in FIGS. 6C-E, respectively. Like conventional HFB and MB$\Delta\Sigma$ analog-to-digital converters, digital-to-analog converters 200A-C generally operate on the principle of frequency (spectral) decomposition, or frequency-interleaving, with the total bandwidth of a discrete-time input signal 102 being conceptually separated (i.e., subdivided) into multiple, smaller sub-bands that are independently transformed (in separate processing branches) into continuous-time signals that are then recombined in order to produce an output signal with the same bandwidth as the input signal. The word "conceptually" is used in the preceding sentence because in converter 200A, only after transformation into continuous-time signals and bandpass filtering (e.g., within filters 115 and 125) is the frequency-band separation performed. However, prior to that point, the processing is performed in anticipation of such ultimate frequency-band separation.

In a conventional frequency-interleaved converter, such as an HFB analog-to-digital converter, each sub-converter in the interleaved array operates at a submultiple of the overall sample rate $$f_{CLK} = \frac{1}{m} \cdot f_s,$$

where M is the number of processing branches), due to the reduced signal bandwidth in each of the subdivided bands. In contrast, converters 200A-C according to the present invention separately processes M different frequency bands, with each band preferably operating at the full overall sample rate $f_s$, rather than at a submultiple of the overall sample rate. This approach results in an effective oversampling ratio of M, sometimes referred to herein as an "interleaved oversampling ratio" or "interleave factor". It should be noted that the interleave factor M is different from the excess rate oversampling ratio N of a conventional oversampling converter, but generally has the same or similar effect on conversion noise and errors. It is noted that, except to the extent specifically indicated to the contrary, the term "oversampling" is used herein in a broad sense, referring to processing techniques in which a signal, or some portion of the signal, is digitally represented during some intermediate stage at a higher sample rate (but typically at a lower resolution) than the signal, or portion thereof, that ultimately is output. In the preferred embodiments of the present invention, the input digital signal 102 is processed in different channels or branches (e.g., branches 110 and 120), the purpose of each being to reproduce a different frequency band. It is noted that each such processing branch could be implemented, e.g., using either of the structures shown in FIG. 6A or FIG. 6B, and all references herein to branch 110 or other processing branches encompass either such embodiment, as well as any other embodiment contemplated herein. The outputs of all such channels or branches 110 and 120 are combined to provide the final output signal 135. As discussed in greater detail below, the processing rate within each channel or branch is higher than twice the bandwidth of the corresponding frequency band that ultimately is output from such channel or branch, resulting in the effective oversampling.

Referring to FIG. 6C, converter 200A processes a digital (discrete-time) input signal 102 as M different frequency bands, using a separate branch (e.g., branch 110 or 120) to process each such band, and then sums up all the branch outputs in an adder 131 in order to provide the output analog signal 135. In one embodiment of the invention, the M different frequency bands are orthogonal, or at least approximately orthogonal, with respect to the output data rate of the overall converter 200A. More specifically, the signal 102 (typically multi-bit) is input on a line 103 that could be implemented, e.g., as a physical port for accepting a multi-bit external signal or as internal wires, conductive traces or a similar conductive paths for receiving a multi-bit signal from another circuit within the same device.

In the present embodiment of converter 200A, the samples of the digital input signal 102 are first coupled, or distributed for processing, to M different branches (e.g., branches 110 and 120), each corresponding to a different frequency band and each preferably including: 1) a discrete-time noise-shaping/quantization circuit (e.g., noise-shaped quantizer 112 or 122); 2) a multi-bit-to-variable-level signal converter, such as a resistor ladder network, 113A; and 3) a bandpass (signal reconstruction) filter (e.g., filter 115 or 125). Lastly, an adder 131 sums the outputs of these M branches (more specifically, the outputs of the signal reconstruction filters) to produce the final output signal 135. As used herein, the term "distributes", or any other form of the word, is intended to mean provides, either through direct connection or through one or more other processing blocks, e.g., for the purpose of preprocessing. Rather than replicating the finite impulse response (FIR) of the relatively high-order, transversal window (e.g., Hann, Hamming, etc.) used in conventional MBΔΣ schemes, each of the bandpass filters (e.g., filter 115 and 125) at the output of each processing branch preferably is a relatively low-order filter (i.e., order of 7-10 or less) with a standard analog filter response, such as a Butterworth, Chebychev, Bessel or coupled-resonator response. Particularly at high frequency (e.g., gigahertz frequencies), these standard analog filter responses can be realized as passive structures without excessive circuit complexity. The center frequency, bandwidth, and/or order of the filters in each of the multiple processing branches is able to be independently adjusted, in the preferred embodiments, to minimize the amplitude and group delay distortion introduced by all the filter responses in combination (i.e., the amplitude and group delay distortion introduced by imperfect signal reconstruction). Preferably, the filter responses are adjusted to produce amplitude variation of less than ±1.5 dB and group delay variation of less than ±12.5 sample periods (i.e., $1/f_S$). Often, for ease of reference, the following discussion refers only to the components of branch 110, it being understood that similar processing preferably occurs in each of the other branches (e.g., branch 120).

Similar processing to that described above occurs within converters 200B&C of FIGS. 6D&E, respectively, except that in the present embodiments of converters 200B&C, the samples of the digital input signal 102 are first coupled (e.g., directly connected) to a digital pre-distortion linearizer (DPL) 104A or 104B. DPL 104A preferably does not divide the input signal into narrowband segments (i.e., frequency decomposition). However, one function of DPL 104A preferably is to convert the input signal 102 into a sufficiently long word length for further processing (e.g., up to 16 bits). The output of DPL 104A is distributed for processing to M different branches (e.g., branch 110 and 120), each corresponding to a different frequency band and each preferably including: 1) a discrete-time noise-shaping/quantization circuit (e.g., noise-shaped quantizer 112 or 122); 2) a multi-bit-to-variable-level signal converter, such as a resistor ladder network, 113A; and 3) a bandpass (signal reconstruction) filter (e.g., filter 115 or 125). Lastly, an adder 131 sums the outputs of these M branches (more specifically, the outputs of the signal reconstruction filters) to produce the final output signal 135. Compared to converter 200B, the multi-bit-to-variable level converter 113B in each of the processing branches of converter 200C incorporates a driver/power amplifier to boost the analog signal level prior to bandpass filtering. The primary purpose of DPL 104A is to compensate for amplitude and group delay (phase) distortion introduced by imperfections in the analog signal reconstruction filter bank (i.e., bandpass filters 115 and 125 and the bandpass filters in each of the other branches). In the embodiment shown in FIG. 6D, DPL 104A is a fixed-component (or fixed-parameter or non-variable) filter. However, in alternate embodiments, such as converter 200C of FIG. 6E, an adaptive filter DPL 104B instead is used to compensate for variations in the responses of the bandpass filters (e.g., filters 115 and 125) that occur, for example, with temperature changes. The adaptation of DPL 104B, which can be based on a conventional algorithm such as the constant modulus adaptation algorithm, is implemented by processing block 144 and preferably forces the data converter output signal 135 to have a constant envelope on average. More generally, as discussed in greater detail below, the adaptation algorithm implemented by processing block 144 preferably uses the amplitude and phase characteristics of data converter output signal 135, converted to a digital signal, to generate control signal 156 that adjusts the response of DPL 104B to account for variations in the bandpass filter response.

Although the representative embodiments described above and illustrated in FIGS. 6C-E incorporate a noise-shaping/quantization circuit (e.g., 112 and 122), alternate embodiments use a quantizer without noise shaping (i.e., quantization with zero-order noise shaping). That is, converters that do not employ noise shaping (i.e., that employ zero-order noise shaping) should be considered within the scope of the present invention. Also, in the representative embodiments shown in FIGS. 6C-E each discrete-time noise-shaping/quantization circuit 112 has a multi-bit output (e.g., 6 to 8 bits), but use of discrete-time noise-shaping/quantization circuits 112 instead having a single-bit output also is within the scope of the invention. In any event, each such noise-shaping/quantization circuit 112 preferably reduces the word length (and, correspondingly, the resolution) of its input signal so that a less-complex resistor ladder network 113A (or other structure for conversion to a single multi-level continuous-time signal) can be used.

The term "adder", as used herein, is intended to refer to one or more circuits for combining two or more signals together, e.g., through arithmetic addition and/or (by simply including an inverter) through subtraction. The term "additively combine" or any variation thereof, as used herein, is intended to mean arithmetic addition or subtraction, it being understood that addition and subtraction generally are interchangeable through the use of signal inversion. The term "bandpass", as used herein, refers to a filter or other circuit that provides higher gain for a desired band of frequencies as compared to other frequencies within the input signal, where the desired band could be centered at zero (in which case it could be referred to as a lowpass filter) or at any other frequency.

Furthermore, in the present embodiments, the typically multi-bit output of each noise-shaping/quantization circuit 112 is converted into a single variable-level signal that switches among a fixed number of discrete levels when the output of the corresponding noise-shaping/quantization circuit 112 changes, via a resistor ladder network 113A (i.e., R-2R). However, other multi-bit-to-variable-level signal converters 113 known in the art, such as binary-weighted or unary-weighted current sources, instead may be used. Also, as in converter 200C shown FIG. 6E, multi-bit-to-variable-level signal converters 113B that incorporate buffer amplifiers or power amplifiers to boost the signal level at the output of the converter should be considered within the scope of the invention. In FIG. 6E, an analog amplifier is shown coupled to the output of the resistor ladder network; alternatively, multiple digital amplifiers could be coupled to its input. A multi-bit-to-variable-level signal converter 113, as referred to herein, could be implemented as converter 113A, 113B, or any of the other variations discussed herein. Finally, the M channels preferably are combined in adder 131 using summing resistors, but in alternate embodiments any of various other (e.g., other conventional) analog adders 131, including passive and/or active signal combining structures, instead may be used.

In accordance with one aspect of certain preferred embodiments, the present invention overcomes the problems of limited conversion resolution and precision at high instantaneous bandwidths via a novel method of combining two established techniques—bandpass oversampling and a variant of frequency interleaving. By combining multiple bandpass noise-shaped channels in parallel, such that each noise-shaping circuit minimizes conversion noise in a particular region of the converter's Nyquist bandwidth, the present invention can provide a frequency interleaved converter simultaneously having high resolution and high instantaneous bandwidth.

Noise-Shaping and Quantizing Considerations

Figure 3A:
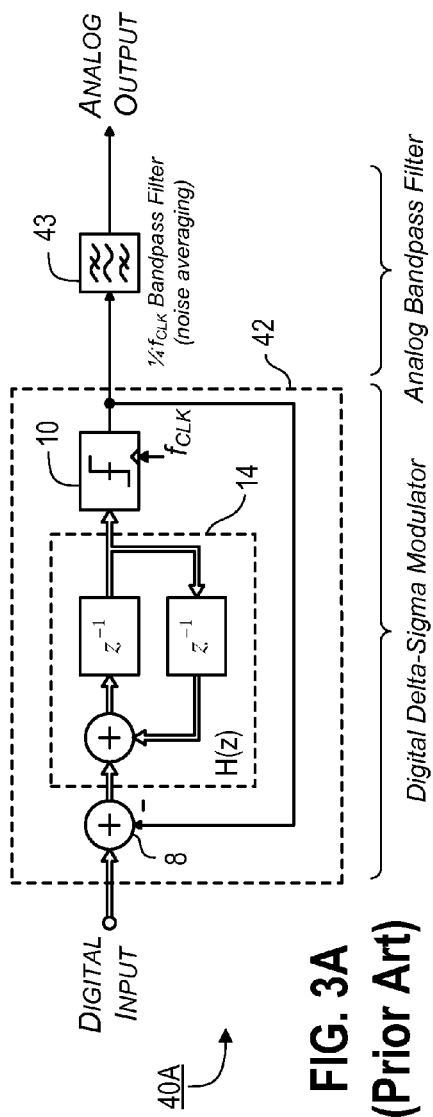
FIG. 3A is a block diagram of a single-band bandpass oversampling converter having a discrete-time, interpolative delta-sigma modulator with second-order response and two-level quantization.
Figure 3B:
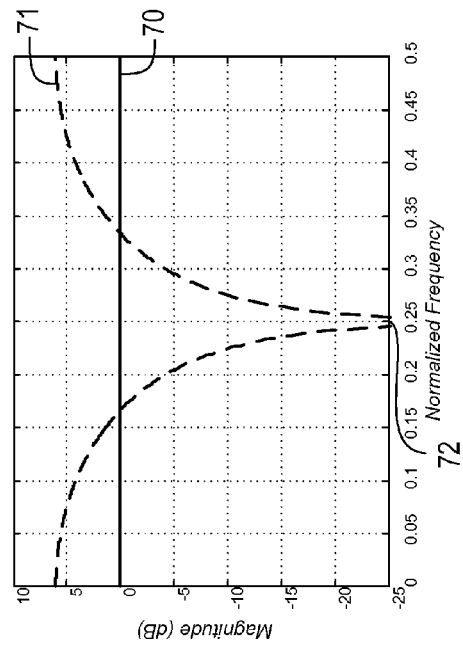
FIG. 3B illustrates the signal transfer function (STF) and quantization-noise transfer function (NTF) for the delta-sigma modulator of the single-band bandpass converter shown in FIG. 3A.
Figure 4A:
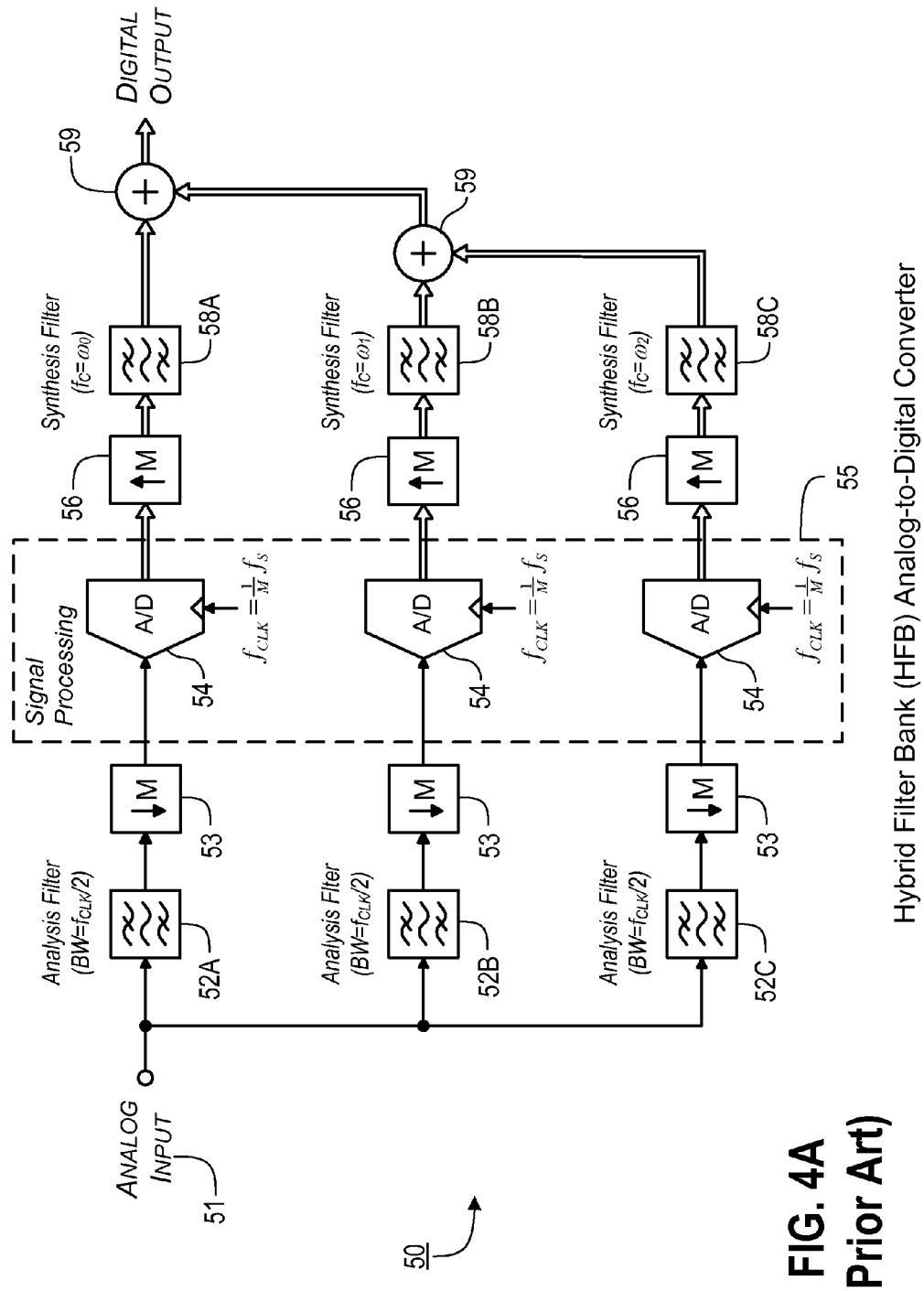
FIG. 4A is a block diagram of a conventional frequency-interleaved converter for transforming an analog signal into a digital signal, that is sometimes referred to as a hybrid filter bank (HFB) converter.
Figure 4B:
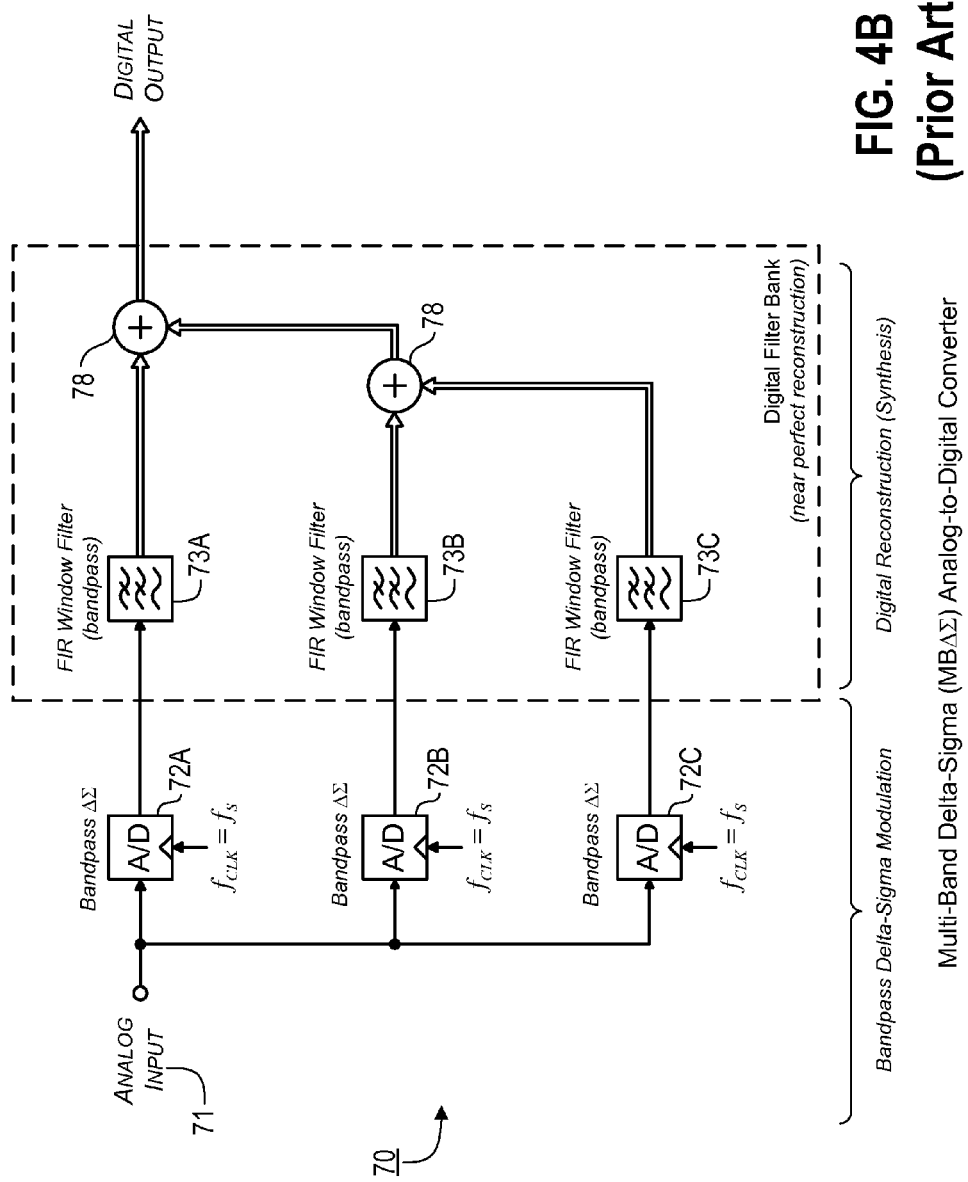
FIG. 4B is a block diagram of a conventional frequency-interleaved converter for transforming an analog signal into a digital signal, that is sometimes referred to as a multi-band delta-sigma (MBΔΣ) converter.
Figure 7A:
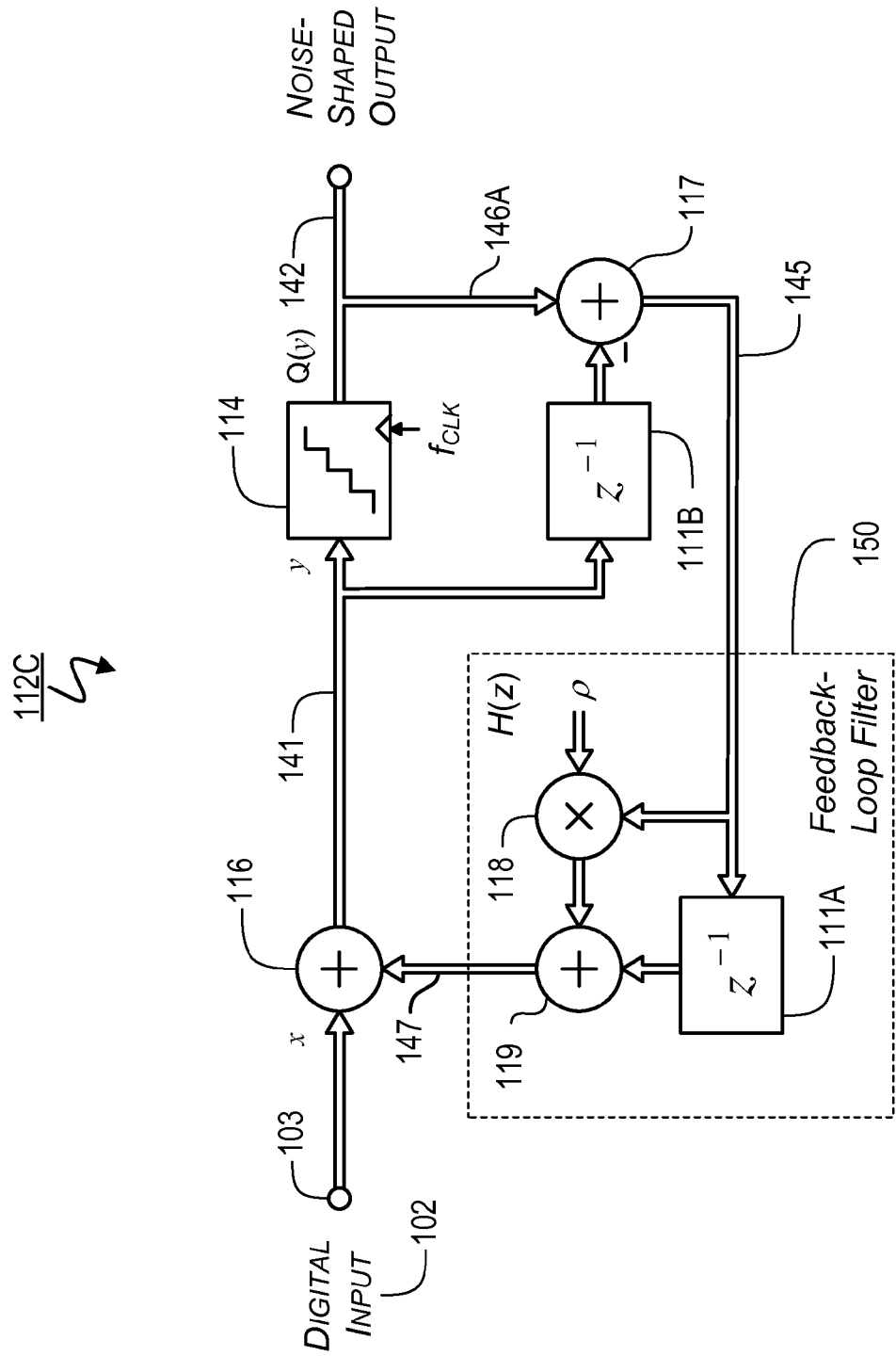
FIG. 7A is a block diagram illustrating a discrete-time noise-shaping quantization circuit that employs a delta-sigma (ΔΣ) modulator, with a programmable feedback-loop filter to produce conversion noise response minima at arbitrary frequencies, according to a representative embodiment of the present invention.

In the embodiments described above, each of the noise-shaping/quantization circuits (e.g., 112 and 122) preferably is constructed differently from those shown in FIGS. 2, 3, and 5. In the preferred embodiments, a modified error-feedback structure, referred to herein as a multirate, delta-sigma ($\mu\Delta\Sigma$) modulator, is used for the quantization noise-shaping operation of the circuit 112 or 122 within each processing branch 110 or 120, respectively, because such a circuit has been found to achieve the best combination of effectiveness, ease of construction and ease of configuration. However, it should be noted that it is possible to use other kinds of noise-shaping circuits, including conventional delta-sigma ($\Delta\Sigma$) modulators, in alternate embodiments of the invention. In any event, the primary considerations for the noise-shaping circuits to be used preferably derive from the desire for stable and accurate operation at very high sample rates. Therefore, each noise-shaping circuit according to the preferred embodiments has at least the following three properties: 1) the primary performance impairments of the noise-shaping circuit, such as those related to quantization/rounding errors, sampling uncertainty/jitter, and thermal noise are subject to a noise-shaped response and/or to bandlimiting; 2) the noise-shaping circuit produces stable responses with noise-shaped orders of 4 or greater; 3) the effective oversampling ratio of the noise-shaping circuit is not limited by race conditions or by circuit design to the maximum switching frequency of the constituent components; and 4) the noise-shaping circuit has an all-pass (or at least approximately all-pass) signal transfer function (STF) and a bandstop noise transfer function (NTF), such that the null in the NTF is determined by the value of a programmable (or otherwise selectable or settable) parameter (e.g., a noise shaper feedback-loop filter coefficient). As discussed in greater detail below, the noise that is subject to shaping preferably includes noise introduced by any quantization circuit that is used (e.g., quantization circuit 114 that is internal to circuit 112C and is shown in FIG. 7A), but also (or instead) can include noise introduced by other components, such as multi-bit-to-variable-level signal converter 113 (e.g., converter 113A or 113B). Achieving these properties generally precludes the use of conventional delta-sigma modulators, or conventional time-interleaved delta-sigma modulators for the noise-shaping function.

Figure 7B:
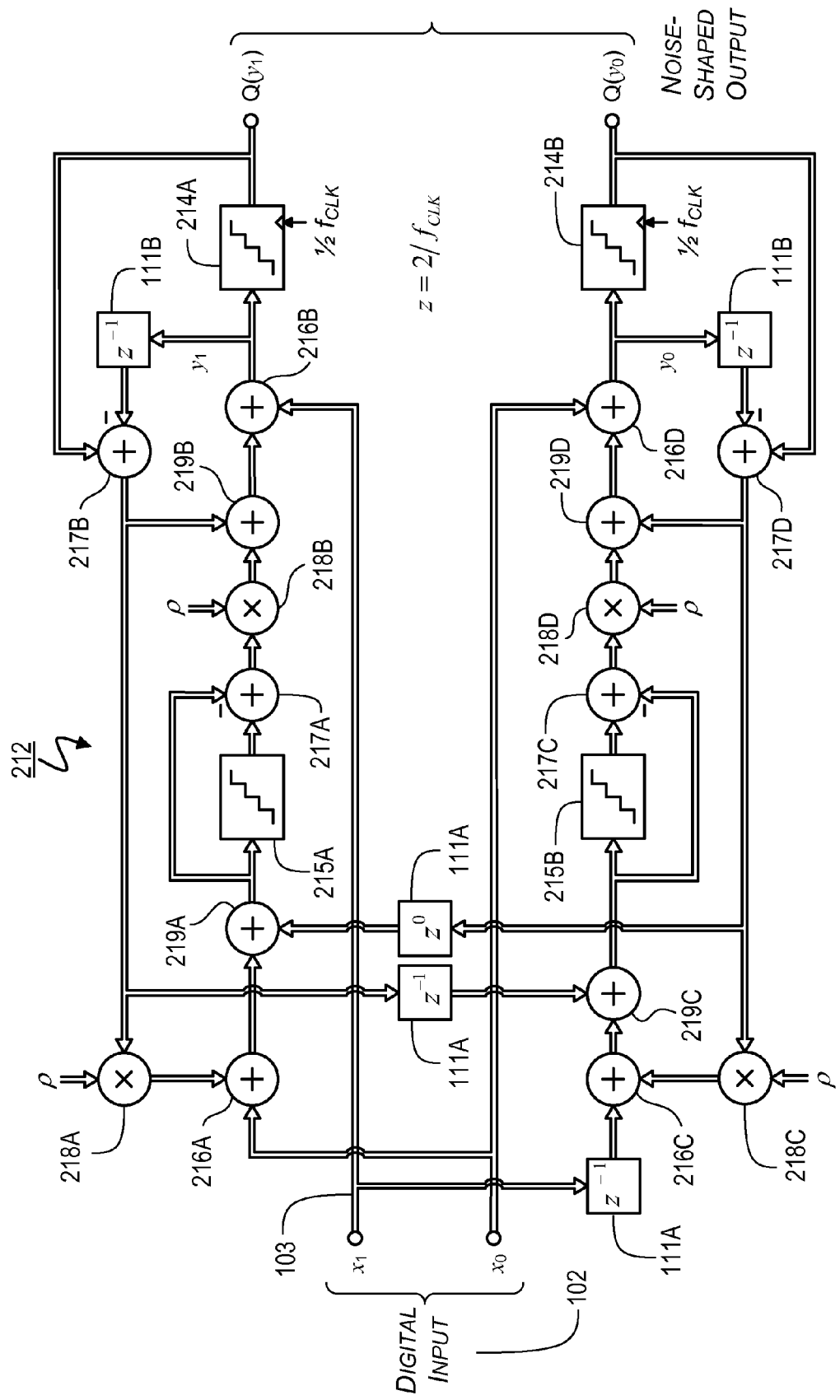
FIG. 7B is a block diagram illustrating a multirate delta-sigma (μΔΣ) modulator that has a polyphase decomposition factor m=2, according to a representative embodiment of the present invention.
Figure 7C:
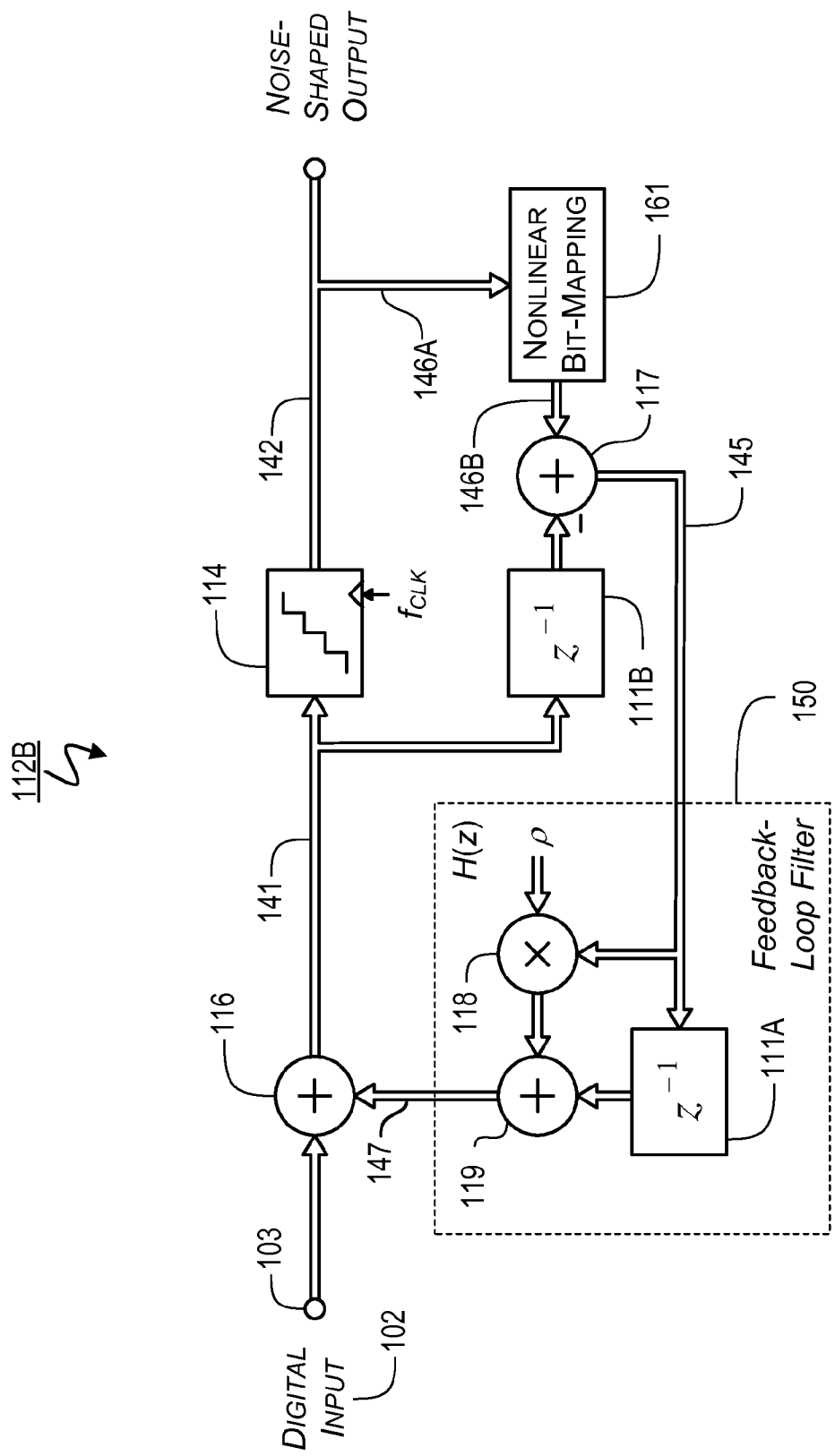
FIG. 7C is a block diagram illustrating a discrete-time noise-shaping quantization circuit that employs a delta-sigma (ΔΣ) modulator, with a programmable feedback-loop filter and a nonlinear bit-mapping function, according to a representative embodiment of the present invention.

A simplified block diagram of an exemplary noise-shaping/quantization circuit 112C, employing a programmable feedback-loop filter 150 in combination with a multi-bit quantization circuit 114, is shown in FIG. 7A for a polyphase decomposition factor of m=1; and a simplified block diagram of an exemplary $\mu\Delta\Sigma$ modulator 212 is shown in FIG. 7B for a polyphase decomposition factor of m=2. Circuit 112B of FIG. 7C is an alternative representative embodiment that incorporates nonlinear bit-mapping component 161 to compensate for imperfect binary scaling in the multi-bit-to-variable-level conversion of the output of quantizer 114. Generally speaking, the embodiments described herein refer to a combined noise-shaping/quantization circuit 112C. The reason for this usage is that, particularly when m≥2, it can be difficult to neatly separate the quantization components from the noise-shaping components. However, the functionalities are in fact distinct and, particularly when m=1, it sometimes is desirable to conceptualize such components separately, e.g., as shown in FIG. 7A.

Whereas a conventional delta-sigma ($\Delta\Sigma$) modulator has an oversampling ratio $N=f_{CLK}/f_B/2$, either due to circuit construction or race conditions (i.e., outputs that depend on previous outputs that are delayed by a single, effective sample-rate delay of $1/f_S$), the multirate delta-sigma ($\mu\Delta\Sigma$) modulators illustrated in FIGS. 7A&B have an excess-rate oversampling ratio $N'=m\cdot f_S/f_B/2$, where m is the polyphase decomposition factor of the $\mu\Delta\Sigma$ modulator. The excess-rate oversampling ratio of $\mu\Delta\Sigma$ modulator is m times greater than that of conventional modulators because the entire $\mu\Delta\Sigma$ modulator, including its difference and quantization functions, is decomposed into parallel polyphase circuits. In general, the circuit complexity of the $\mu\Delta\Sigma$ modulator (e.g., the number of quantizers 114) increases as $m^2$. It should be noted that although the $\mu\Delta\Sigma$ modulator is a parallel processing structure, a μΔΣ modulator is different from a conventional MASH (i.e., Multi-stAge SHaping) modulator, which conventionally is sometimes referred to as a "parallel" modulator. In a MASH structure, conventional ΔΣ modulators are grouped in a parallel arrangement to increase the order P of the NTF noise-shaped response. In contrast, the parallel μΔΣ modulator architecture increases the effective oversampling ratio N', regardless of the noise-shaped response order P.

In a μΔΣ modulator, as most clearly illustrated in FIG. 7A, a signal 141 (that is output from adder 116 and input into quantizer 114 is delayed 111B (e.g., by one $f_{CLK}$ cycle) and is subtracted from signal 146A in subtractor 117. The resulting combined signal 145 is filtered 150, using a filter transfer function H(z), thereby resulting in signal 147. Finally, signal 147 is combined with the input signal 102 in adder 116. Similar processing is illustrated in FIG. 7B, although in that embodiment the components that constitute the μΔΣ modulator have been replicated in order to realize a polyphase decomposition factor of m=2. One of the key differences between a conventional time-interleaved ΔΣ modulator and a μΔΣ modulator is the number of difference functions (i.e., difference operations 216A-D of circuit 212 in FIG. 7B) and the number of quantization (rounding) operations (i.e., clocked quantization operations 214A&B and transparent rounding operations 215A&B of modulator 212 in FIG. 7B). In a conventional time-interleaved ΔΣ modulator, the difference functions (e.g., difference operators 8A&B in FIGS. 5A&B) and quantization operations (e.g., quantizers 10A&B in FIGS. 5A&B) are simply replicated and distributed among the m parallel processing paths. As a result, a conventional time-interleaved ΔΣ modulator with a polyphase decomposition factor of m=2, is comprised of m=2 difference functions (i.e., difference operators 8A&B in FIGS. 5A&B) and m=2 quantization functions (i.e., quantization operations 10A&B in FIGS. 5A&B). In contrast, the difference (i.e., difference operator 116 in FIG. 7A) and quantization (i.e., clocked quantizer 114 in FIG. 7A) functions of the μΔΣ modulator are subjected to polyphase decomposition, resulting in $m^2=4$ difference functions (i.e., difference operations 216A-D) and $m^2=4$ quantization functions (i.e., clocked quantizers 214A&B and transparent rounding operations 215A&B) for an μΔΣ modulator with a polyphase decomposition factor of m=2, such as μΔΣ modulator 212 in FIG. 7B. Therefore, compared to a conventional ΔΣ modulator and a conventional time-interleaved ΔΣ modulator, the μΔΣ modulator 212 in FIG. 7B avoids race conditions and can operate at one-half the $f_{CLK}$ rate for the same oversampling ratio N, or can achieve twice the oversampling ratio (i.e., 2·N) for the same $f_{CLK}$ rate.

Generally speaking, in reference to converter 112C of FIG. 7A, the addition of the correction signal 147 to the input signal 102 ensures that future quantizer output samples 142 on average will compensate for earlier quantization errors, while the preprocessing of the quantization error prior to such addition ensures that the quantization noise introduced by quantizer 114 will be shifted away from the frequency band of the input signal that is being processed (i.e., the frequency band remaining after processing by the reconstruction filter) by the current processing branch (e.g., branch 110 or 120). Depending upon the value of the feedback-loop filter parameter, ρ, filter 150 can cause conversion noise to be shifted away from a selected (e.g., predetermined) frequency within the overall converter Nyquist bandwidth, equal to ½·m·$f_{CLK}$.

The μΔΣ modulator feedback-loop filter 150 introduces frequency-dependent delaying and frequency-dependent amplitude variation to the feedback signal 145, such that the μΔΣ modulator noise transfer function (NTF) has a bandstop response with a null at a predetermined frequency (i.e., a frequency determined by feedback-loop filter parameter ρ). In the present embodiment, the feedback-loop filter 150 uses a multiplier 118, an adder 119 and a delay register 111A to produce a frequency response with the correct amount of frequency-dependent delaying and frequency-dependent amplitude variation. As will be readily appreciated, multiplier 118 can be replaced by a combination of shift and add components to potentially reduce feedback-loop filter complexity, especially for the case where the feedback-loop filter parameter ρ can be represented by a small number of digital bits (i.e., ρ's binary representation contains few terms). The term "adder", as used herein, is intended to refer to one or more circuits for combining two or more signals together, e.g., through arithmetic addition and/or (by simply including an inverter) through subtraction. The term "additively combine" or any variation thereof, as used herein, is intended to mean arithmetic addition or subtraction, it being understood that addition and subtraction generally are interchangeable through the use of signal inversion.

As illustrated in FIGS. 7A-C, the μΔΣ modulator preferably is implemented in conjunction with a multi-bit quantization circuit 114 (or quantization/rounding circuits 214A&B and 215A&B in FIG. 7B), which (in reference to FIG. 7A) reduces the rounding precision (i.e., granularity or bit-width) of the quantizer input 141 relative to the quantizer output 142. A multi-bit quantizer 114, and more preferably a multi-bit quantizer 114 having a granularity of 4 or more bits, has been found to ensure stable operation for μΔΣ modulators with shaping response orders (i.e., shaping factors) of P>2. For shaping factors of P≤2, modulator stability is not contingent on the use of multi-bit quantizers, and therefore in such embodiments, the multi-bit quantizers shown in FIGS. 7A&B preferably are replaced by single-bit (i.e., two-level) quantizers to reduce circuit complexity, especially for polyphase decomposition factors of m>1.

Figure 7D:
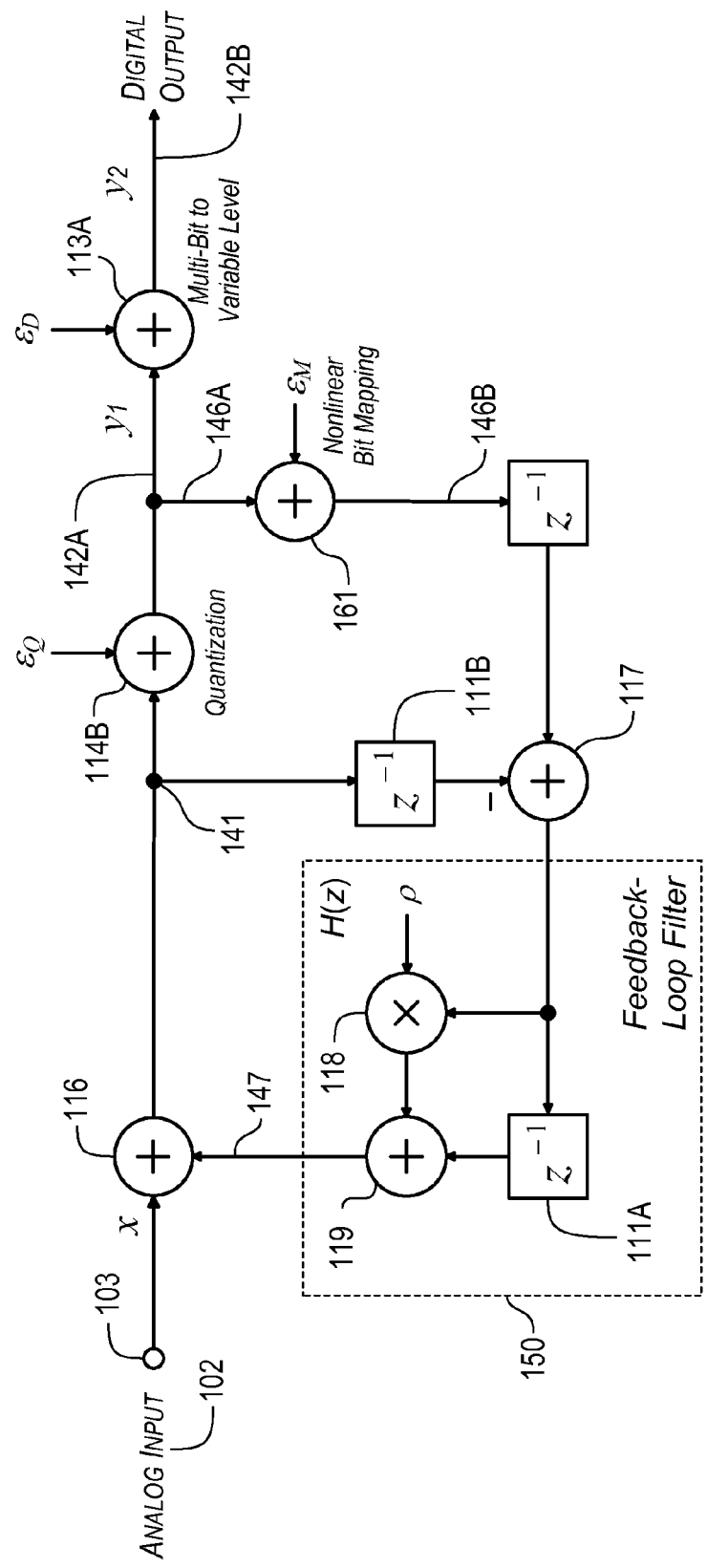
FIG. 7D is a block diagram illustrating a linearized model of a discrete-time noise-shaping quantization circuit that incorporates errors due to quantization, nonlinear bit mapping, and multi-bit-to-variable-level conversion, according to a representative embodiment of the present invention.

Like conventional ΔΣ modulators, the μΔΣ modulator processes the input signal 102 with one transfer function (STF) and the conversion noise (e.g., from quantizer 114 in reference to FIG. 7A) with a different transfer function (NTF). Referring to the block diagram shown in FIG. 7D, the linearized signal transfer function (STF) between input line 103 and output 142B ($y_2$) of quantization circuit 114 is STF(z)= $z^{-1}$. The linearized quantization-noise transfer function (NTF) between the quantization noise ($\epsilon_Q$) entry point and the output 142B ($y_2$) of the quantization circuit 114, is $$NTF(z)=1+H(z).$$

Therefore, the signal response is all-pass and the noise response depends on the μΔΣ feedback-loop filter function, H(z). To produce quantization noise nulls at predetermined frequencies across the Nyquist bandwidth of the converter, the feedback-loop filter 150 preferably has a second-order transfer function of the form $$NTF(z) = 1 + H(z)$$
$$= 1 + \rho \cdot z^{-1} + z^{-2}$$

where ρ is a programmable value. Then, the noise transfer function is given by $$NTF(z)=1+H(z)$$
$$=1+\rho \cdot z^{-1}+z^{-2}$$

and the location of the noise minimum is determined by the coefficient ρ. To produce noise minima across the entire converter band, it is preferable for ρ to be capable of varying over a range of −2 to +2. Specifically, a ρ equal to $$\rho = -2 \cdot \cos(2\pi f/(m \cdot f_{CLK})),$$

produces a noise minimum, or null, at a frequency equal to f (i.e., the bandpass frequency of a given processing branch), where $f_{CLK}$ is the quantizer clock frequency. In the absence of quantization noise (i.e., $\epsilon_Q = 0$) and input signal (i.e., x=0), the output 142A ($y_1$) of the sampling/quantization circuit is $$y_1 = \epsilon_{M'}(\rho \cdot z^{-1} + z^{-2}),$$

and the output 142B ($y_2$) of the nonlinear bit-mapping circuit is $$y_2 = y_1 + \epsilon_D = \epsilon_{M'}(\rho \cdot z^{-1} + z^{-2}) + \epsilon_D,$$

where $\epsilon_M$ is the intentional nonlinear distortion introduced by nonlinear bit-mapping component 161 and $\epsilon_D$ is the unintentional nonlinear distortion introduced by multi-bit-to-variable-level converter 113A. When the nonlinear distortion introduced by nonlinear bit-mapping component 161 is equal to the nonlinear distortion introduced by multi-bit-to-variable-level converter 113A, such that $\epsilon_{M'} = \epsilon_D$, then the overall distortion transfer (DTF=$y_2/\epsilon$) is $$DTF(z) = 1 + \rho \cdot z^{-1} + z^{-2} = NTF(z),$$

and therefore, distortion ($\epsilon_D$) is subjected to the same noise-shaped response as quantization noise ($\epsilon_Q$).

The effective oversampling ratio of an MBO converter, according to the preferred embodiments of the invention, is equal to the product of the interleaved oversampling ratio M, equal to the number of parallel processing branches, and the excess-rate oversampling ratio N', equal to $m \cdot f_{CLK}/f_B/2$. Therefore, the resolution performance of an MBO converter can be increased independently of N' by increasing the number M of parallel processing branches 110 (i.e., increasing the number of noise-shaping/quantization circuits 112). However, processing branches are added at the expense of increasing the number of analog bandpass filters (e.g., filters 115 and 125) in the output signal reconstruction filter bank, while simultaneously increasing the minimum quality factor (Q=$f_C$/BW$_{3\ dB}$) of each such filter 115. Problems with controlling filter-bank aliasing (or other distortions), coupled with the design complexities associated with building multiple high-Q analog filters, generally makes increasing the interleave factor, M, a less desirable alternative than increasing the excess-rate oversampling ratio, N', for increasing the effective oversampling ratio of the converter. Therefore, the MBO converter preferably has an excess-rate oversampling ratio N'>1.

Conventionally, increasing the oversampling ratio N is realized by increasing the $f_{CLK}$ rate of the noise-shaping modulator. As mentioned previously, however, the effective excess-rate oversampling ratio N' of a μΔΣ modulator is not limited by $f_{CLK}$ due to the multirate (i.e., polyphase) operation of the entire μΔΣ modulator circuit. Polyphase decomposition of the entire μΔΣ modulator into parallel paths eliminates race conditions and allows the effective sampling rate ($f_S$) of the converter to increase without increasing the $f_{CLK}$ rate of the modulator. For illustrative purposes, consider a noise-shaping/quantization circuit 112C as illustrated in FIG. 7A with $$H(z) = \rho + z^{-1} \text{ and } NTF(z) = 1 + \rho \cdot z^{-1} + z^{-2}.$$

The quantized output 142 of the noise-shaping/quantization circuit 112C, Q($y_n$), can be represented by the difference equation $$Q(y_n) = Q[x_n + \rho \cdot Q(y_{n-1}) - \rho \cdot y_{n-1} + Q(y_{n-2}) - y_{n-2}],$$

and therefore, the difference equations for the first two output samples (i.e., n=0, 1) are $$Q(y_0) = Q[x_0 + \rho \cdot Q(y_{-1}) - \rho \cdot y_{-1} + Q(y_{-2}) - y_{-2}] \text{ and}$$

$$Q(y_1) = Q[x_1 + \rho \cdot Q(y_0) - \rho \cdot y_0 + Q(y_{-1}) - y_{-1}].$$

Substitution of $y_0$ into $y_1$ results in $$Q(y_1) = Q[x_1 + \rho \cdot Q(x_0 + \rho \cdot Q(y_{-1}) - \rho \cdot y_{-1} + Q(y_{-2}) - y_{-2})$$

$$- \rho \cdot Q(x_0 + \rho \cdot Q(y_{-1}) - \rho \cdot y_{-1} + Q(y_{-2}) - y_{-2}) + Q(y_{-1}) - y_{-1}].$$

which can be generalized to $$Q(y_n) = Q[x_n + \rho \cdot Q(n_{n-1}) + \rho \cdot Q(y_{n-2}) - \rho \cdot y_{n-2} + Q(y_{n-3}) - y_{n-3})$$

$$- \rho \cdot (x_{n-1} + \rho \cdot Q(y_{n-2}) - \rho \cdot y_{n-2} + Q(y_{n-3}) - y_{n-3}) + Q(y_{n-2}) - y_{n-2}].$$

The above equation differs from the equation in the '079 application in that the last two terms (i.e., Q($y_{n-2}$) and $y_{n-2}$), which appear in the preceding equations for $y_0$ into $y_1$, were inadvertently excluded from the final result (i.e., an error was made substituting $y_0$ into $y_1$). Also, the block diagram of FIG. 7B has been updated from the '079 application to reflect these corrections. This substitution error, however, does not alter the discovery that at the acceptable expense of additional rounding operations and equation terms, the output Q($y_n$) can be calculated using only inputs $x_{n-i}$ and outputs (i.e., outputs $y_{n-2}$ and $y_{n-3}$) that have been delayed by two or more full-rate (1/$f_S$) delays for a polyphase decomposition factor of m=2. That is, the present output $y_n$ of each parallel path is solely dependent upon the signal $x_n$, that is input to the overall noise-shaping/quantization circuit 112, signals generated within such path itself and/or prior outputs (i.e., $y_{n-i}$ such that i≥m) from various other parallel paths, but is independent of the present outputs (i.e., $y_{n-i}$ such that i<m) from any other parallel path. In the above example, parallel processing enables the μΔΣ modulator to run at one-half the $f_{CLK}$ rate for the same oversampling ratio N, or at twice the oversampling ratio for the same $f_{CLK}$ rate. This novel polyphase decomposition approach, described above for a polyphase decomposition factor of m=2, can be extended to higher polyphase decomposition factors and to arbitrary feedback-loop filter functions (H(z)). This is an important consideration, particularly for high-sample-rate converters. FIG. 7B illustrates a μΔΣ modulator having a polyphase decomposition factor of m=2 per the above example. As indicated above, when m≥2 each of the parallel paths generates a different subsampling phase of the complete signal that is output by the discrete-time noise-shaping/quantization circuit 112 of the branch 110. As used herein, a "subsampling phase" refers to one of the k possible phases or time offsets at which subsampling by a factor k of can occur.

Each of the μΔΣ circuits shown in FIGS. 7A-C has a second-order noise-shaped response. However, higher-order noise-shaped responses result in improved converter resolution performance, because higher-order noise-shaped responses shift more noise away from the desired frequency band of the input signal (i.e., the frequency band for the current processing branch 110 or 120 that is selected by the corresponding bandpass filter 115 or 125, respectively) than lower-order noise-shaped responses, thereby increasing the amount of noise attenuated by the branch's bandpass (signal reconstruction) filter. For example, for a sixth-order noise-shaped response, the feedback-loop filter H(z) shown in FIG. 7A has the general transfer function $$H(z) = NTF(z) - 1$$
$$= (1 - \rho_0 z^{-1} + z^{-2}) \cdot (1 - \rho_1 z^{-2}) \cdot (1 - \rho_2 z^{-1} + z^{-2}) - 1$$
$$= -(\rho_0 + \rho_1 + \rho_2) \cdot z^{-1} + (3 + \rho_0\rho_1 + \rho_0\rho_2 + \rho_1\rho_2) \cdot z^{-2} -$$
$$(2\rho_0 + 2\rho_1 + 2\rho_2 + \rho_0\rho_1\rho_2) \cdot z^{-3} + (3 + \rho_0\rho_1 + \rho_0\rho_2 +$$
$$\rho_1\rho_2) \cdot z^{-4} - (\rho_0 + \rho_1 + \rho_2) \cdot z^{-5} + z^{-6}$$

Conventionally, the noise-shaping circuit coefficients (or parameters) $\rho_0$, $\rho_1$, and $\rho_2$ are equal or, equivalently, the zeros of the noise transfer function occur at a common frequency. In the case of roots having equal magnitudes, the resulting noise transfer function simplifies to $$H_1(z) = H_{NOISE}(z) - 1$$
$$= (1 - \rho \cdot z^{-1} + z^{-2})^3 - 1$$
$$= -3 \cdot \rho \cdot z^{-1} + 6 \cdot \rho^2 \cdot z^{-2} - 7 \cdot \rho^3 \cdot z^{-3} +$$
$$6 \cdot \rho^2 \cdot z^{-4} - 3 \cdot \rho \cdot z^{-5} + z^{-6}.$$

However, this simplified condition is not necessarily optimal with respect to minimizing output noise, particularly for small interleave factors (M) where there is a correspondingly small number of analog output filters. A high-order modulator having unequal NTF zeros for the purpose of minimizing noise, is conventionally referred to as having a "zero-optimized" NTF. See K. Chao, S. Nadeem, W. Lee, and C. Sodini, "A Higher Order Topology for Interpolative Modulators for Oversampling A/D Converters," IEEE Transactions on Circuits and Systems, 1990. A zero-optimized NTF enables the bandwidth of the NTF bandstop response to be increased at the expense of reducing the depth of the noise null. For small interleave factors M, this difference in noise response can result in improved converter resolution.

For the $\mu\Delta\Sigma$ modulator, however, a NTF with unequal zeros can reduce the circuit complexity associated with the multirate architecture. When feedback structures, such as $\mu\Delta\Sigma$ modulators, are implemented using high-frequency, parallel-processing methods, such as polyphase decomposition, coefficient dynamic range expansion can reduce digital precision and cause the NTF response to deviate from the preferred NTF response. This occurs because in polyphase feedback structures, input and output values are multiplied by the same coefficient (i.e., $\rho$) multiple times, causing needed arithmetic precision to grow geometrically. A large number of binary terms (i.e., large bit-widths) are needed to represent values with high precision. This resulting increase in complexity can be offset by using an NTF with unequal zeros produced by rational coefficients that can be represented by simple fractions, preferably binary fractions (i.e., fractions with denominators that are powers of two), to approximate an NTF with equal zeros from irrational coefficients, or coefficients that cannot be represented by simple fractions. Use of coefficients that can be represented by simple binary fractions (e.g., values represented by no more than 3-8 bits) allows $\mu\Delta\Sigma$ feedback-loop filter multipliers to be replaced by less complex circuits consisting of adders and/or bit-shifting operations. This complexity-reduction technique is a novel aspect of the present invention that is sometimes referred to herein as "bit-optimization". Therefore, in the preferred embodiments of the invention, $\mu\Delta\Sigma$ modulators with a bit-optimized NTF are employed. It should be noted that novel zero-optimization for the purpose of reducing complexity (i.e., bit-optimization) is different from conventional zero-optimization for the purpose of noise reduction. However, sometimes bit-optimization can result in NTFs having beneficial responses compared to NTFs with equal zeros.

Figure 8:
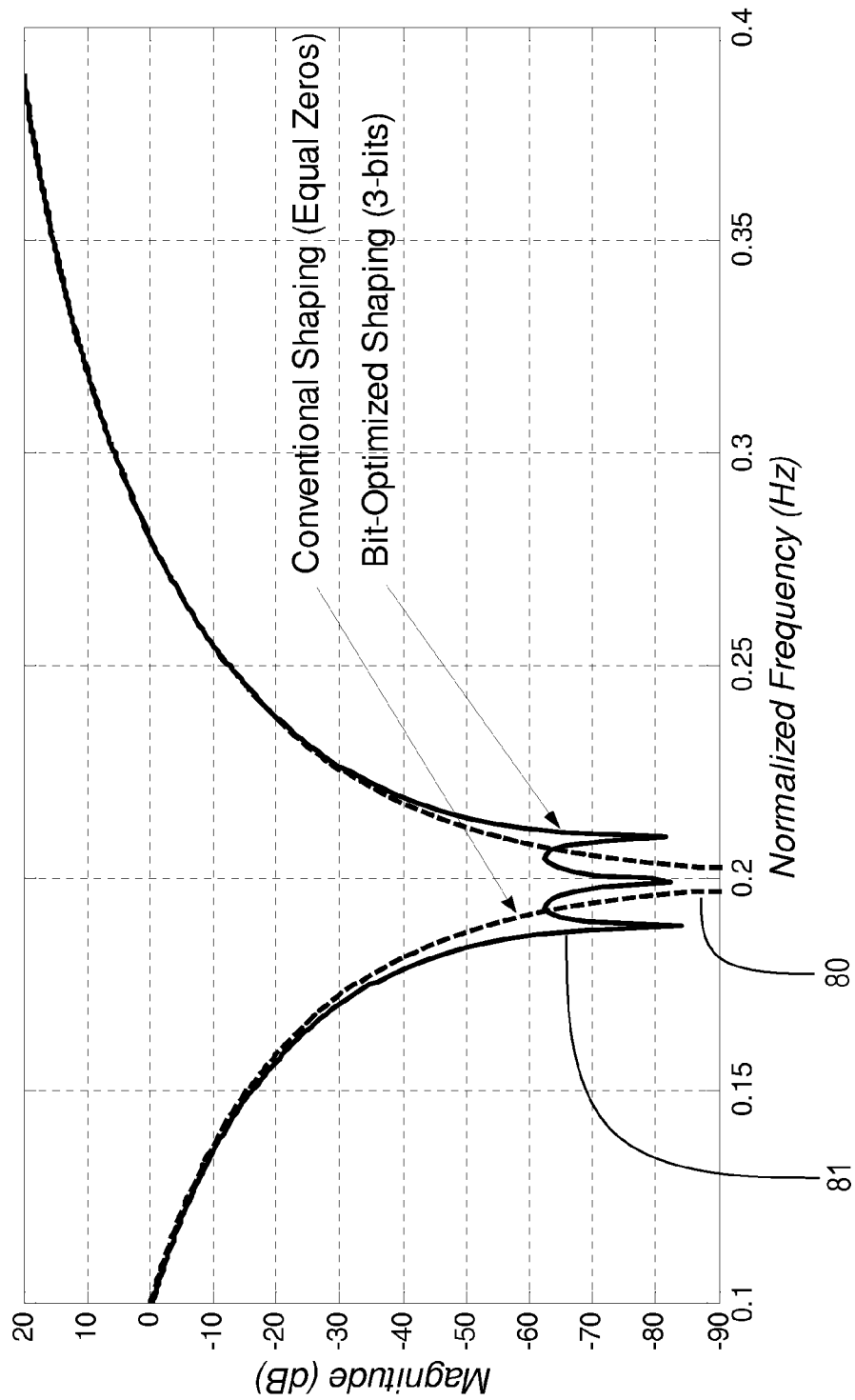
FIG. 8 illustrates the noise transfer function (NTF) of a conventional, single-band bandpass delta-sigma modulator and the noise transfer function of a multirate delta-sigma modulator with bit-width optimized zeros, according to a representative embodiment of the invention.

FIG. 8 illustrates a comparison of the noise transfer functions for two cases: 1) a conventional $6^{th}$-order noise-shaped response with equal zeros, such that $\rho_0 = \rho_1 = \rho_2 = 0.618034...$; and 2) a bit-optimized $6^{th}$-order noise-shaped response with $\rho_0 = \frac{1}{2}$, $\rho_1 = \frac{5}{8}$, and $\rho_2 = \frac{3}{4}$. As shown in FIG. 8, the exemplary NTF with equal zeros 80 has a noise null reaching a depth of greater than 90 dB at a normalized frequency of 0.2 Hz, whereas the depth of the bit-optimized NTF 81 reaches a depth of just greater than 60 dB. However, compared to the NTF with equal zeros 80, the bit-optimized NTF 81 has a 60-dB bandwidth that is approximately 55% wider (0.025 Hz versus 0.016 Hz). For MBO converters with a small number M of parallel processing branches (e.g., 110 and 120), a wider-band NTF with lower maximum attenuation can result in less noise at the output of the signal reconstruction filter 115 than a narrow-band NTF with higher maximum attenuation.

Due to faster accumulation of quantization errors caused by greater amplification of quantization noise in out-of-band regions, when using higher-order noise-shaping circuits 112 it is preferable to use greater than single-bit quantization to ensure that the noise shaper output remains bounded. As a result, the quantizer 114 shown in FIGS. 7A-C preferably is a multi-bit quantizer, and the noise-shaped response is $6^{th}$-order in the preferred embodiments of the invention. However, single-bit quantizers (i.e., comparators) and lower-order noise-shaped responses instead could be used and should be considered to be within the scope of the invention.

Bandpass (Signal Reconstruction) Filter Considerations

The primary considerations for the bandpass filters (e.g., filters 115 and 125) used in MBO signal reconstruction according to the preferred embodiments of the present invention are: 1) design complexity (preferably expressed in terms of filter quality factor and order), 2) frequency response (particularly stopband attenuation), and 3) amplitude and phase distortion. The best converter-resolution performance is obtained for conversion noise-reduction filters (i.e., bandpass or signal reconstruction filters 115) having frequency responses that exhibit high stopband attenuation, which generally increases with increasing filter order. To minimize complexity, however, the implementation of the analog filters is preferably based on relatively low-order (i.e., $5^{th}$ to $7^{th}$ order) standard analog filter responses (e.g., Butterworth, Chebychev, and coupled-resonator), rather than on direct transformation (e.g., impulse invariance and bilinear transformations) of the FIR window filters used in MB$\Delta\Sigma$ analog-to-digital converters. In addition, it is preferable that the filter responses introduce as little amplitude and group delay (phase) distortion as possible to minimize the complexity of digital pre-distortion linearizer (DPL) 104. The performance improvement realized by increasing the converter interleave factor (M) is contingent on a proportionate increase in the quality factor of the reconstruction filters, defined as the ratio of the filter center frequency to the filter 3 dB bandwidth (i.e., $f_C/f_{3\,dB}$). For an MBO converter, according to the preferred embodiments of the invention, the quality factor is calculated for the highest-frequency filter in the reconstruction filter bank (i.e., $f_C \approx \frac{1}{2} \cdot f_S$). Therefore, the preferred quality factor for the analog filters (e.g., filters 115 and 125) is directly related to the interleave factor of the converter and, more preferably, is equal to M. Currently, the quality factor for standard lumped-element or distributed-element analog filters is limited to about 30. As a result, a typical practical limitation on the interleave factor for the MBO converter is M≈32. However, because of the complexity associated with an analog reconstruction filter bank comprised of 32 filters, the preferred embodiments of the invention limit the interleave factor to M=16 or less (i.e., a bank of 16 or fewer analog filters 115).

Figure 9A:
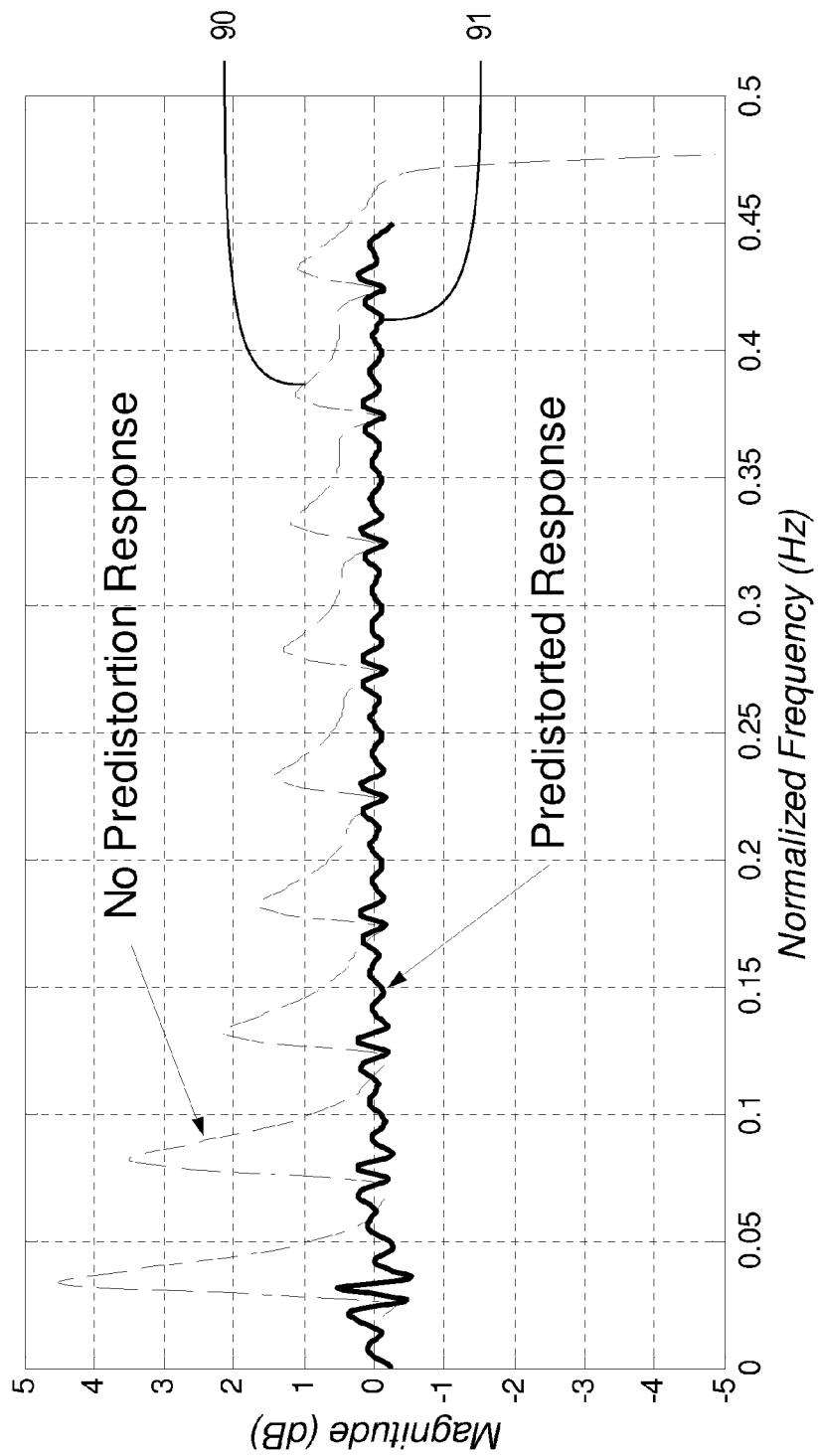
FIG. 9A illustrates the overall frequency responses for an analog signal reconstruction (ASR) filter bank, comprised of $5^{th}$-order Butterworth filters according to representative embodiments of the present invention, with and without digital pre-distortion.
Figure 9B:
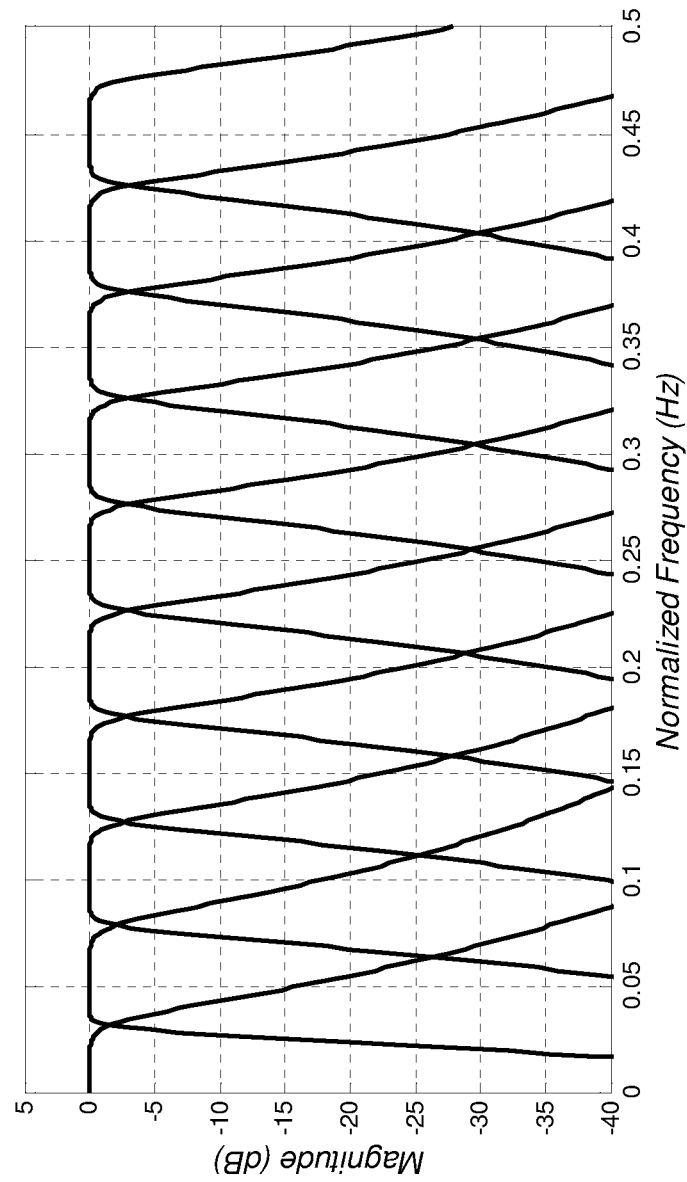
FIG. 9B illustrates the frequency response magnitudes for the individual filters that make up a $5^{th}$-order Butterworth filter bank according to a representative embodiment of the present invention.
Figure 9C:
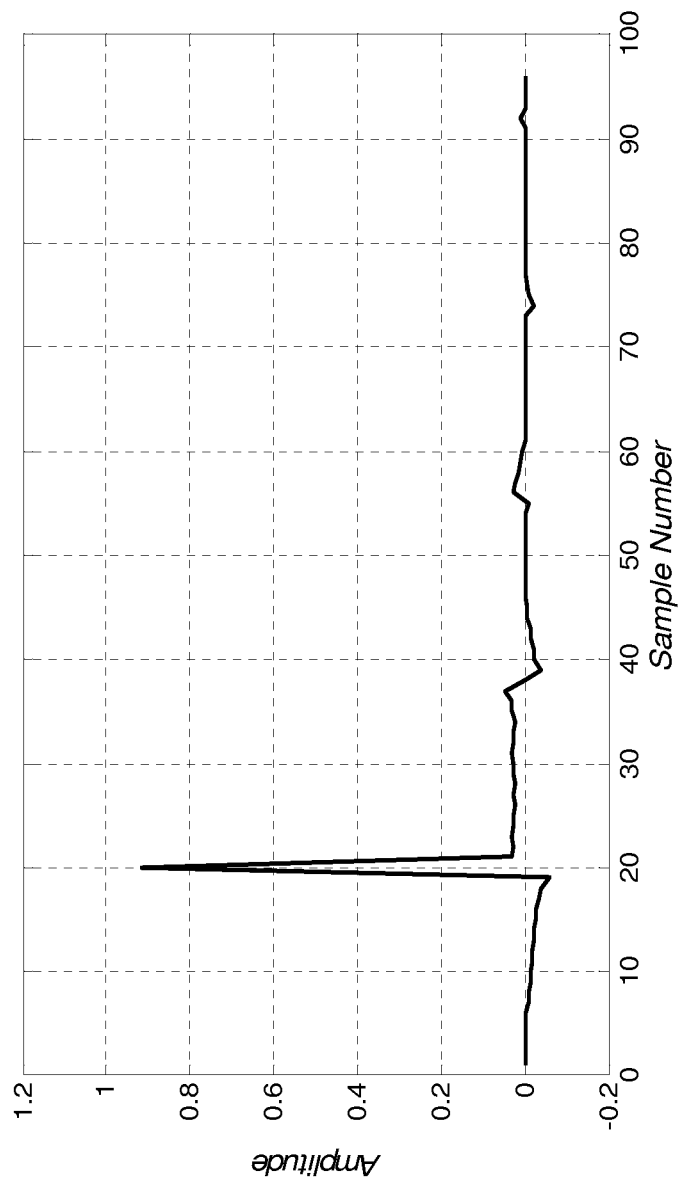
FIG. 9C illustrates the impulse response (i.e., coefficient values) of a digital pre-distortion linearizer (DPL) for a $5^{th}$-order Butterworth filter bank according to a representative embodiment of the present invention.

For an interleave factor of M=16, $5^{th}$- to $7^{th}$-order Butterworth filter responses provide sufficient stopband attenuation of conversion noise. However, the overall response, F(jω), of a bank of these filters does not exhibit the properties necessary for perfect signal reconstruction in frequency-interleaved applications, namely low amplitude and group delay (phase) distortion. For example, curve 90 labeled "No Predistortion Response" in FIG. 9A, illustrates the overall frequency response magnitude for a Butterworth filter bank having the individual frequency responses shown in FIG. 9B. The overall frequency response magnitude 90 of this Butterworth filter bank exhibits amplitude distortion on the order of several decibels (dB). However, with systems according to the preferred embodiments of the present invention, near perfect signal reconstruction is not strictly dependent on the analog filter bank having an all-pass response (i.e., F(jω)= $e^{-jn\omega T}$), as is the generally accepted view in the prior art. Instead, it is only desirable that the filter bank response be all-pass in convolution with a second filter transfer function, L(z), implemented by digital pre-distortion linearizer (DPL) 104A (shown in FIG. 6D), such that $$F(j\omega) \cdot L(z) = F(j\omega) \cdot \frac{\sum_{i=0}^{K1} \beta_i \cdot z^{-i}}{1 + \sum_{i=1}^{K2} \alpha_i \cdot z^{-1}} = z^{-n}|_{z=e^{-j\omega t}}$$

where L(z) is a physically realizable transfer function (e.g., stable and causal). This second filter with transfer function L(z) intentionally predistorts the input signal 102 with added phase and/or amplitude distortion, such that the added intentional distortion cancels the unintentional distortion of the analog reconstruction filter bank (i.e., the aggregate distortion across all of the bandpass filters 115, 125, etc.). As represented in the equation above, the transfer function L(z) of DPL 104 preferably employs both feedforward and feedback components (preferably simple weighted delay components), represented by coefficients $\beta_i$ and $\alpha_i$, respectively. FIG. 9C illustrates an exemplary DPL impulse response that can effectively reduce the distortion introduced by an analog filter bank having the individual Butterworth responses given in FIG. 9B. The exemplary DPL impulse response of FIG. 9C differs from the exemplary DPL response given in the '079 application in that the filter coefficients have been reversed to minimize filter latency (i.e., propagation delay). DPLs with minimum latency are preferred in certain system applications, such as servo loop applications, which are sensitive to the propagation delay of the system elements. In any event, as shown by curve 91 labeled "Predistorted Response" in FIG. 9A, this DPL response combines with the overall analog filter bank response to produce a linearized, overall frequency response magnitude having amplitude distortion of much less than 1 dB.

The coefficients, $\beta_i$ and $\alpha_i$, for a fixed pre-distortion linearizer 104A that maximally equalizes a particular analog filter bank impulse response, can be determined using conventional methods for solving simultaneous linear equations (e.g., zero-forcing or minimum mean square error solutions), or can be determined using conventional adaptive techniques, such as those employing a least mean squares (LMS) algorithm. Under conditions where the overall response of the analog filter bank (i.e., the filter bank comprised of analog bandpass filters 115, 125, and the filters in the remainder of the processing branches) varies, for example due to temperature or other environmental conditions, the coefficients of DPL 104B are variable and preferably continuously adapt based on the measured amplitude and phase characteristics of data converter output. Converter 140 of FIG. 10 incorporates a means for adapting DPL 104B according to a representative embodiment of the present invention. More specifically, converter 140 uses input spectrum analyzer 141A and output spectrum analyzer 141B to compare the complex (i.e., magnitude and phase as a Cartesian value) frequency response (spectrum) $X_k$ of input signal 102 to the complex frequency response (spectrum) $Y_k$ of output signal 135, respectively. Within processing block 144, the coefficients $c_n$ of DPL 104B (i.e., assuming a finite impulse response filter) are preferably computed as the inverse Fourier transform of the ratio of the input spectrum $X_k$ to the output spectrum $Y_k$, such that $$c_n = \text{impulse}(\beta, \alpha)$$
$$= \frac{1}{2 \cdot K} \sum_{k=0}^{2 \cdot K - 1} (X_k, X_{K-k}^*)/(Y_k, Y_{K-k}^*) \cdot \exp\left(2 \cdot \pi \cdot j \cdot \frac{n \cdot k}{2 \cdot K}\right),$$

where the * superscript represents complex conjugate and j is equal to $\sqrt{-1}$. Input spectrum analyzer 141A computes the 2·K-point, discrete Fourier transform (DFT) of real input signal 102, at frequency points k=0, . . . , K−1, using: 1) multipliers 146A; 2) cosine sequence 147A and sine sequence 147B, both having an angular frequency $\omega_k$; 3) moving-average filter 148; and downsample-by-K function 143. Output spectrum analyzer 141B performs similar processing on output signal 135. In the preferred embodiments, moving average-filter 148 is single-stage, K-point rectangular window filter, but more preferably, the magnitude of the DFT side lobes is reduced using cascaded moving-average filters of the type describe in U.S. Pat. No. 8,089,382, titled "Sampling/Quantization Converters", which is incorporated by reference herein as though set forth herein in full. Furthermore, to minimize residual output amplitude and phase distortion at the output of MBO converter 140, DPL 104B has an impulse response of length K≥2·M (i.e., K coefficients) in the preferred embodiments, where M is the number of MBO processing branches. In applications where higher power dissipation and circuit complexity are tolerable, DPL 104B preferably has an impulse response of length K≥4·M.

Figure 10:
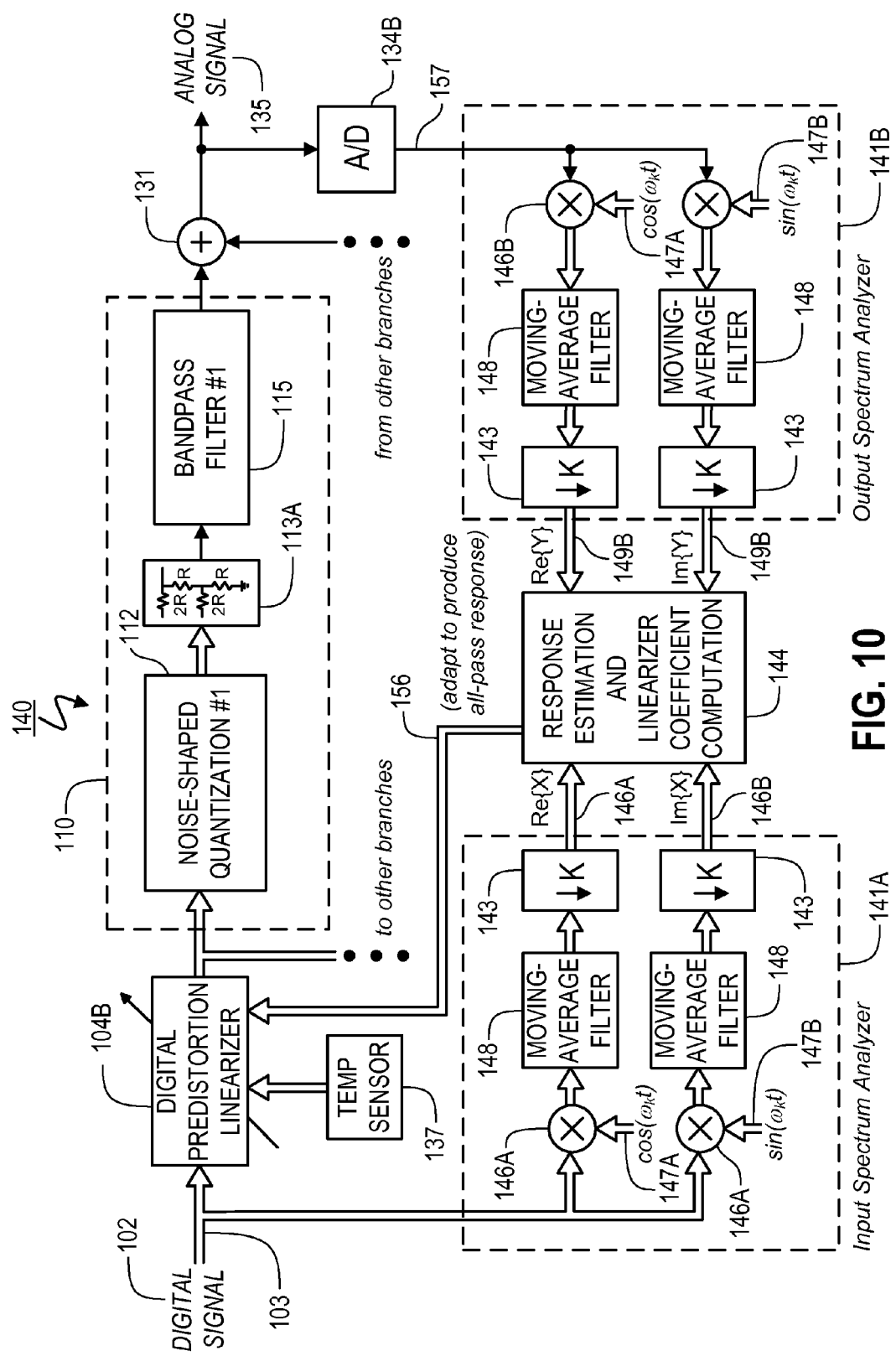
FIG. 10 is a simplified block diagram illustrating a Multi-Channel Bandpass Oversampling (MBO) converter that incorporates an adaptive digital predistortion linearizer (DPL) to compensate for amplitude and group delay variation introduced by an analog signal reconstruction (ASR) filter bank comprised of individual bandpass filters with standard frequency responses, according to a representative embodiment of the present invention.

As illustrated in FIG. 10, the exemplary embodiment of converter 140 also includes a means of directly adjusting the coefficients of DPL 104B for changes in temperature, using temperature sensor 137. In response to changes in temperature, the coefficients of the DPL 104B may be selected from a predetermined set of values, or the coefficients of DPL 104B may be scaled according to a predetermined function established though empirical converter characterization over temperature. DPL temperature compensation may be implemented in conjunction with other adaptation mechanisms, such as that described above which is based on the amplitude and phase characteristics of converter output signal 135, or may be implemented without additional DPL adaptation mechanisms in order to reduce power dissipation and circuit complexity.

Reduced analog filter bank complexity is one reason why the preferred embodiments of the invention employ one or more pre-distortion linearizing filters 104A&B. A second reason is that linearizers of this type can be employed to correct signal skew caused by propagation delay differences between converter branches or channels (e.g., branches 110 and 120) and between parallel paths in polyphase noise-shaper configurations.

Figure 11A:
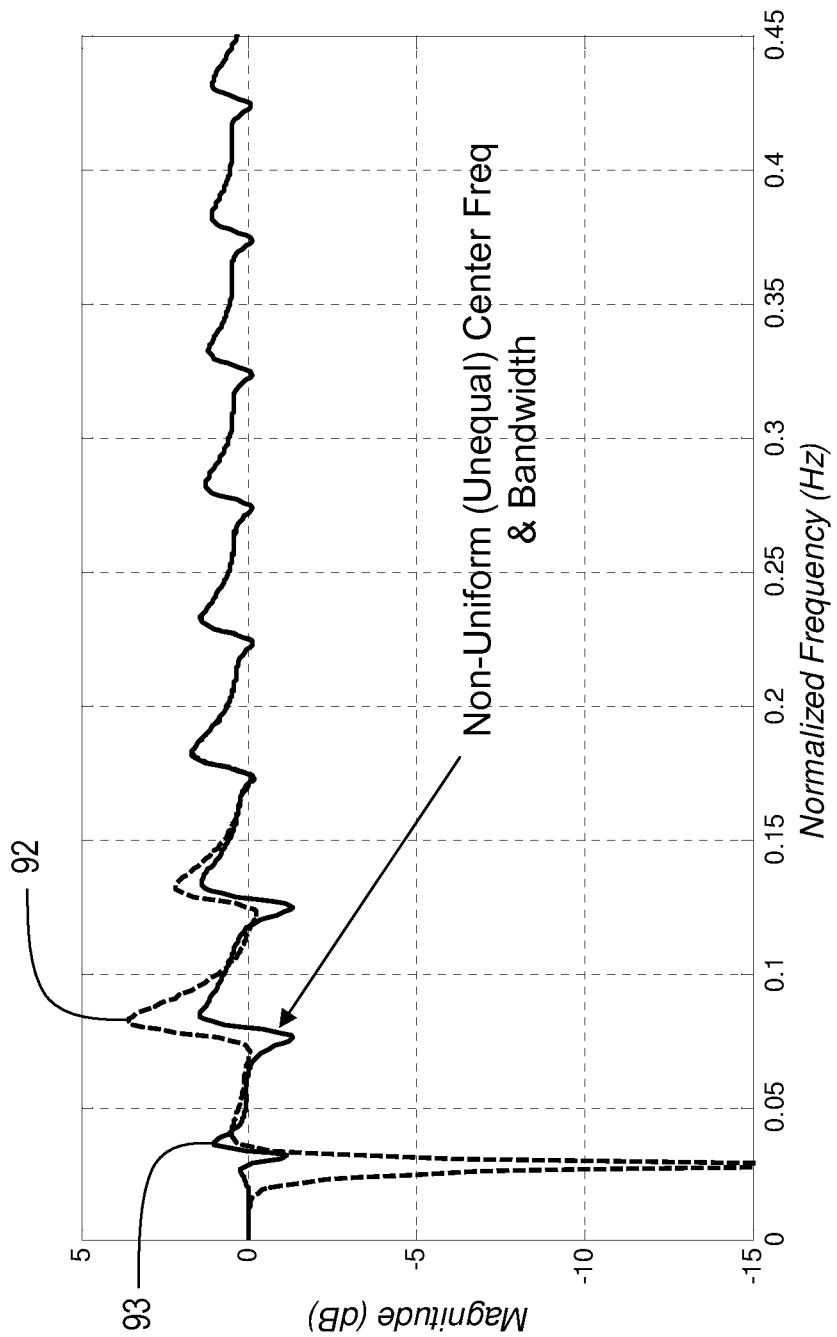
FIG. 11A illustrates the overall magnitude versus frequency responses for different analog signal reconstruction (ASR) filter banks used in a MBO converter according to representative embodiments of the present invention.
Figure 11B:
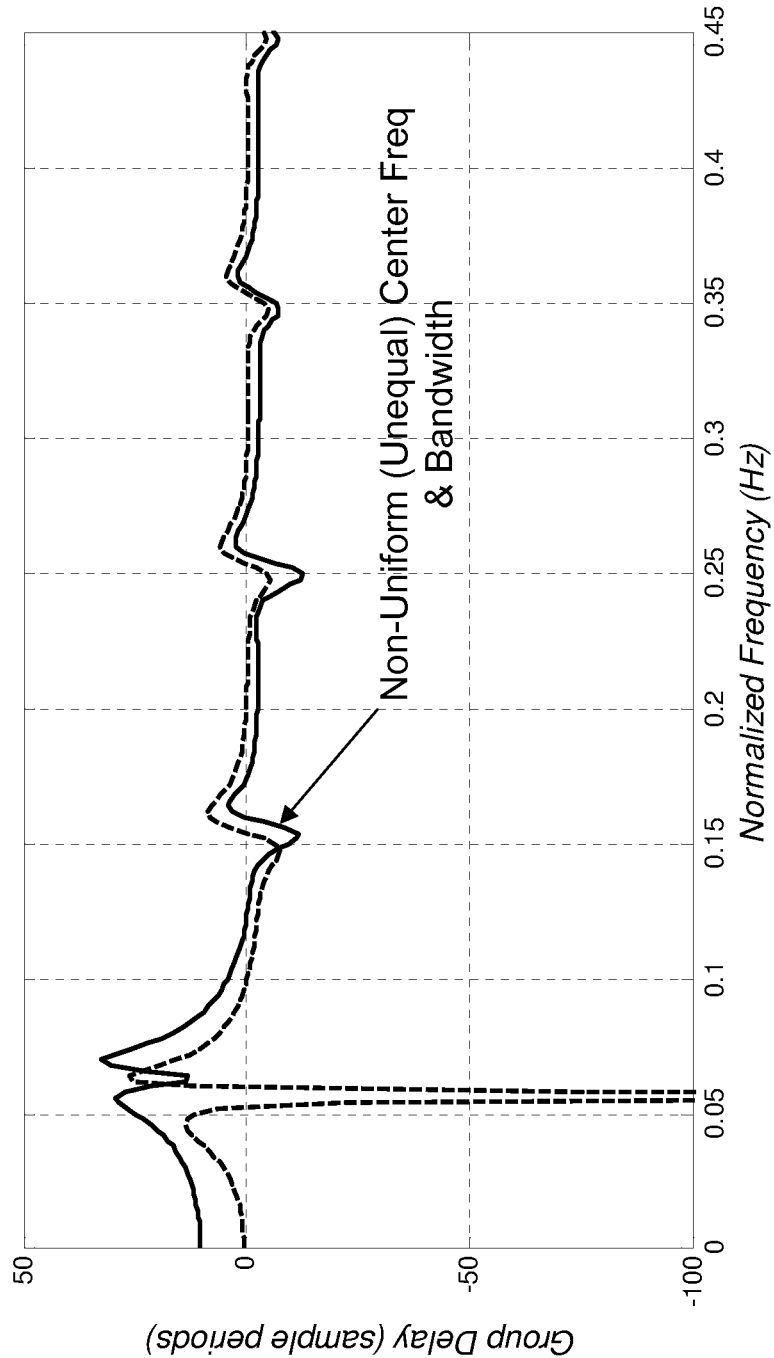
FIG. 11B illustrates the overall group delay versus frequency responses for different analog signal reconstruction (ASR) filter banks used in a MBO converter according to representative embodiments of the present invention.
Figure 11C:
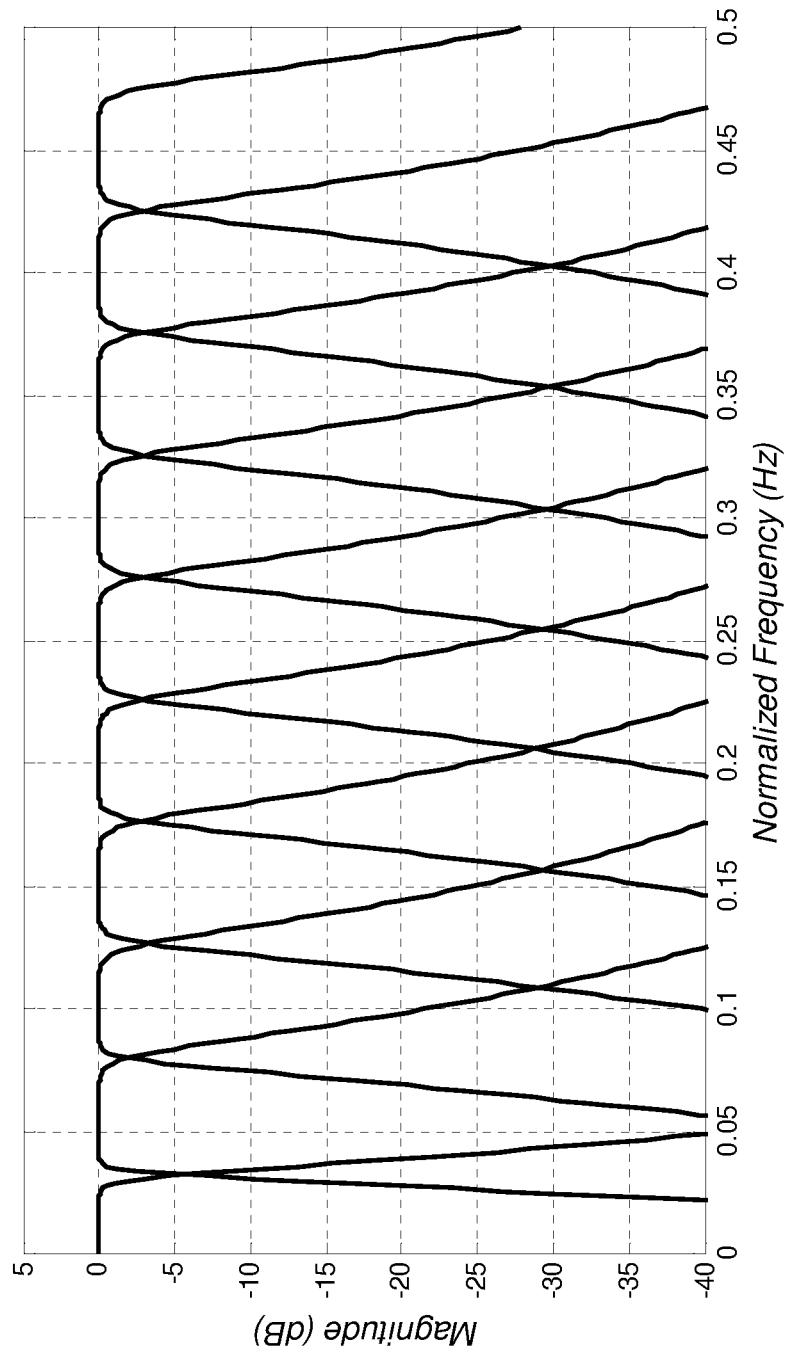
FIG. 11C illustrates the frequency response magnitudes for the individual filters that make up a Butterworth filter bank according to a representative embodiment of the present invention.

To reduce the complexity of digital pre-distortion linearizer 104A&B, or to allow the DPL to be eliminated in certain applications which are less sensitive to amplitude and phase distortion, responses for the bandpass filters (e.g., filters 115 and 125) that make up the analog filter bank preferably are selected to minimize the amplitude and phase distortion that produce passband variation and group delay variation (phase dispersion), respectively. To minimize amplitude and phase distortion in the preferred embodiments, individual analog filter bank responses preferably are optimized with respect to: 1) frequency response, 2) filter order, 3) center frequency, and/or 4) bandwidth. For example, a conventional analog filter bank comprised of $5^{th}$-order Butterworth filters having uniformly distributed center frequencies (i.e., center frequencies distributed evenly across the converter Nyquist bandwidth) and equal bandwidths, has a frequency response magnitude 92, as illustrated in FIG. 11A for an interleave factor of M=10. As shown in FIG. 11A, the frequency response magnitude 92 exhibits passband ripple exceeding 15 dB in a negative direction and exceeding 3 dB in a positive direction. Alternatively, an analog filter bank comprised of Butterworth responses with center frequencies, filter orders, and bandwidths that have been adjusted unequally to reduce amplitude and group delay variation, has a frequency response magnitude 93, as illustrated in FIG. 11A, that exhibits passband variation of less than ±1.5 dB across the converter Nyquist bandwidth (M=10). In addition, as illustrated in FIG. 11B, the group delay variation of the analog filter bank with non-uniform responses is less than ±12.5 sample periods, compared to a group delay variation of greater than ±50 sample periods for the analog filter bank with uniform responses. The frequency response magnitude for the individual filters (e.g., filters 115 and 125) that make up the improved Butterworth filter bank are shown in FIG. 11C.

Polyphase decomposition techniques can also be applied to digital pre-distortion linearizer (DPL) 104A&B to form a parallel processing structure and reduce the clock rates of the digital multipliers and adders that are used to implement the DPL. For example, fixed DPL 104A preferably is a recursive (i.e., infinite-impulse response or IIR) structure with transfer function L(z) that performs the discrete-time convolution of the data converter input sequence x(n) and the filter coefficients l(n) according to $$y(n)=x(n)*l(n) \leftrightarrow Y(z)=X(z) \cdot L(z)=X \cdot L.$$

Assuming, without loss of generality, a pre-distortion linearizer 104A with three coefficients (i.e., $\beta_0$, $\beta_1$, and $\alpha_1$) and transfer function $$L(z) = \frac{\beta_0 + \beta_1 z^{-1}}{1 + \alpha_1 z^{-1}},$$

the operation of the pre-distortion linearizer 104A can be represented by the difference equation $$y_n = \beta_0 x_n + \beta_1 x_{n-1} - \alpha_1 y_{n-1}.$$

Therefore, the difference equations for the first two output samples (i.e., n=1, 2) are $$y_2 = \beta_0 x_2 + \beta_1 x_1 - \alpha_1 y_1 \text{ and } y_1 = \beta_0 x_1 + \beta_1 x_0 - \alpha_1 y_0,$$

and substitution of $y_1$ into $y_2$ results in $$y_2 = \beta_0 x_2 + \beta_1 x_1 - \alpha_1(\beta_0 x_1 + \beta_1 x_0 - \alpha_1 y_0)$$
$$= \beta_0 x_2 + (\beta_1 - \alpha_1 \beta_0) x_1 - \alpha_1 \beta_1 x_0 - \alpha_1^2 y_0.$$

The above equation can be generalized to $$y_n = \beta_0 x_n + (\beta_1 - \alpha_1 \beta_0) x_{n-1} - \alpha_1 \beta_1 x_{n-2} + \alpha_1^2 y_{n-2}.$$

Figure 12:
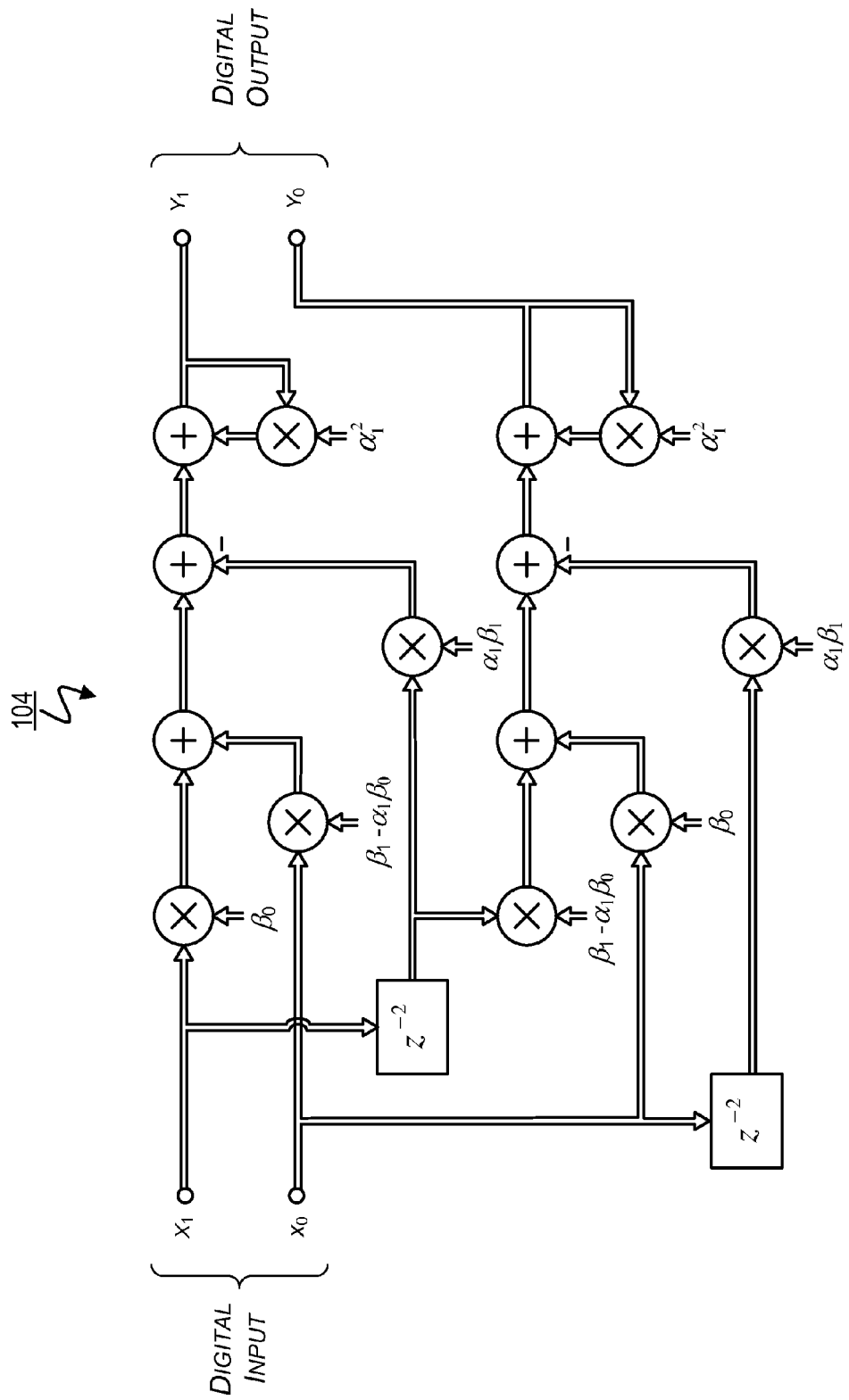
FIG. 12 is a block diagram illustrating a multirate, digital pre-distortion linearizer (DPL) with three coefficients and a polyphase decomposition factor m=2, according to a representative embodiment of the present invention.

The above equation differs from the equation in the '079 application, in that the coefficient of the last term is now raised to a power of 2 (i.e., $\alpha_1^2 y_{n-2}$) to correct for an error that was made substituting $y_1$ into $y_2$ in the '079 application. As before, however, it can be noted that $y_n$ only depends on inputs and every other output for the above example, demonstrating that, like the $\mu\Delta\Sigma$ modulator, the digital pre-distortion linearizer 104A can be implemented as a parallel processing structure with two parallel paths (i.e., polyphase decomposition factor of m=2). In the above example, parallel processing enables the DPL 104A to run at one-half the converter input data rate. This polyphase decomposition approach can be extended to higher polyphase decomposition factors (i.e., m>2) and arbitrary pre-distortion linearizer transfer functions (L(z)), including transfer functions with only numerator terms (i.e., finite impulse response), to allow the DPL to run at a submultiple of the overall converter sample rate. Polyphase decomposition into parallel paths results in an m-times reduction in processing clock rate at the expense of no greater than m-times increased circuit complexity. This penalty in circuit complexity is generally a favorable alternative in the case of very high-sample rate converters. FIG. 12 illustrates a block diagram of an exemplary digital pre-distortion linearizer 104A having an IIR transfer function with three coefficients and a polyphase decomposition factor of m=2. FIG. 12 has been updated, relative to the '079 application, so that the coefficient on the past output term $y_{n-2}$ is correctly raised to a power of 2. Therefore, the exemplary circuit shown in FIG. 12 would operate at one-half the overall converter sample rate.

Multi-Bit-to-Variable-Level Signal Converter Considerations

In the preferred embodiments of the invention, the binary weighted outputs of the noise-shaping/quantization circuit 112, shown in FIGS. 6A-E, are converted to a single proportional analog voltage level using a modified conventional resistor ladder network. However, other conventional methods for converting a multi-bit signal to a single variable-level output, including current sources, instead may be used and should be considered within the scope of the present invention. Where references are made herein to a resistor ladder network, it should be understood that such references are merely exemplary and generally can be replaced by references to any other multi-bit-to-variable-level signal converter.

Figure 13:
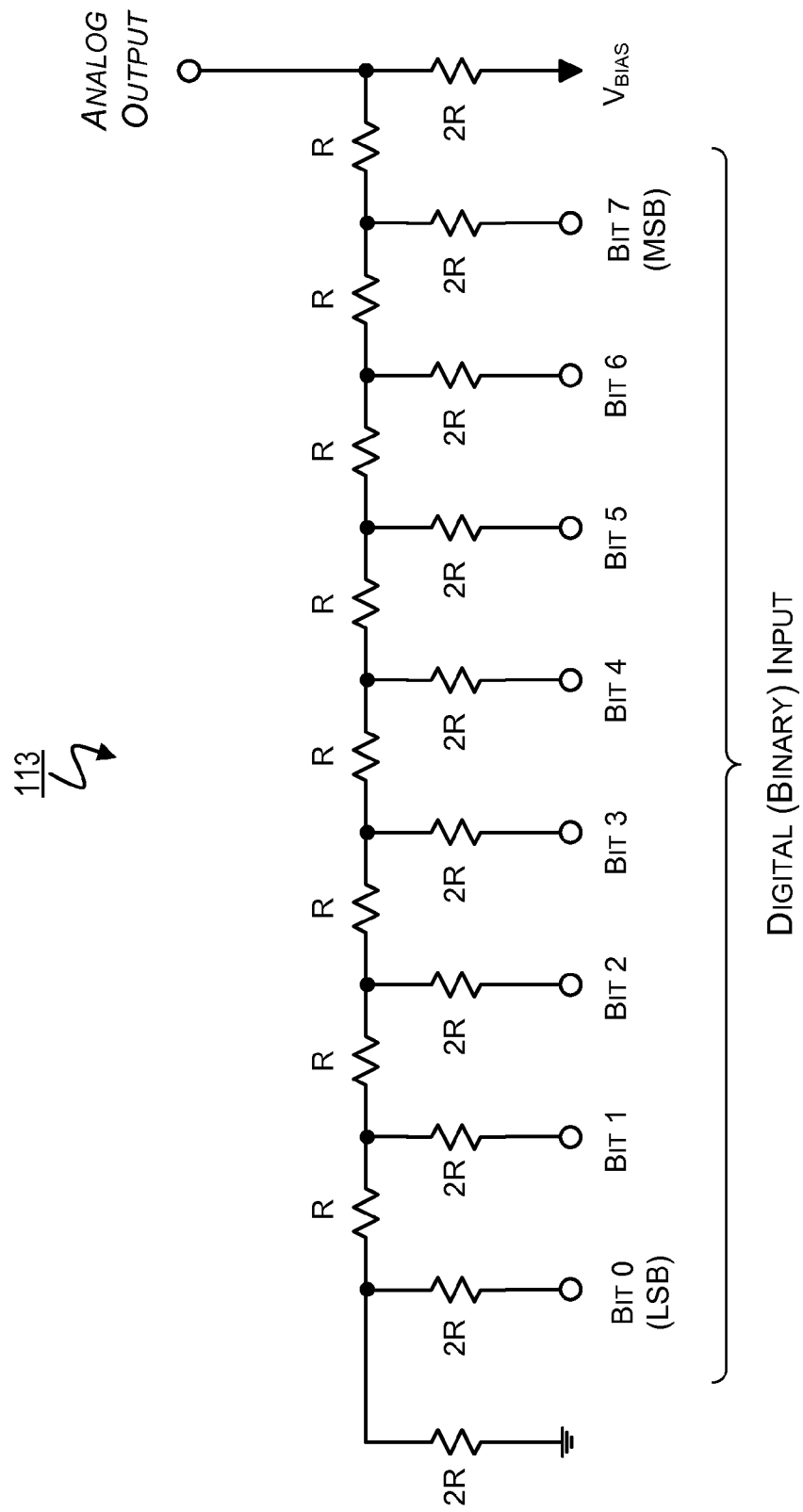
FIG. 13 is a block diagram illustrating an R-2R resistor ladder network, used in a MBO converter according to a representative embodiment of the present invention, for converting a multi-bit digital input to a single, proportional multi-level output voltage.

More specifically, the preferred embodiments of the invention use an R-2R resistor network that has been modified for bipolar operation, where R is matched to the characteristic impedance of the analog filter 115. This impedance is generally between 50 ohms and 100 ohms. FIG. 13 is an exemplary diagram of a conventional resistor ladder, with eight inputs, that has been modified for bipolar operation with the addition of a $V_{BIAS}$ input.

An important consideration for the resistor ladder network is the relative matching of the constituent resistive elements.

It is conventionally understood that a perfect resistor ladder creates an analog output by weighting each digital input according to a binary scaling factor. Mismatches in the resistive elements of the ladder distort this binary scaling, producing a nonlinear response. This nonlinear response distorts the output waveform and, therefore, degrades the quality of the converted analog signal. In conventional converters that employ resistive ladder networks, the matching requirement ($\epsilon_D$) for the resistive elements is determined by the converter precision according to $$\varepsilon_D = \frac{1}{2^{B+1}} \cdot 100\%,$$

where B in the above equation is the effective resolution of the converter in bits. Therefore, the required resistor ladder matching is ~0.2% for 8-bit effective resolution.

The oversampled operation of an MBO converter according to the preferred embodiments of the invention affords two advantages over conventional converters that are based on resistor ladder networks. One advantage is that because of noise shaping and filtering, oversampled converters require resistor ladders with fewer inputs to achieve the same effective resolution as non-oversampled converters. Thus, oversampling reduces the overall complexity of the resistor ladder network. The reduction in the required number of resistor ladder inputs is a function of the converter effective oversampling ratio (N'·M), the noise-shaping order (P) of the $\mu\Delta\Sigma$ modulators within the noise-shaping/quantization circuits 112, and the stopband attenuation of the signal reconstruction filters 115. To reduce resistor network complexity and reduce the required number of digital inputs, the preferred embodiment of the invention uses resistor ladder networks with eight or fewer inputs (i.e., eight or fewer digital inputs to the resistor ladder network in each processing branch).

Figure 6A:
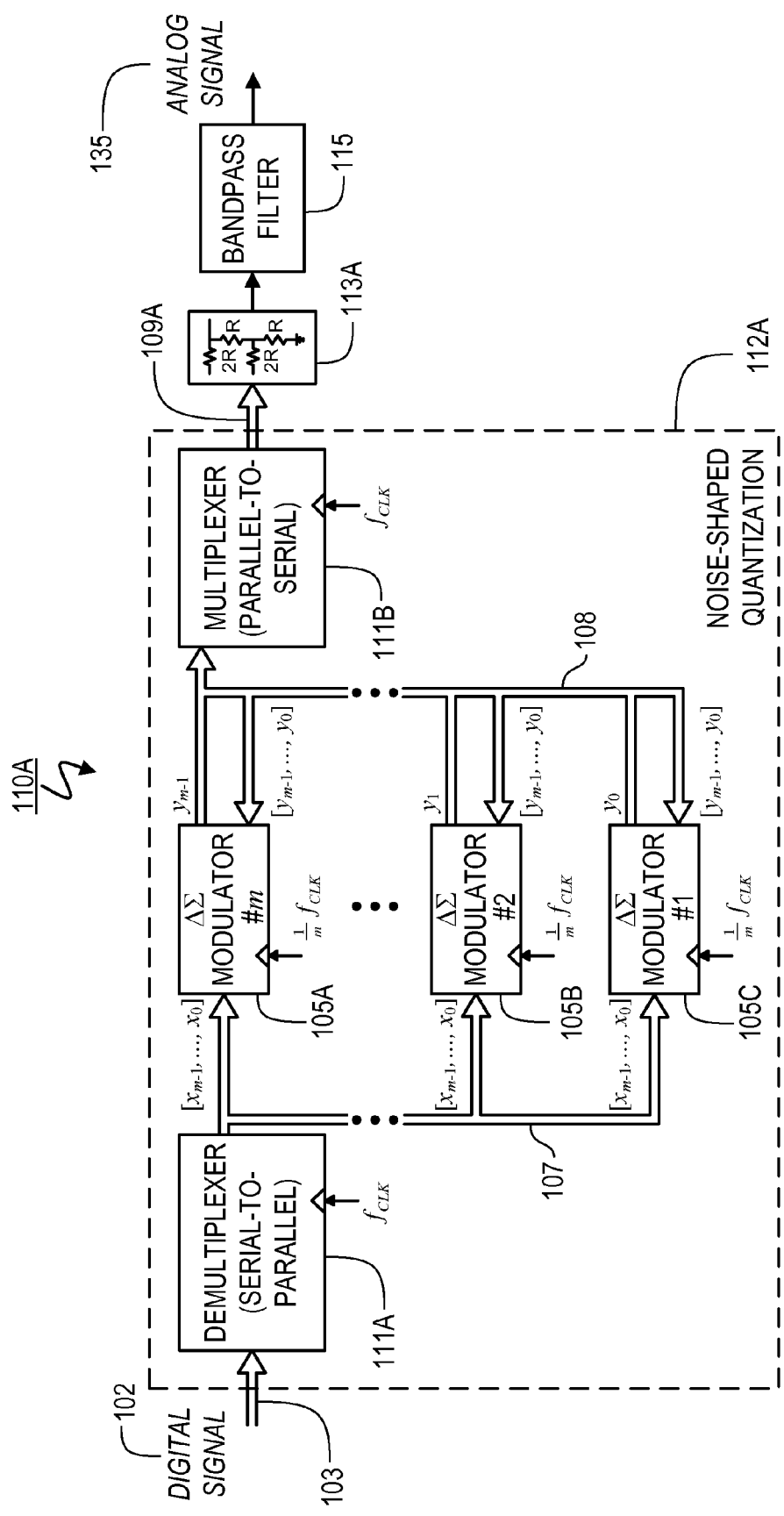
FIG. 6A is a simplified block diagram of a discrete-to-linear converter according to one representative embodiment of the present invention that uses multiple, low-rate processing branches to perform high-rate, noise-shaped quantization of an input signal, and employs an R-2R ladder network for multi-bit-to-variable-level conversion and a bandpass filter for signal reconstruction.
Figure 6B:
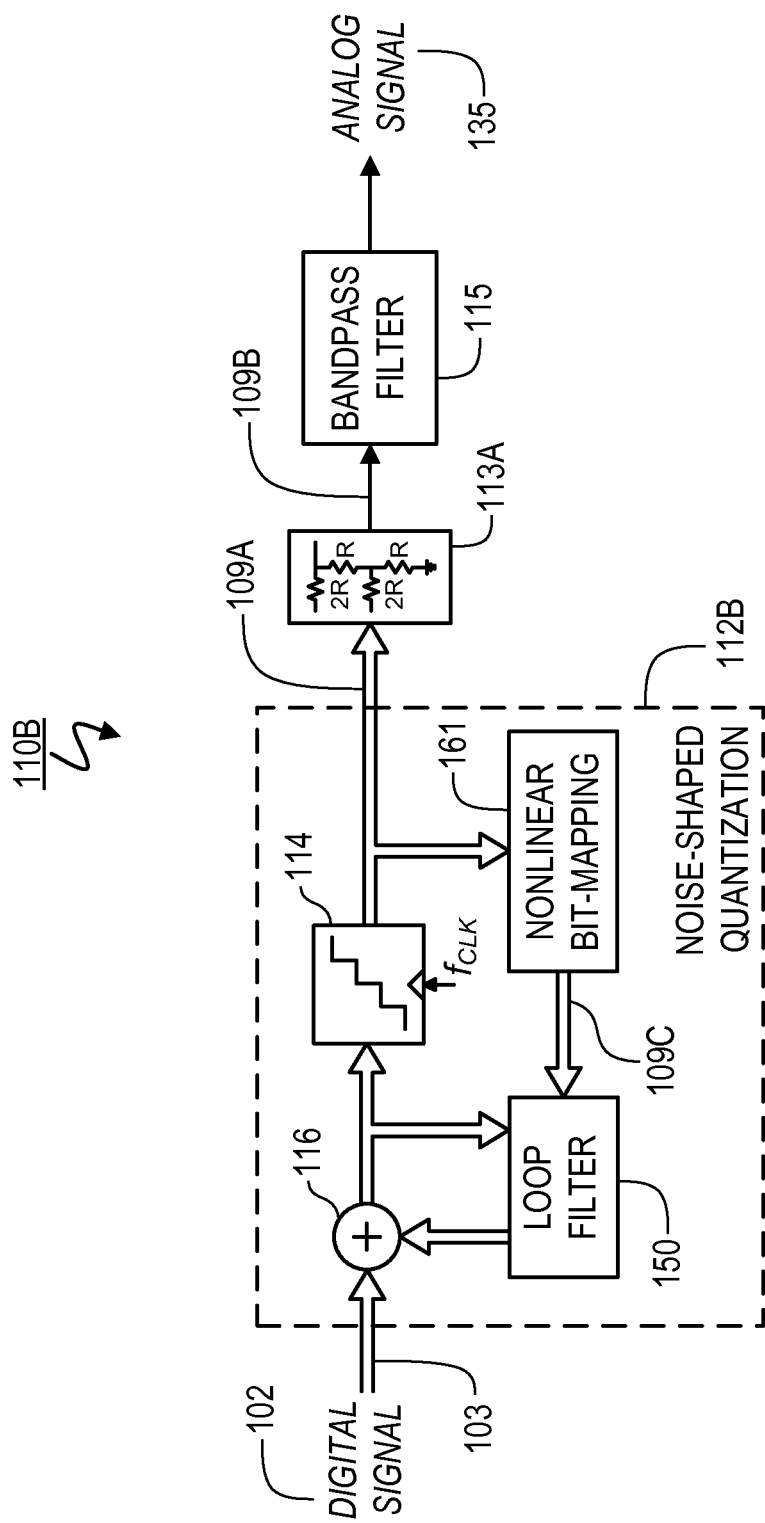
FIG. 6B is a simplified block diagram of a discrete-to-linear converter according to a second representative embodiment of the present invention that employs noise-shaped quantization with a nonlinear bit-mapping component to compensate for rounding errors in the R-2R ladder network used for multi-bit-to-variable-level conversion.
Figure 6C:
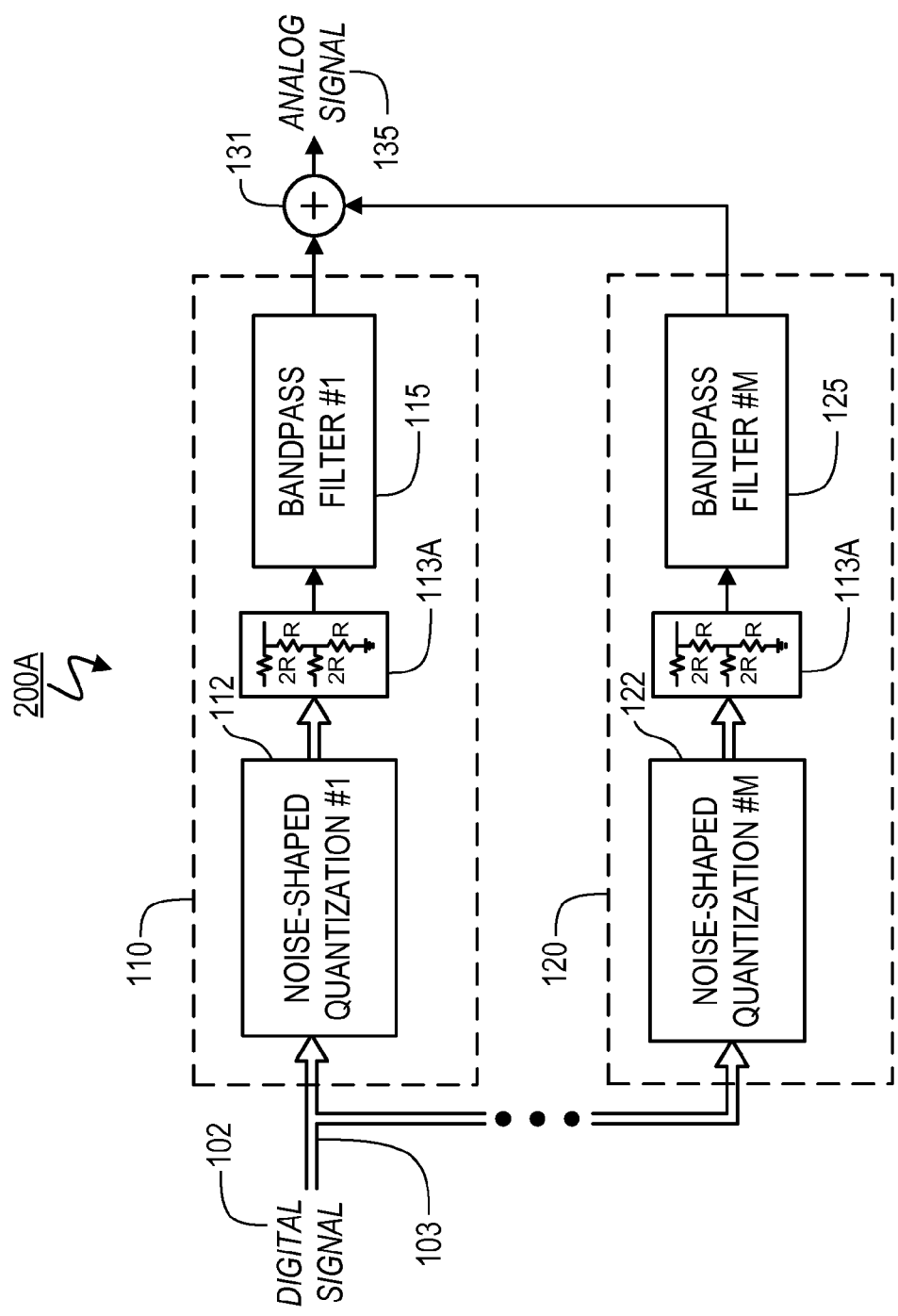
FIG. 6C is a simplified block diagram of a Multi-Channel Bandpass Oversampling (MBO) converter according to a third representative embodiment of the present invention that incorporates multiple processing branches, each including an R-2R ladder network for multi-bit-to-variable-level conversion and an analog bandpass filter for signal reconstruction.
Figure 6D:
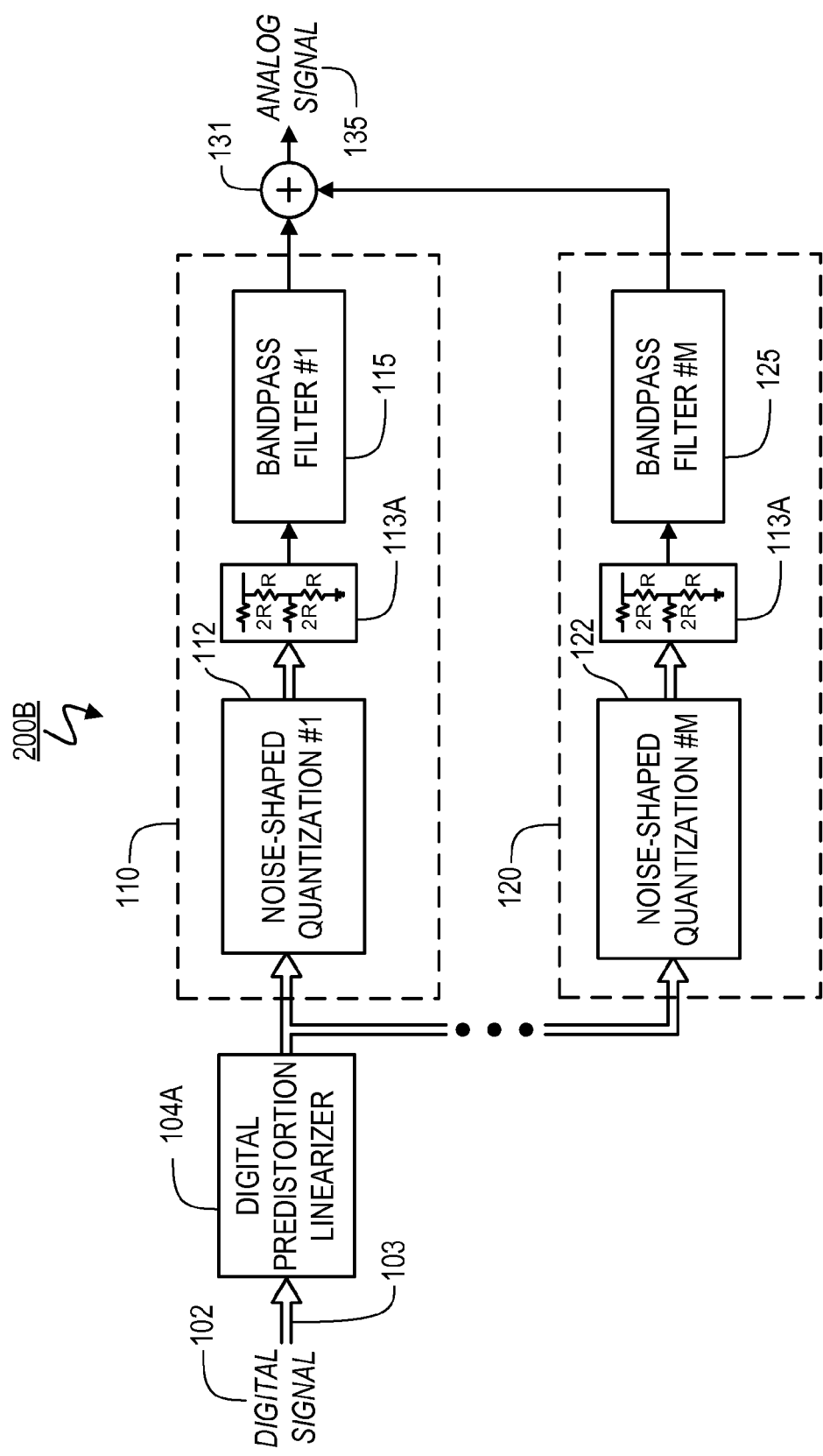
FIG. 6D is a simplified block diagram of a Multi-Channel Bandpass Oversampling (MBO) converter according to a fourth representative embodiment of the present invention that incorporates a digital pre-distortion linearizer (DPL) and multiple processing branches, each including an R-2R ladder network for multi-bit-to-variable-level conversion and an analog bandpass filter for signal reconstruction.
Figure 6E:
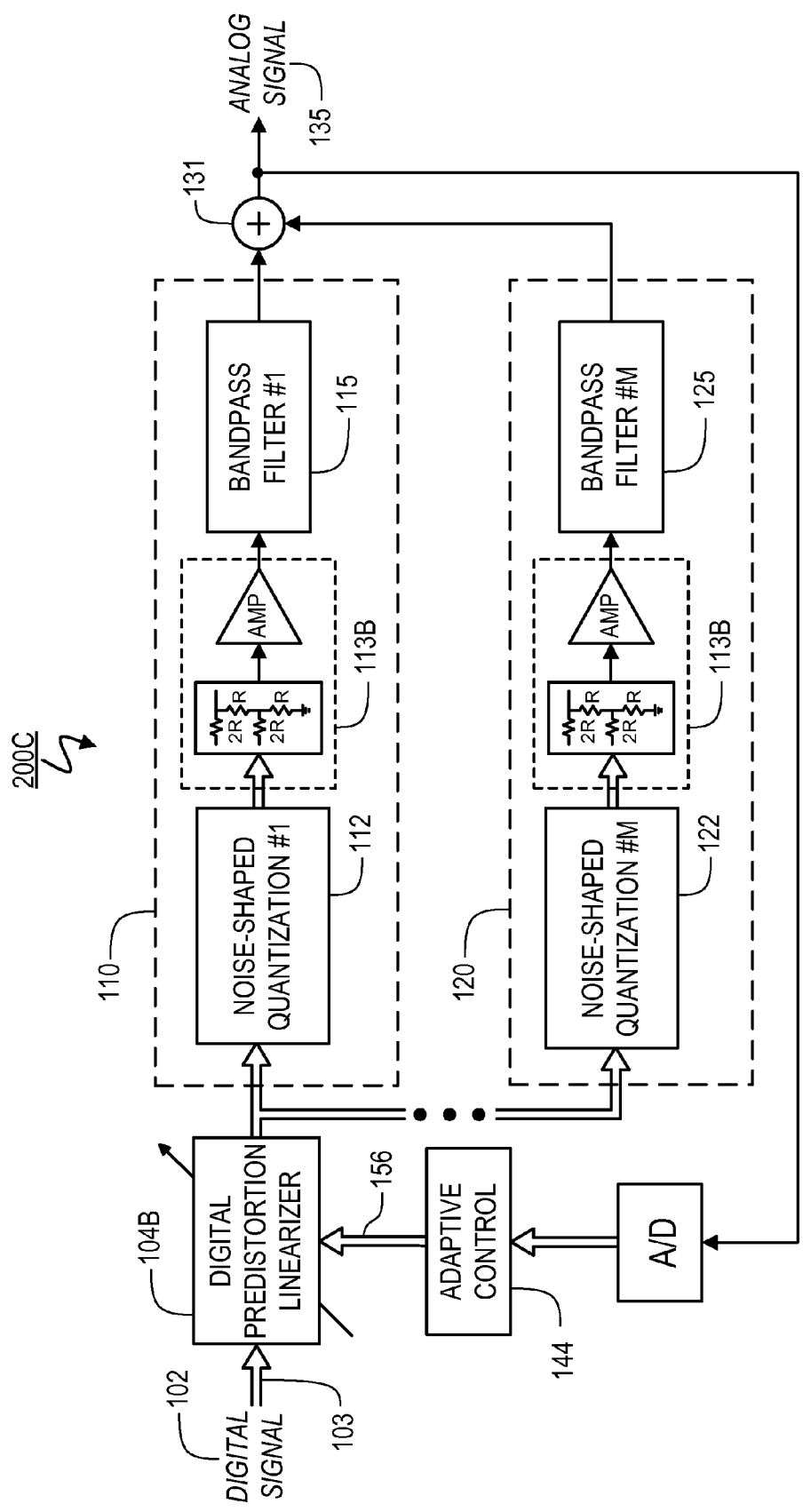
FIG. 6E is a simplified block diagram of a Multi-Channel Bandpass Oversampling (MBO) converter according to a fourth representative embodiment of the present invention that incorporates a digital pre-distortion linearizer (DPL) and multiple processing branches, each including an R-2R ladder network and a buffer/power amplifier for multi-bit-to-variable-level conversion and an analog bandpass filter for signal reconstruction.

A second and more significant advantage is that oversampling enables the distortion introduced by mismatches and other imperfections, such as signal amplitude-dependent gain (i.e., buffer amplifier compression), in the resistor ladder network 113 to be shaped by the noise-shaping/quantization circuit 112 and then largely removed by the bandpass filter 115, through the inclusion of nonlinear bit-mapping, e.g., as illustrated in the representative embodiment of converter 110B in FIG. 6B. Oversampling converters employ error feedback to shape conversion noise and distortion. In conventional oversampling schemes, however, the output of the resistor ladder network is not part of the feedback path of the noise-shaping circuit. Therefore, distortion caused by the imperfect binary scaling of the resistor ladder network 113 conventionally would not be shaped. Also, not subject to the noise-shaped response of the $\mu\Delta\Sigma$ modulator is distortion caused by output buffer amplifier gain that varies with input signal amplitude (i.e., large-signal gain is less than small-signal gain). In the prior art, this varying gain phenomenon is referred to as gain compression or AM-AM conversion. An MBO converter according to the preferred embodiments of the invention incorporates nonlinear bit-mapping component 161 in the $\mu\Delta\Sigma$ modulator feedback loop, as shown in detailed block diagram of FIG. 14A. The purpose of the nonlinear bit-mapping component 161 is to mimic the nonlinear effects (e.g., mismatches and gain compression) of the resistor ladder network 113, such that these nonlinear distortions effectively become part of the $\mu\Delta\Sigma$ modulator feedback path (i.e., as if the signal 146B had in fact originated from the output of the resistor ladder network 113B). This is possible because the level of digital resolution (i.e., bit width is n+n' bits) in the modulator feedback path preferably is much greater than the level of digital resolution at the output of the noise-shaping/quantization circuit 112 (i.e., bit width is n bits). That is, each bit output from quantizer 114 (i.e., each of bits $b_0$ to $b_{n-1}$) preferably is multiplied by a multi-bit factor ($C_0$ to $C_{n-1}$, respectively), thereby increasing its resolution from one bit to multiple bits, and then is subjected to a nonlinear (i.e., compressive) function of the form:

$$x_{OUT} = \sum_i \lambda_i \cdot x_{IN}^j$$

Figure 14A:
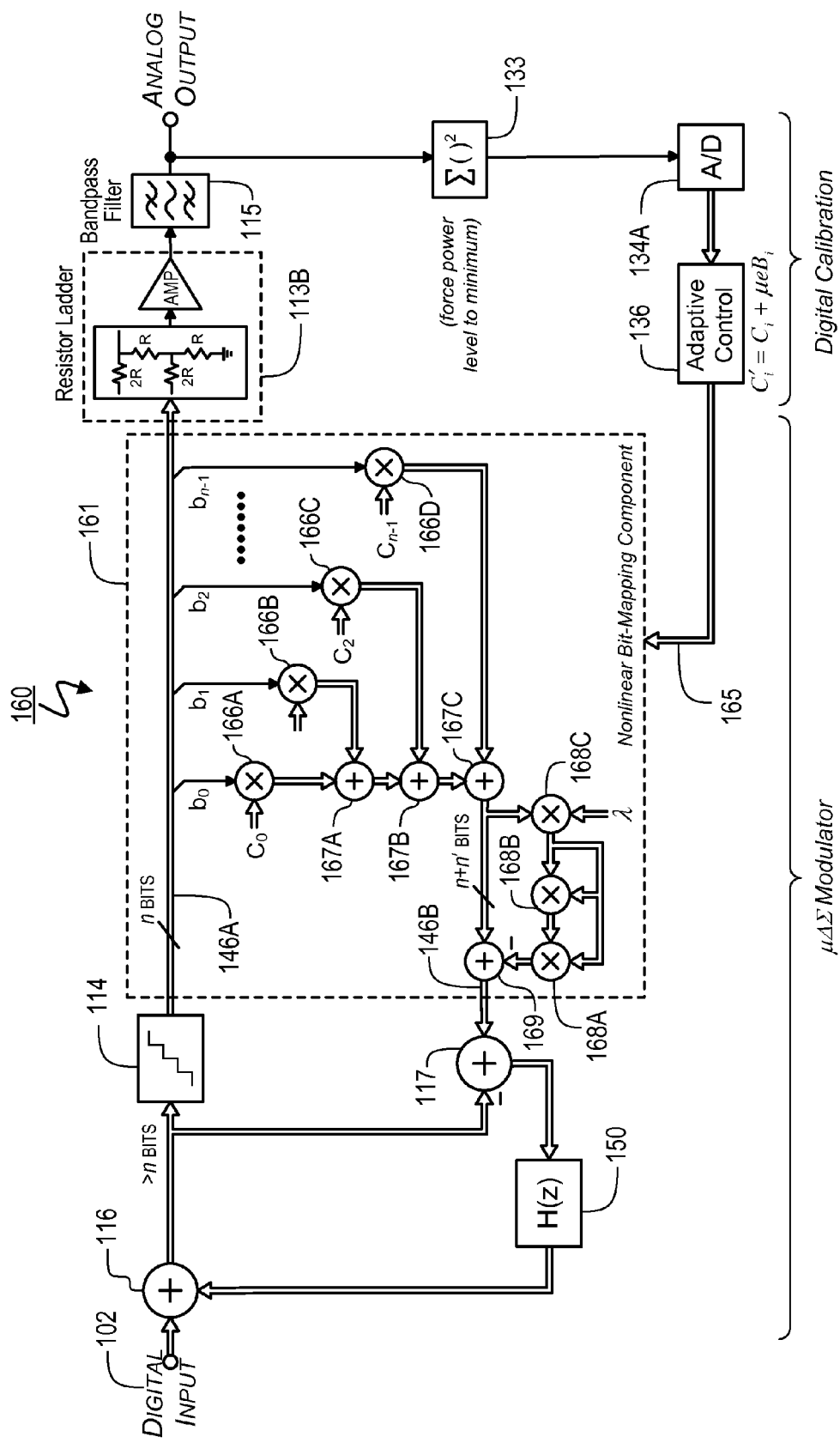
FIG. 14A is a block diagram illustrating a delta-sigma ($\Delta\Sigma$) modulator that incorporates an adaptive nonlinear bit-mapping component to compensate for mismatches in a multi-bit-to-variable-level signal converter, such as a R-2R resistor ladder network.

(e.g., a Taylor's series). In FIG. 14A, this multi-bit weighting operation is performed using digital multipliers 166A-D and digital adders 167A-C, and a Taylor's series (third-order) is performed using digital multipliers 168A-C and adder 169. However, in alternative embodiments, these nonlinear bit-mapping operations can be implemented by other conventional means, such as by using digital memory devices (e.g., read-only or random-access memory) or digital multiplexers, and/or a more complex Volterra series can be used in place of the Taylor's series for greater matching accuracy.

Using relatively high-resolution weighting factors for each such bit output from quantizer 114, prior to feeding the signal 146B back to adder 116 through feedback-loop filter 150, makes it possible to more accurately match the binary scaling imperfections of the resistor ladder network (or other multi-bit-to-variable-level signal converter). More precisely, the nonlinear bit-mapping coefficients, $C_0 \ldots C_{n-1}$, shown in FIG. 14A, preferably are set so as to create bit-dependent, binary scaling offsets that coincide with the binary scaling offsets produced by mismatches in the resistive elements of the resistor ladder network 113B. If the resistors in the ladder network 113B are perfectly matched, then the nonlinear bit-mapping coefficients preferably reflect a perfect binary weighting (i.e., $C_2 = 2 \cdot C_1 = 4 \cdot C_0$). Otherwise the coefficient weighting is only approximately binary. Because the conversion noise of the $\mu\Delta\Sigma$ modulator is additive with respect to the input signal, the conversion noise level at the output of the reconstruction filter 115 is a minimum when the coefficients and the actual resistor network 113B weighting are perfectly aligned. Therefore, by sensing the signal plus noise level (or strength) at the signal reconstruction filter 115 output, e.g., using an analog square-law component 133 (as shown in FIG. 14A), or an analog absolute-value component or other sensor of analog signal strength, in conjunction with a low-frequency analog-to-digital converter 134A, it is possible to adjust the nonlinear bit-mapping coefficients $C_0 \ldots C_{n-1}$ for minimum conversion noise and distortion using an adaptive digital control algorithm within processing block 136. With respect to the circuit 160 shown in FIG. 14A, based on the level at the reconstruction filter 115 output (e.g., as determined in block 162), the algorithm within processing block 136 preferably generates control signals 165 that correct for mismatches between the nonlinear bit-mapping coefficients $C_0 \ldots C_{n-1}$ and the actual resistor ladder 113B weighting factors. Conventional techniques, such as least mean squares (LMS), may be used within processing block 136 for adapting the nonlinear bit-mapping coefficients $C_0 \ldots C_{n-1}$ within the digital calibration loop discussed above.

In practice, the nonlinear bit-mapping coefficients $C_0 \ldots C_{n-1}$ preferably are calibrated once upon startup (e.g., using a known signal) and then are dynamically adjusted in real time in order to account for changes in resistance values (e.g., due to thermal changes). In the preferred embodiments, such dynamic adjustments are made on the order of once per second so as to allow for a sufficient amount of time to evaluate the effect of any changes.

Although not shown in FIG. 14A, in certain embodiments the digital input signal 102 also is supplied to the adaptive control module 136 in order to take into account any changes in output power that result from changes in the input signal 102. On the other hand, in embodiments where variations in the input signal 102 power are expected to average out to zero over the evaluation period, and/or from one evaluation period to the next, the decisions in the adaptive control module 136 can be made based solely on the average converter output power that is measured in block 133 (as shown in FIG. 14A), or based on any other measure of the strength of the signal that is output from the bandpass filter 115.

For a conventional ladder-based converter, the matching accuracy of the resistors in the ladder network determines the precision of the converter. In contrast, the precision of the preferred MBO converter is a function of the converter oversampling ratio (N'·M), the noise-shaped response order (P) of the μΔΣ modulators, and the stopband attenuation of the reconstruction filters 115. Therefore, oversampling enables high-accuracy converters to be implemented using low-accuracy resistor ladder networks 113. The preferred embodiment of the invention uses resistor ladder networks with accuracies of just 1% or better to reduce the required tuning range of the nonlinear bit-mapping components.

Overall Converter Considerations

Figure 14B:
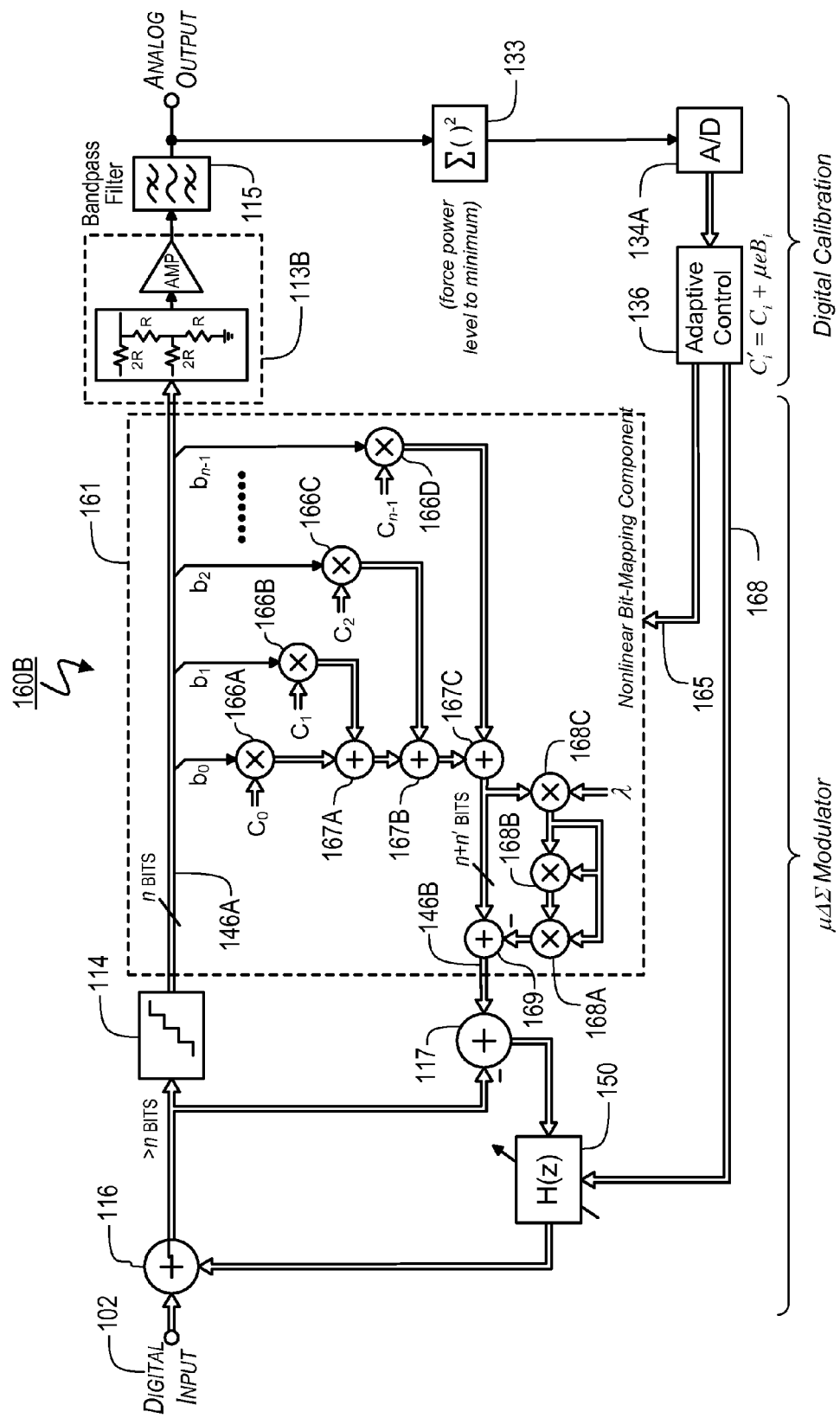
FIG. 14B is a block diagram illustrating a delta-sigma ($\Delta\Sigma$) modulator that incorporates adaptive noise-shaping, in addition to adaptive nonlinear bit-mapping.

The noise-shaping operation of the MBO data converter is most effective when the spectral null in the noise transfer function (NTF) is precisely aligned with the center frequency of the bandpass filter in each of the processing branches. When the NTF spectral null and bandpass filter center frequency are precisely aligned, the noise level, and therefore the signal plus noise level, at the bandpass filter output is a minimum. Because the spectral null in the NTF response is determined by parameters $\rho_i$ of the feedback-loop filter 119, the configuration illustrated in FIG. 14B can be used to dynamically align the spectral null in NTF response with the center frequency of the bandpass filter 115. With respect to the circuit 160B shown FIG. 14B, based on the power (or other measure of signal strength) of the signal at the output of the bandpass filter 115 (e.g., as determined in processing block 133), the algorithm implemented by processing block 136 preferably also generates control signal 168 that adjusts the parameters $\rho_i$ of the feedback-loop filter 150. Conventional techniques, such as least mean squares (LMS), can be used within processing block 136 for adapting the DPL response.

Because the digital pre-distortion linearizer (DPL) 104A&B and the μΔΣ modulators within the noise-shaping/quantization circuits 112 can be implemented as multirate (polyphase) structures, the instantaneous bandwidth of the converter technology illustrated in FIG. 6C (with a more specific and detailed embodiments that incorporate a multirate DPL 104 and multirate noise-shaping/quantization circuits 112 being illustrated in FIGS. 6D&E) is limited only by the maximum switching rate of the digital output buffers that drive the resistor ladder networks 113A&B and by the analog reconstruction filters (e.g., filters 115 and 125).

Figure 15A:
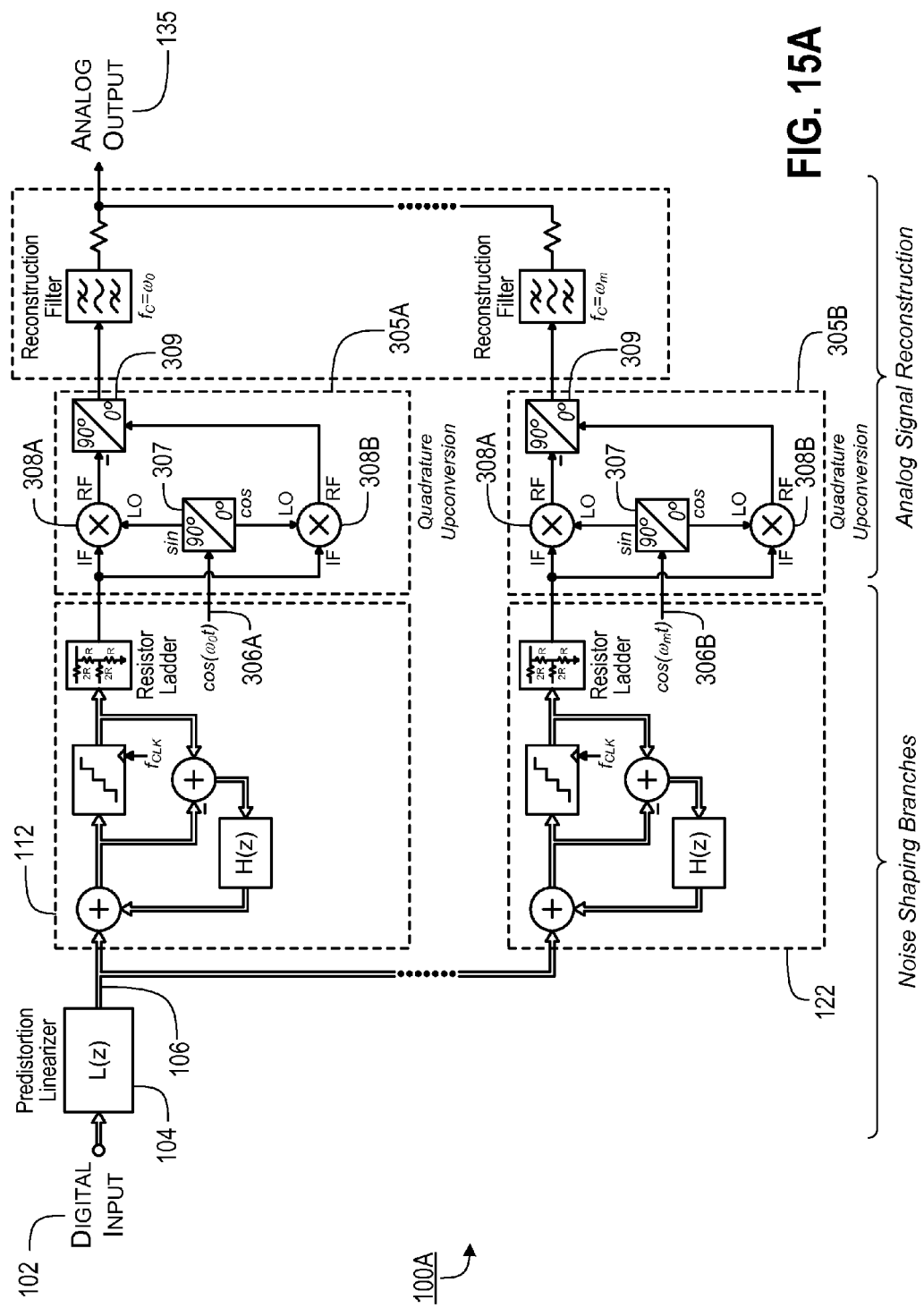
FIG. 15A is a block diagram of a complete MBO converter according to a representative embodiment of the present invention, that incorporates multiple bandpass delta-sigma modulator noise-shaping circuits in conjunction with: 1) resistor ladder networks, 2) an analog signal reconstruction (ASR) filter bank, and 3) output quadrature upconversion.

Although the foregoing MBO converter has up to 10 GHz of instantaneous bandwidth at sampling rates $f_S$ of 20 GHz (i.e., a frequency range of 0 Hz to 10 GHz in the preferred embodiments), inclusion of conventional upconversion techniques should be considered within the scope of the invention as a means of shifting the converter output to frequency bands that exceed ½·$f_S$. For example, an output signal can be shifted from a band centered at 5 GHz to a band centered at 15 GHz, using a conventional upconverter with a 10 GHz local oscillator (LO), such that the resulting 15 GHz output signal can be converted with an MBO processing branch configured for 5 GHz operation (i.e., the quantization noise response is configured for a spectral null at 5 GHz). An exemplary converter 100A shown in FIG. 15A, incorporates a quadrature upconversion operation (e.g., the operation performed by each of circuits 305A&B) between the μΔΣ modulator and the bandpass reconstruction filter. More specifically, quadrature upconverter 305A shifts the output of μΔΣ modulator 112 from a center frequency of ω to a center frequency of ω+ω$_0$, and quadrature upconverter 305B shifts the output of μΔΣ modulator 122 from a center frequency of ω to a center frequency of ω+ω$_m$, according to the equation:

$$z = y'_{inphase} \cdot \cos(\omega_k t) - y'_{quadrature} \cdot \sin(\omega_k t),$$

where $y'_{inphase}$ and $y'_{quadrature}$ are phase-shifted versions of the μΔΣ modulator output that are formed within quadrature combiner 309. In addition to quadrature combiner 309, each quadrature upconverter consists of: 1) a local oscillator source (e.g., generating each of signals 306A&B) with frequencies ω$_0$ and ω$_m$, respectively; 2) a quadrature hybrid (e.g., each of circuits 307) that divides the local oscillator signal into quadrature (i.e., sine) and in-phase (i.e., cosine) components; and 3) dual mixers (e.g., circuits 308A&B) that produce frequency-shifted images of the μΔΣ modulator output signal. In the preferred embodiments, a quadrature upconverter (i.e., image reject mixer) is used instead of a simple upconverter (i.e., single mixer), because a simple upconverter produces unwanted lower images of the μΔΣ modulator output (i.e., ω−ω$_0$ and ω−ω$_m$), in addition to the desired upper images of the μΔΣ modulator output (i.e., ω+ω$_0$ and ω+ω$_m$)

Figure 15B:
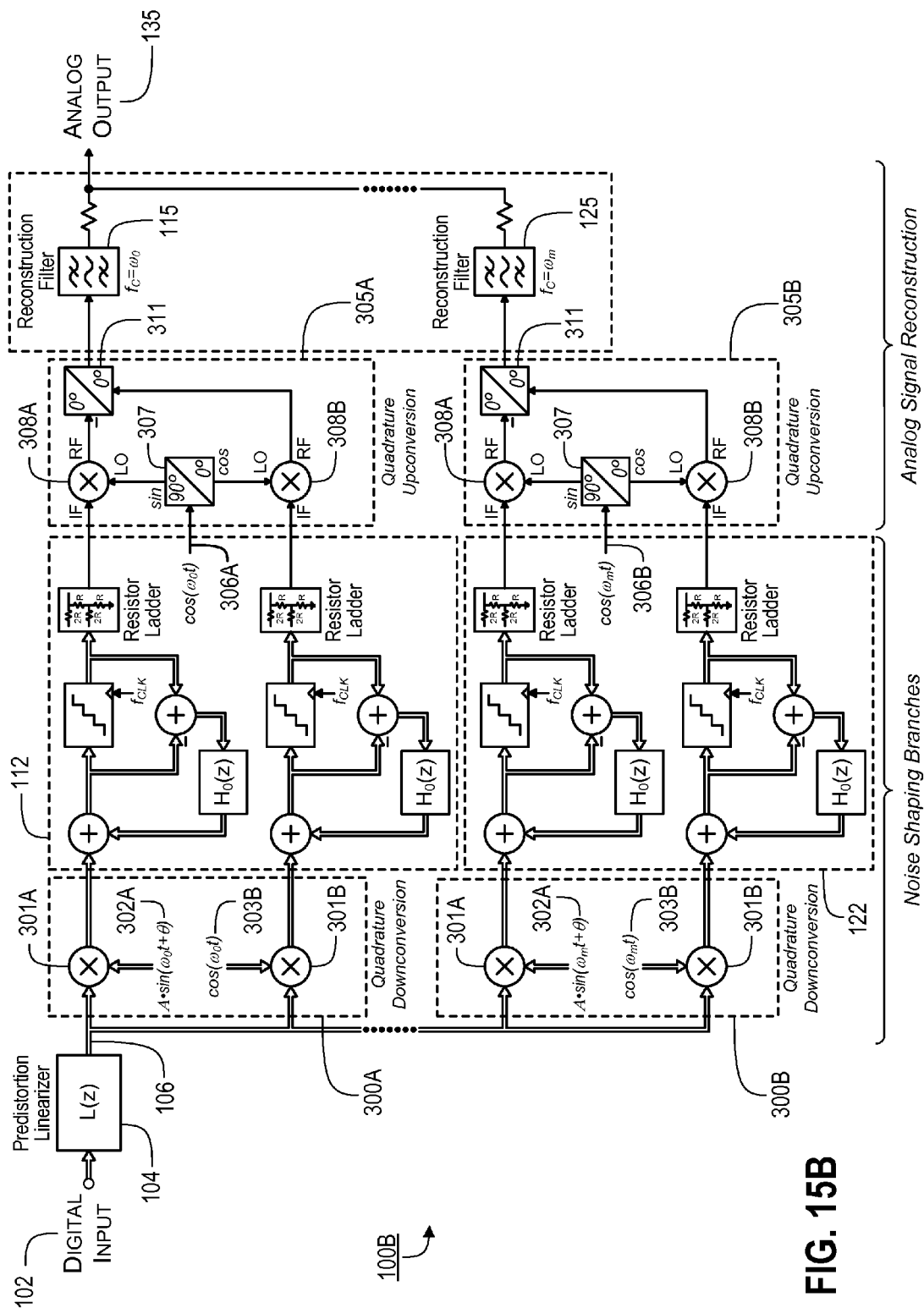
FIG. 15B is a block diagram of a complete MBO converter according to a representative embodiment of the present invention, that incorporates multiple bandpass delta-sigma modulator noise-shaping circuits in conjunction with: 1) resistor ladder networks, 2) an analog signal reconstruction (ASR) filter bank, 3) input quadrature downconversion, and 4) output quadrature upconversion.

The present inventor has discovered that in addition to extending usable frequency range, output quadrature upconverters can be combined with input quadrature downconverters, as illustrated in FIG. 15B, to realize the more significant advantage of mitigating the degradation in MBO converter resolution caused by sampling jitter. The converter output noise ($\eta_j$) that is introduced by sampling jitter ($\sigma_j$) increases with frequency ($\omega_k$) according to $\eta_j = \omega_k \cdot \sigma_j$, where $\omega_k$ is the intended processing (center) frequency of the $k^{th}$ MBO branch. By decreasing the center frequencies ($\omega_k$) of the MBO processing branches, therefore, downconversion reduces the output noise caused by sampling jitter and improves overall converter resolution.

An exemplary MBO converter 100B, shown in FIG. 15B, combines quadrature upconversion with quadrature downconversion. Converter 100B uses one quadrature downconverter (e.g., circuits 300A&B) per MBO processing branch, to shift a portion of the input frequency band (i.e., the portion of the band processed in the respective MBO branch) from a center frequency of ω to a center frequency of zero, using multipliers 301A&B, sine sequences 302A&B, and cosine sequences 303A&B. More specifically, quadrature downconverter 300A shifts a portion of pre-distorted input signal 106 from a band centered at frequency ω$_0$ to a band centered at zero hertz. This band shift enables noise shaping circuit 112 to process the input signal, originally centered at a frequency of ω$_0$, when configured to produce a quantization-noise transfer function (NTF) with a spectral minimum (i.e., $f_{notch}$) at zero hertz (i.e., baseband). Similarly, quadrature downconverter 300B shifts a portion of pre-distorted input signal 106 from a band centered at frequency ω$_m$ to a band centered at zero hertz. As before, this band shift enables noise shaping circuit 122 to process the input signal, originally centered at a frequency of $\omega_m$, when configured for an $f_{notch}$ of zero hertz (i.e., baseband). After noise shaping, the input signals are restored (i.e., upconverted) to their respective center frequencies of $\omega_0$ and $\omega_m$, using quadrature upconverters 305A&B. Because the quadrature downconverter produces in-phase and quadrature components, signal combining in quadrature upconverters 305A&B uses in-phase combiners 311 (i.e., as opposed to quadrature combiners 309) to reject the lower image of the μΔΣ modulator output signal.

The quadrature downconverter produces an in-phase output ($y_{inphase}$) and a quadrature output ($y_{quadrature}$) quadrature) by processing input signal 106 (x) according to:

$$y_{inphase} = x \cdot \cos(\omega t)$$

$$y_{quadrature} = x \cdot A \cdot \sin(\omega t + \theta),$$

where parameters A and θ preferably are set (e.g., pursuant to a manufacturing trim operation), or dynamically adjusted, to compensate for amplitude and phase imbalances, respectively, in the quadrature upconverter (e.g., circuits 305A&B). Upconverter amplitude and phase imbalances produce unwanted spurious responses at the output of the reconstruction filter (e.g., each of filters 115 and 125), that get smaller when parameters A and θ are matched (i.e., equal and opposite) to the inherent imbalances of quadrature upconverter 305. Preferably, the parameter A is approximately equal, or more preferably exactly equal, to the multiplicative inverse of the amplitude imbalance of the quadrature upconverter. Similarly, the parameter θ preferably is approximately equal, or more preferably exactly equal, to the additive inverse of the phase imbalance of the quadrature upconverter. Similarly to the digital pre-distortion linearizer (DPL), the quadrature downconverter can be implemented using polyphase decomposition techniques to reduce the clock/processing rates of digital multipliers and sine/cosine sequence generators.

Figure 16A:
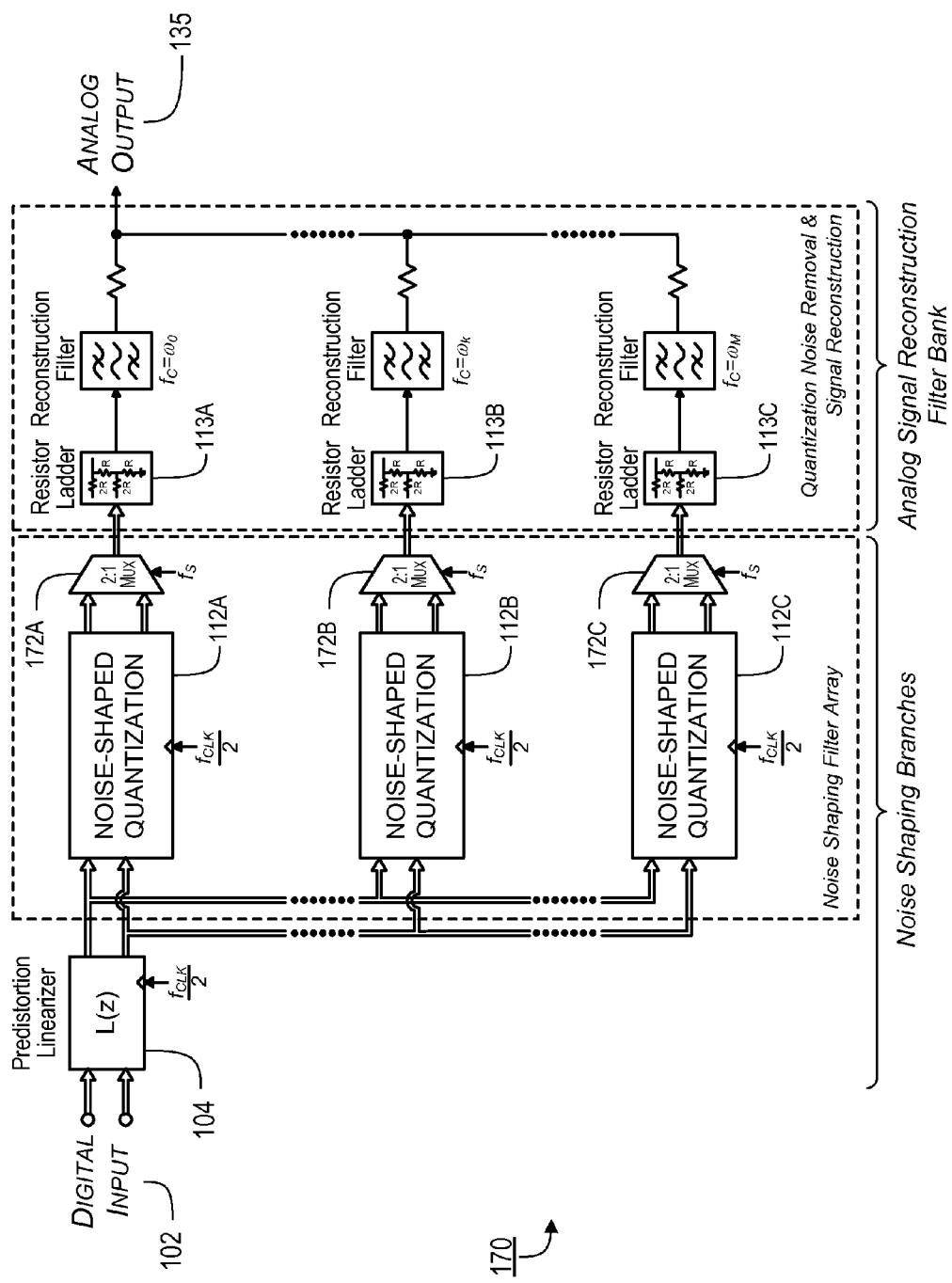
FIG. 16A is a block diagram of a complete MBO converter that incorporates multiple, multirate delta-sigma ($\mu\Delta\Sigma$) modulator noise-shaping circuits, in conjunction with resistor ladder networks and an analog signal reconstruction (ASR) filter bank, and uses output multiplexing to combine the two multirate outputs of each $\mu\Delta\Sigma$ modulator, according to a representative embodiment of the present invention.
Figure 16B:
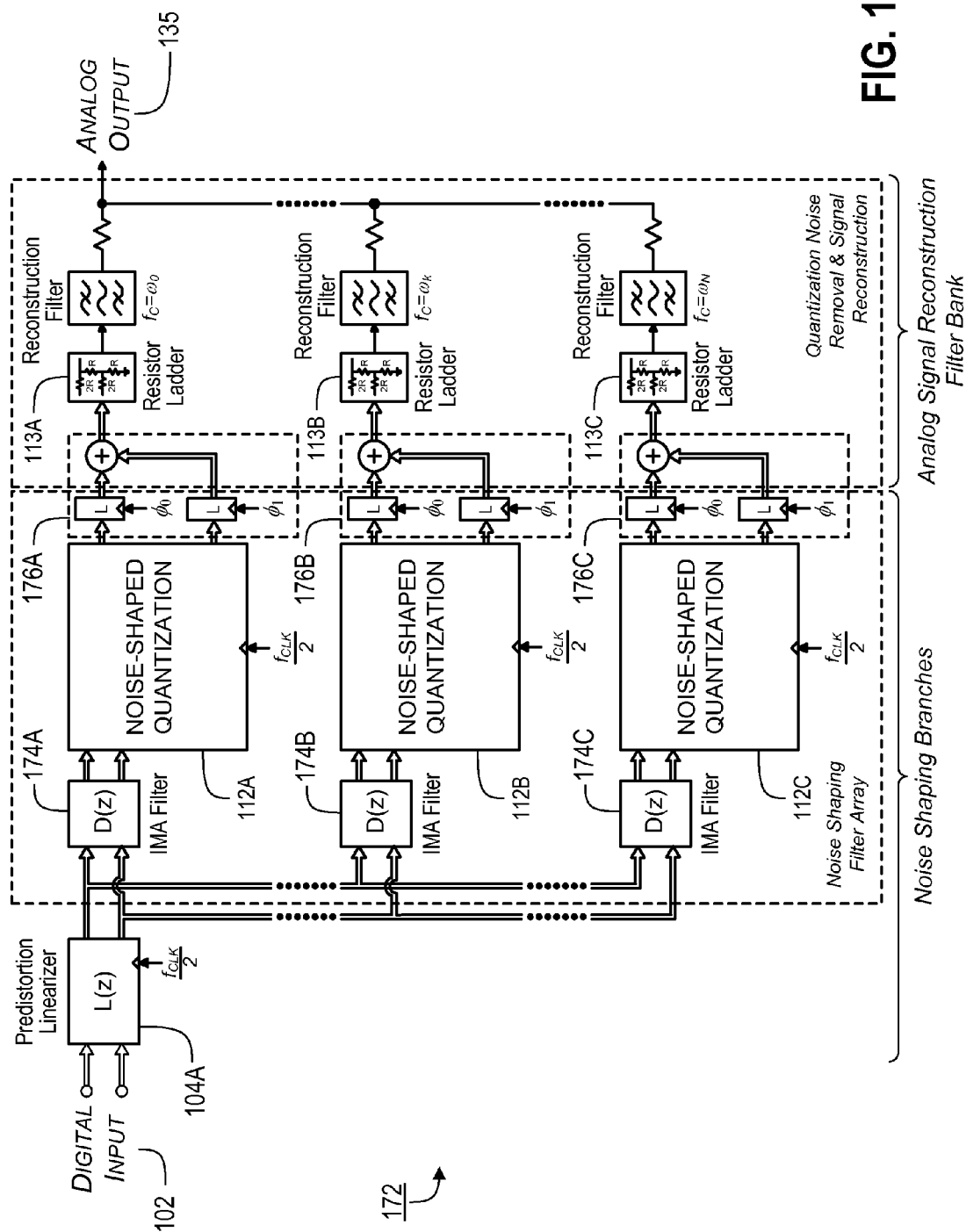
FIG. 16B is a block diagram of a complete MBO converter that incorporates multiple, multirate delta-sigma ($\mu\Delta\Sigma$) modulator noise-shaping circuits, in conjunction with resistor ladder networks and an analog signal reconstruction (ASR) filter bank, and uses input inverse moving-average (IMA) filtering and output summing to combine the two multirate outputs of each $\mu\Delta\Sigma$ modulator, according to a first alternate embodiment of the present invention.
Figure 16C:
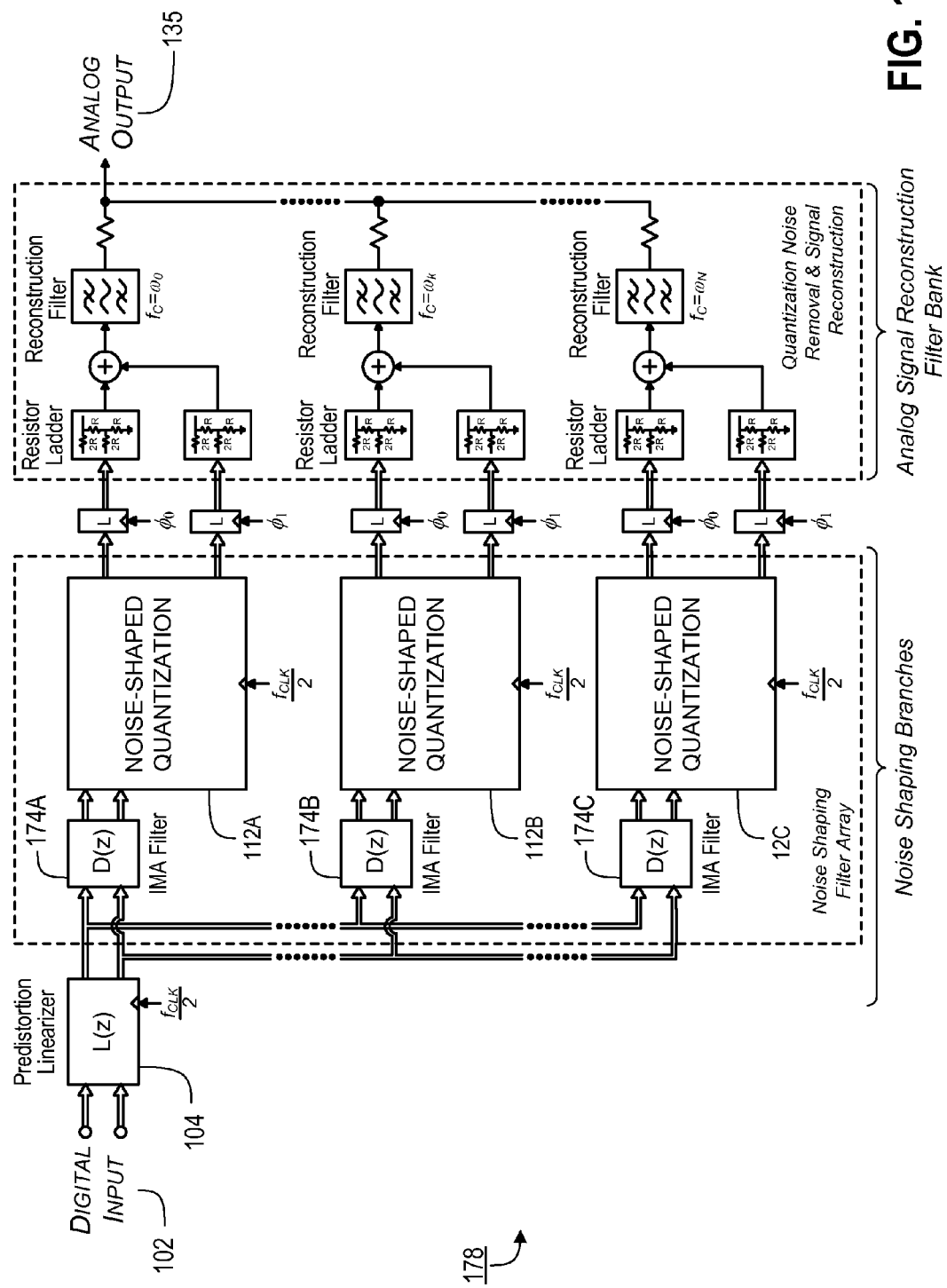
FIG. 16C is a block diagram of a complete MBO converter that incorporates multiple, multirate delta-sigma ($\mu\Delta\Sigma$) modulator noise-shaping circuits, in conjunction with resistor ladder networks and an analog signal reconstruction (ASR) filter bank, and uses input IMA filtering with additional resistor ladder networks to combine the two multirate outputs of each $\mu\Delta\Sigma$ modulator, according to a second alternate embodiment of the present invention.

Exemplary block diagrams of MBO converters according to the preferred embodiments of the invention, employing noise-shaping/quantization circuits 112 that include μΔΣ modulation with polyphase decomposition factor m=2, are shown in FIGS. 16A-C. In each of FIGS. 16A-C, a different structure is provided for combining the two multirate outputs of each noise-shaping/quantization circuit 112A-C. Also, in each of FIGS. 16A-C, a resistive network is used as an analog adder to combine the outputs of the representative MBO processing branches. However, other types of analog combiners, such as those based on reactive (e.g., Wilkinson, Lange, branchline, etc.) and/or active circuits, should be considered within the scope of the invention. In FIG. 16A, each noise-shaping/quantization circuit 112A-C has two multirate outputs, due to its polyphase decomposition factor m=2. The two multirate outputs of each noise-shaping/quantization circuit 112A-C are combined using a corresponding multiplexer 172A-C that selects between the multirate outputs of noise-shaping/quantization circuit 112A-C in an alternating and sequential order, thus providing a single data stream to the corresponding resistor ladder network 113A-C. Multiplexer 172A, for example, couples the first multirate path output of the noise-shaping/quantization circuit 112A to the resistor ladder network 113A on the first cycle, couples the second multirate path output of the noise-shaping/quantization circuit 112A to the resistor ladder network 113A on the second cycle, then couples the first multirate path output of the noise-shaping/quantization circuit 112A to the resistor ladder network 113A on the third cycle, and so on. Use of multiplexing for combining the multirate outputs of each noise-shaping/quantization circuit 112A-C is preferred because of disadvantages associated with alternate methods that are described in detail below.

FIG. 16B illustrates an alternative structure for combining the two multirate outputs of each noise-shaping/quantization circuit 112A-C. In FIG. 16B, the multirate outputs of each noise-shaping/quantization circuit 112A-C are combined using a corresponding inverse moving-average (IMA) filter 174A-C (between DPL 104A and the input to each noise-shaping/quantization circuit 112A-C) followed by a summing circuit 176A-C (between the output of each noise-shaping/quantization circuit 112A-C and the input to resistor ladder 113A-C). As shown, each summing circuit 176A-C includes a clocked latch for each multirate output and an adder to combine the latched outputs. The latches in each summing circuit 176A-C are clocked in a manner that causes latched outputs to update sequentially and at regular intervals. Preferably, the outputs of each latch in the summing circuit update at a $1/m \cdot f_{CLK}$ rate and the outputs of the latches are offset in time by $1/m \cdot (1/f_{CLK})$ with respect to each other, where m is the polyphase decomposition factor of the μΔΣ modulator (i.e., m=2 in FIG. 16B). For the exemplary embodiment illustrated in FIG. 16B with polyphase decomposition factor m=2, the outputs of the latches in each summing circuit 176A-C are updated on opposite phases of the $\frac{1}{2} \cdot f_{CLK}$ clock. Accordingly, the output of the adder in each summing circuit 176A-C updates at an $f_{CLK}$ rate. Therefore, to reduce the switching speed of the digital output logic, the adder preferably is implemented as an analog (i.e., continuous-time) adder, using for example, resistive or reactive combiner networks (e.g., Wye splitters, Wilkinson combiners).

A structure that is similar to that of FIG. 16B is shown in FIG. 16C, in which an IMA filter 174A-C is used in each branch, but each of the multirate outputs for each noise-shaping/quantization circuit 112A-C is separately converted into a single variable-level signal using a resistor ladder network, and then all of such multirate outputs for a given noise-shaping/quantization circuit 112A-C are combined or summed using an analog adder. The following discussion generally refers to the circuit shown in FIG. 16B, but the same considerations apply to the circuit shown in FIG. 16C.

The purpose of the input IMA filters 174A-C is to compensate for the sin(x)/x response introduced by the analog summing components 176A-C (or the corresponding summing structure shown in FIG. 16C). Although shown as distinct entities in FIG. 16B for the purpose of illustration, these analog summing components can be implemented using resistive elements and integrated with the resistor ladder network. Compared to an output multiplexing approach, this output summing approach has the advantage that the switching rate of the digital output buffers (latches) is reduced. However, the output summing approach uses an additional filter (i.e., IMA filters 174A-C with transfer function D(z)) and a digital interface involving multiple clock phases (e.g., $\phi_0$ and $\phi_1$) that can significantly increase circuit complexity for a large interleave factor M and large polyphase decomposition factor m. Furthermore, as described in more detail below, finite word length effects prevent the IMA filtering 174A-C (i.e., D(z)) from fully offsetting the sin(x)/x response of the summing components for polyphase decomposition factors of m>2. For these reasons, the output summing approach preferably is used only for applications where two multirate outputs are combined (e.g., a polyphase decomposition factor of m=2), or for applications that can tolerate sin(x)/x nulls in the converter output spectrum.

Using summing to combine the multirate outputs of the noise-shaping/quantization circuit 112A-C, as illustrated in FIG. 16B, is equivalent to applying a moving-average filter (i.e., with sin(x)/x response) to the MBO converter output samples. This moving-average filter has a transfer function of the form $$TF(z) = \frac{1 - z^{-m}}{1 - z^{-1}},$$

where m is the polyphase decomposition factor, equal to the number of multirate outputs from the noise-shaping/quantization circuit 112A-C (i.e., m=2 in FIG. 16B). The frequency response of the moving-average filter has spectral nulls at submultiples of the MBO converter output data rate, depending on m. Therefore, in order to cancel the moving-average response of the summing component 176A-C, the corresponding IMA filter 174A-C (shown before each noise-shaping/quantization circuit 112A-C in FIG. 16B), should have the inverse transfer function, given by $$D(z) = \frac{1 - z^{-1}}{1 - z^{-m}}.$$

Figure 16D:
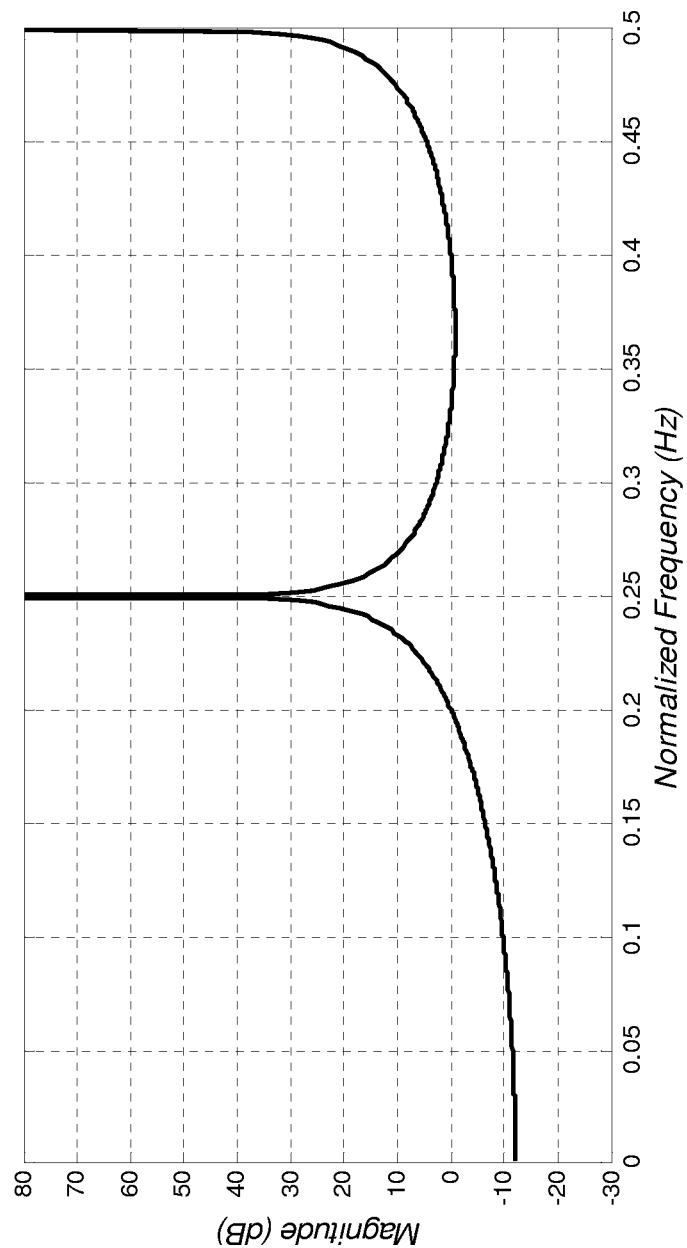
FIG. 16D illustrates an IMA filter transfer function based on a moving-average factor of four.

For a polyphase decomposition factor of m=4, an IMA filter has the frequency response illustrated in FIG. 16D which has infinite magnitude at ¼·$f_S$, where $f_S$ is the converter output data rate. As a result, an IMA filter 174A-C with finite gain (i.e., finite word length for a digital filter), cannot perfectly compensate for the nulls produced by the summing (i.e., moving-average) component 176A-C at the μΔΣ modulator output. In general, the moving-average response produces such spectral nulls at frequencies equal to 1/m·$f_S$. This means that for a polyphase decomposition factor of m=2, the spectral null in the moving-average response occurs at the Nyquist frequency, which can be eliminated from the MBO converter output with little or no consequence in terms of overall converter bandwidth. Therefore, combining the multirate outputs of the noise-shaping/quantization circuit 112A-C using summing components is preferable only for combining up to two multirate outputs (i.e., m=2).

Figure 17:
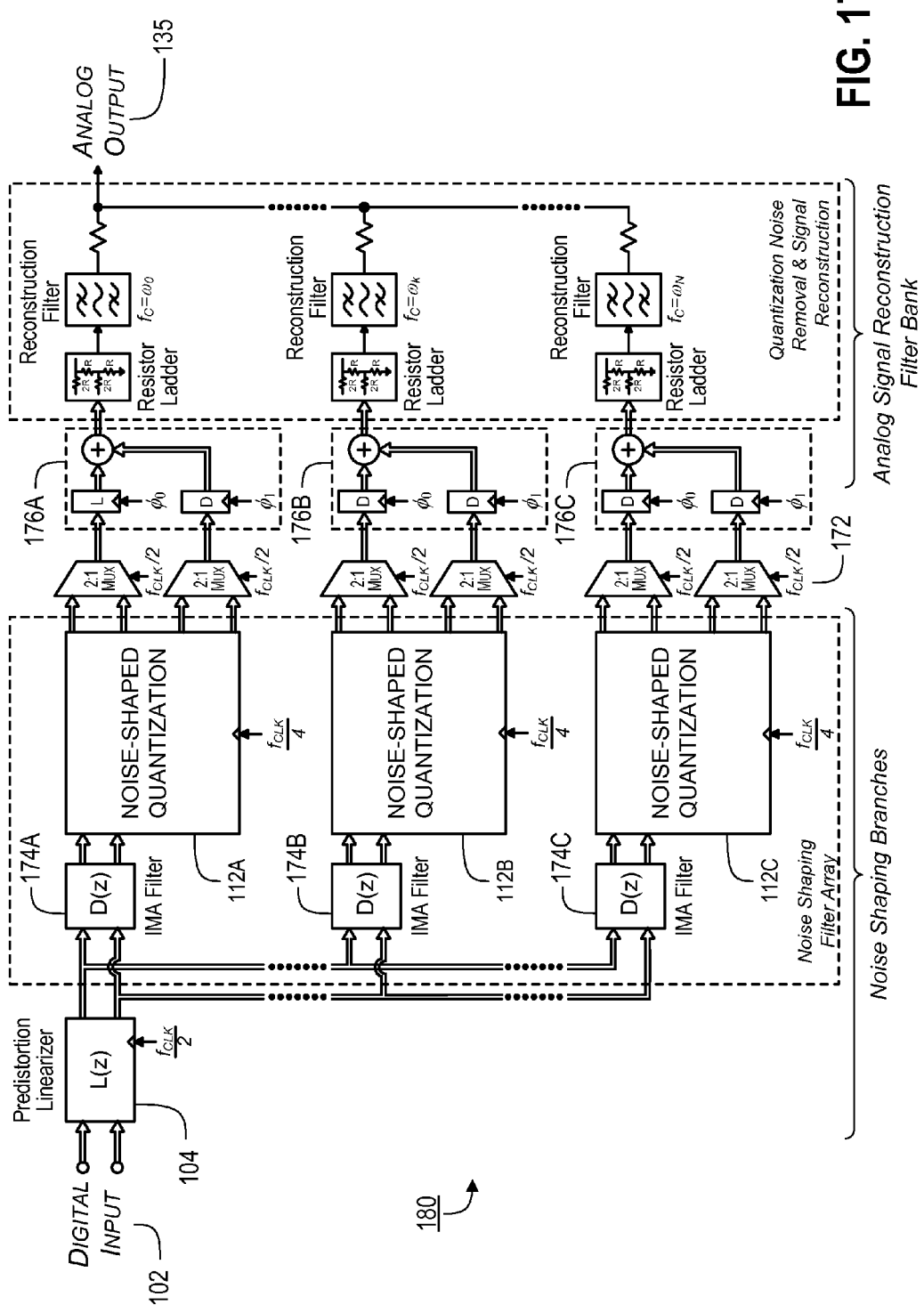
FIG. 17 is a block diagram of a complete MBO converter that incorporates multiple, multirate delta-sigma ($\mu\Delta\Sigma$) modulator noise-shaping circuits, in conjunction with resistor ladder networks and an analog signal reconstruction (ASR) filter bank, and uses a combination of input IMA filtering, output multiplexing, and output summing to combine the four multirate outputs of each $\mu\Delta\Sigma$ modulator, according to an alternate embodiment of the present invention.

As illustrated in FIG. 17, multiplexing and summing can be used together in a hybrid configuration for combining the multirate outputs of the noise-shaping/quantization circuit 112A-C. This hybrid approach, shown in FIG. 17 for an exemplary polyphase decomposition factor of m=4, uses multiplexing 172 to combine all but the last two multirate outputs, and then combines the last two multirate outputs using IMA filter 174A-C with summing 176A-C (i.e., in this example using analog adders rather than additional resistor ladder networks). Therefore, IMA filters 174A-C and summing components 176A-C operate on the basis of a polyphase decomposition factor of m=2, even though the overall polyphase decomposition factor for each noise-shaping/quantization circuit 112A-C is m=4. This hybrid approach results in a times-two increase in the MBO converter output data rate, without loss of performance due to mismatches between response of IMA filters 174A-C and the moving-average response of summing components 176A-C. It should be noted that any of the methods described above for combining the multirate outputs of the noise-shaping/quantization circuit 112A-C can be generalized to a larger number of multirate outputs (i.e., a larger polyphase decomposition factor m) by using higher-order multiplexers or higher-order IMA filters and summers.

Several of the embodiments described above incorporate both IMA filters 174A-C and a digital pre-distortion linearizer (DPL) 104. However, in alternate embodiments these different filtering functions are incorporated into a single structure.

The instantaneous bandwidth of the MBO converter technology (e.g., as shown in FIG. 6C) is limited only by the switching rate of the digital output buffers (or latches) that are coupled to the resistor ladder network 113, or other circuitry used to convert binary-weighted digital signals to proportional analog voltage levels. Digital output buffers currently have been demonstrated commercially at switching speeds in excess of 10 GHz in CMOS integrated circuit process technology. When using the preceding hybrid approach for combining multirate outputs, for example, this capability translates into an overall converter sample rate $f_S$ of up to 20 GHz and a corresponding instantaneous bandwidth in excess of 10 GHz.

As noted previously, however, the resolution performance of MBO converters 200A-C (referred to as converter 200 herein) is not limited by the sample rate $f_S$, but is also a function of the interleave factor (i.e., the number of parallel processing branches M), the μΔΣ modulator noise-shaping order P, and the bandpass (reconstruction) filter 115 properties. In addition, like conventional oversampling converters, the MBO converter technology can be implemented so as to be relatively insensitive to impairments such as clock jitter and thermal noise that degrade the performance of other high-speed converter architectures. Specifically, impairments such as quantizer thermal noise can be made subject to a noise-shaped response in a similar manner to quantization noise, exhibiting a frequency response that enables significant attenuation by the analog bandpass (reconstruction) filters (e.g., filters 115 and 125). Simulated resolution performance results for the MBO converter 200 are given in Table 1 for a $6^{th}$-order noise-shaped response, various interleave factors M, and various analog reconstruction filter 115 orders.

TABLE 1

Simulated Two-Tone Performance Results for OBO Converter

| Interleave Factor | Analog Filter Order | SNDR (Effective Bits) |
| --- | --- | --- |
| 9 | 5 | 64 dB (10.9 bits) |
| 6 | 5 | 60 dB (10.2 bits) |
| 3 | 5 | 46 dB (7.8 bits) |
| 6 | 7 | 68 dB (11.5 bits) |
| 3 | 7 | 49 dB (8.4 bits) |

System Environment

Generally speaking, except where clearly indicated otherwise, all of the systems, methods, functionality and techniques described herein can be practiced with the use of one or more programmable general-purpose computing devices. Such devices typically will include, for example, at least some of the following components interconnected with each other, e.g., via a common bus: one or more central processing units (CPUs); read-only memory (ROM); random access memory (RAM); input/output software and circuitry for interfacing with other devices (e.g., using a hardwired connection, such as a serial port, a parallel port, a USB connection or a firewire connection, or using a wireless protocol, such as Bluetooth or a 802.11 protocol); software and circuitry for connecting to one or more networks, e.g., using a hardwired connection such as an Ethernet card or a wireless protocol, such as code division multiple access (CDMA), global system for mobile communications (GSM), Bluetooth, a 802.11 protocol, or any other cellular-based or non-cellular-based system, which networks, in turn, in many embodiments of the invention, connect to the Internet or to any other networks; a display (such as a cathode ray tube display, a liquid crystal display, an organic light-emitting display, a polymeric light-emitting display or any other thin-film display); other output devices (such as one or more speakers, a headphone set and a printer); one or more input devices (such as a mouse, touchpad, tablet, touch-sensitive display or other pointing device, a keyboard, a keypad, a microphone and a scanner); a mass storage unit (such as a hard disk drive); a real-time clock; a removable storage read/write device (such as for reading from and writing to RAM, a magnetic disk, a magnetic tape, an opto-magnetic disk, an optical disk, or the like); and a modem (e.g., for sending faxes or for connecting to the Internet or to any other computer network via a dial-up connection). In operation, the process steps to implement the above methods and functionality, to the extent performed by such a general-purpose computer, typically initially are stored in mass storage (e.g., the hard disk), are downloaded into RAM and then are executed by the CPU out of RAM. However, in some cases the process steps initially are stored in RAM or ROM.

Suitable general-purpose programmable devices for use in implementing the present invention may be obtained from various vendors. In the various embodiments, different types of devices are used depending upon the size and complexity of the tasks. Such devices can include, e.g., mainframe computers, multiprocessor computers, workstations, personal computers and/or even smaller computers, such as PDAs, wireless telephones or any other programmable appliance or device, whether stand-alone, hardwired into a network or wirelessly connected to a network.

In addition, although general-purpose programmable devices have been described above, in many of the preferred embodiments, as indicated above, one or more special-purpose processors or computers instead (or in addition) are used. In general, it should be noted that, except as expressly noted otherwise, any of the functionality described above can be implemented by a general-purpose processor executing software and/or firmware, by dedicated (e.g., logic-based) hardware, or any combination of these, with the particular implementation being selected based on known engineering tradeoffs. More specifically, where any process and/or functionality described above is implemented in a fixed, predetermined and/or logical manner, it can be accomplished by a general-purpose processor executing programming (e.g., software or firmware), an appropriate arrangement of logic components (hardware), or any combination of the two, as will be readily appreciated by those skilled in the art. In other words, it is well-understood how to convert logical and/or arithmetic operations into instructions for performing such operations within a processor and/or into logic gate configurations for performing such operations; in fact, compilers typically are available for both kinds of conversions.

It should be understood that the present invention also relates to machine-readable tangible media on which are stored software or firmware program instructions (i.e., computer-executable process instructions) for performing the methods and functionality of this invention. Such media include, by way of example, magnetic disks, magnetic tape, optically readable media such as CD ROMs and DVD ROMs, or semiconductor memory such as PCMCIA cards, various types of memory cards, USB memory devices, etc. In each case, the medium may take the form of a portable item such as a miniature disk drive or a small disk, diskette, cassette, cartridge, card, stick etc., or it may take the form of a relatively larger or immobile item such as a hard disk drive, ROM or RAM provided in a computer or other device. As used herein, unless clearly noted otherwise, references to computer-executable process steps stored on a computer-readable or machine-readable medium are intended to encompass situations in which such process steps are stored on a single medium, as well as situations in which such process steps are stored across multiple media.

The foregoing description primarily emphasizes electronic computers and devices. However, it should be understood that any other computing or other type of device instead may be used, such as a device utilizing any combination of electronic, optical, biological and chemical processing that is capable of performing basic logical and/or arithmetic operations.

In addition, where the present disclosure refers to a processor, computer, server device, computer-readable medium or other storage device, client device, or any other kind of device, such references should be understood as encompassing the use of plural such processors, computers, server devices, computer-readable media or other storage devices, client devices, or any other devices, except to the extent clearly indicated otherwise. For instance, a server generally can be implemented using a single device or a cluster of server devices (either local or geographically dispersed), e.g., with appropriate load balancing.

Additional Considerations

In the preceding discussion, the terms "operators", "operations", "functions" and similar terms can refer to method steps or hardware components, depending upon the particular implementation/embodiment.

Several different embodiments of the present invention are described above, with each such embodiment described as including certain features. However, it is intended that the features described in connection with the discussion of any single embodiment are not limited to that embodiment but may be included and/or arranged in various combinations in any of the other embodiments as well, as will be understood by those skilled in the art.

Similarly, in the discussion above, functionality sometimes is ascribed to a particular module or component. However, functionality generally may be redistributed as desired among any different modules or components, in some cases completely obviating the need for a particular component or module and/or requiring the addition of new components or modules. The precise distribution of functionality preferably is made according to known engineering tradeoffs, with reference to the specific embodiment of the invention, as will be understood by those skilled in the art.

Thus, although the present invention has been described in detail with regard to the exemplary embodiments thereof and accompanying drawings, it should be apparent to those skilled in the art that various adaptations and modifications of the present invention may be accomplished without departing from the spirit and the scope of the invention. Accordingly, the invention is not limited to the precise embodiments shown in the drawings and described above. Rather, it is intended that all such variations not departing from the spirit of the invention be considered as within the scope thereof as limited solely by the claims appended hereto.

What is claimed is:

1. An apparatus for converting a discrete-time quantized signal into a continuous-time, continuously variable signal, comprising:
   an input line for accepting an input signal that is discrete in time and in value;
   a digital pre-distortion linearizing filter having an input coupled to the input line and Igin an output;

a plurality of processing branches coupled to the output of the digital pre-distortion linearizing filter, each of said processing branches including: (a) a quantization circuit, (b) a multi-bit-to-variable-level signal converter coupled to an output of the quantization circuit, and (c) an analog bandpass filter coupled to an output of the multi-bit-to-continuously-variable signal converter; and an adder coupled to an output of the analog bandpass filter in each of the processing branches, wherein the analog bandpass filters in different ones of said processing branches select different frequency bands, and wherein the digital pre-distortion linearizing filter has a transfer function that produces an at least approximately all-pass response when convolved with a composite transfer function that represents the combined transfer functions of the analog bandpass filters in the processing branches.

2. An apparatus according to claim 1, where the digital pre-distortion linearizing filter is implemented as an adaptive structure that is dynamically tuned to compensate for variations in responses of the analog bandpass filters.

3. An apparatus according to claim 1, where the digital pre-distortion linearizing filter is dynamically tuned to account for changes in ambient temperature.

4. An apparatus according to claim 1, where the digital pre-distortion linearizing filter is implemented as a polyphase structure and includes, for each subsampling phase, a substructure that operates at a clock rate that is a submultiple of a clock rate for the digital pre-distortion linearizing filter as a whole.

5. An apparatus according to claim 1, where the digital pre-distortion linearizing filter includes both feedforward and feedback components.

6. An apparatus according to claim 1, wherein the digital pre-distortion linearizing filter has an impulse response of length equal to 2 times the total number of processing branches.

7. An apparatus according to claim 1, wherein the digital pre-distortion linearizing filter has an impulse response of length equal to 4 times the total number of processing branches.

8. An apparatus according to claim 1, where the analog bandpass filters include at least one of a Butterworth, Chebychev, Bessel, elliptic, or coupled-resonator filter structure.

9. An apparatus according to claim 1, wherein at least one of the analog bandpass filters within the plurality of processing branches is different from another of the analog bandpass filters with respect in at least one of center frequency, bandwidth, order, or frequency response.

10. An apparatus according to claim 1, wherein at least one analog bandpass filter within the plurality of processing branches has a frequency response that is not greater than 10th order.

11. An apparatus according to claim 1, wherein each of a plurality of the processing branches includes at least one quadrature upconverter that increases, by a factor of at least two, a center frequency of the frequency band selected for said processing branch.

12. An apparatus according to claim 1, wherein each of a plurality of the processing branches includes at least one quadrature downconverter that decreases, by a factor of at least two, a center frequency of the frequency band selected for said processing branch.

13. An apparatus according to claim 12, wherein each of a plurality of the processing branches includes a downconverter and an upconverter, and wherein the downconverter includes at least one parameter that is adjusted to reduce output spurious responses by compensating for at least one of amplitude or phase imbalance of the upconverter.

14. An apparatus according to claim 13, wherein the at least one parameter is dynamically adjusted, based on a signal-strength metric, so as to minimize a power level of spurious responses at an output of the respective processing branch.

15. An apparatus according to claim 1, wherein the analog bandpass filter in each of the processing branches has a frequency response order that is not greater than 10.

16. An apparatus according to claim 1, wherein the different frequency bands selected by the analog bandpass filters collectively encompass the entire frequency range of the input signal.

* * * * *

UNITED STATES PATENT AND TRADEMARK OFFICE
CERTIFICATE OF CORRECTION

PATENT NO. : 8,896,471 B1
APPLICATION NO. : 13/647301
DATED : November 25, 2014
INVENTOR(S) : Christopher Pagnanelli It is certified that error appears in the above-identified patent and that said Letters Patent is hereby corrected as shown below:

In the Specification

In column 4 line 38, change "$H(z) = \dfrac{z-1}{1+z^{-2}}$" to --$H(z) = \dfrac{z^{-1}}{1+z^{-2}}$--.

In column 16 line 54, change "sample rate" to --sample rate (i.e.,--.

In column 22 lines 55-58, change "$\begin{aligned}NTF(z) &= 1 + H(z)\\ &\approx 1 + \rho \cdot z^{-1} + z^{-2}\end{aligned}$" to --$H(z) = \rho \cdot z^{-1} + z^{-2}$--.

In column 24 line 11, change "$-\rho \cdot Q(x_0 + \rho \cdot Q(y_{-1}) - \rho \cdot y_{-1} + Q(y_{-2}) - y_{-2}) + Q(y_{-1}) - y_{-1}]$" to --$-\rho \cdot (x_0 + \rho \cdot Q(y_{-1}) - \rho \cdot y_{-1} + Q(y_{-2}) - y_{-2}) + Q(y_{-1}) - y_{-1}]$--.

In column 27 lines 30-36, change "$F(j\omega) \cdot L(z) \approx F(j\omega) \cdot \dfrac{\sum_{i=0}^{K1}\beta_i \cdot z^{-i}}{1+\sum_{i=1}^{K2}\alpha_i \cdot z^{-i}} = z^{-n}\Big|_{z=e^{j\omega}}$"

to --$F(j\omega) \cdot L(z) = F(j\omega) \cdot \dfrac{\sum_{i=0}^{K1}\beta_i \cdot z^{-i}}{1+\sum_{i=1}^{K2}\alpha_i \cdot z^{-i}} = z^{-n}\Big|_{z=e^{j\omega}}$--.

Signed and Sealed this
Second Day of June, 2015

Michelle K. Lee
*Director of the United States Patent and Trademark Office*

In the Claims

Column 40, line 67 (Claim 1, line 7), change "input line and Igin an output" to --input line and having an output--.